United States Patent [19]
Matsuyama

[11] Patent Number: 5,913,986
[45] Date of Patent: Jun. 22, 1999

[54] PHOTOVOLTAIC ELEMENT HAVING A SPECIFIC DOPED LAYER

[75] Inventor: Jinsho Matsuyama, Soura-gun, Japan

[73] Assignee: Canon Kabushiki Kaisha, Tokyo, Japan

[21] Appl. No.: 08/933,353

[22] Filed: Sep. 19, 1997

[30] Foreign Application Priority Data

Sep. 19, 1996 [JP] Japan ..................................... 8-247830
Dec. 12, 1996 [JP] Japan ..................................... 8-351840

[51] Int. Cl.$^6$ ................................................. H01L 31/028
[52] U.S. Cl. .......................... 136/255; 136/258; 136/261
[58] Field of Search .................................. 136/258, 261, 136/255; 430/57; 257/53

[56] References Cited

U.S. PATENT DOCUMENTS

| | | | |
|---|---|---|---|
| 2,949,498 | 8/1960 | Jackson | 136/89 |
| 4,254,429 | 3/1981 | Yamazaki | 357/16 |
| 4,377,723 | 3/1983 | Dalal | 136/249 |
| 4,460,670 | 7/1984 | Ogawa et al. | 136/258 |
| 4,816,082 | 3/1989 | Guha et al. | 136/249 |
| 5,720,827 | 2/1998 | Simmons | 136/255 |

OTHER PUBLICATIONS

Yang, et al. "Double–junction amorphous silicon based solar cells with 11% stable efficiency", Appl. Phys. Lett. 61, 24, Dec. 1992, pp. 2917–2919.

Meier, et al. "Intrinsic Microcrystalline silicon ($\mu$c–Si:H)—A Promising New Thin Film Solar Cell Material", Conf. Record, 24th IEEE Photovolt. Spec. Conf.; vol. I, pp. 409–412, Dec. 1994.

Pamphlet of the 53rd Applied Physics Society Conf. (1992), p. 746, 17p–B–5.

Primary Examiner—Christopher D. Rodee
Attorney, Agent, or Firm—Fitzpatrick, Cella, Harper and Scinto

[57] ABSTRACT

A photovoltaic element having a semiconductor junction structure, characterized in that said semiconductor junction structure has a doped layer of p-type or n-type composed of a non-single crystalline material containing one or more elements belonging to group IV of the periodic table as a principal constituent thereof, and said doped layer contains a plurality of regions each comprising a diminished density region of said group IV element as the principal constituent of the doped layer such that said group IV element diminished density regions are intermittently distributed in the doped layer. Said semiconductor junction structure has a substantially intrinsic semiconductor layer at least of which being composed of a microcrystalline semiconductor material.

15 Claims, 9 Drawing Sheets

F I G. 4
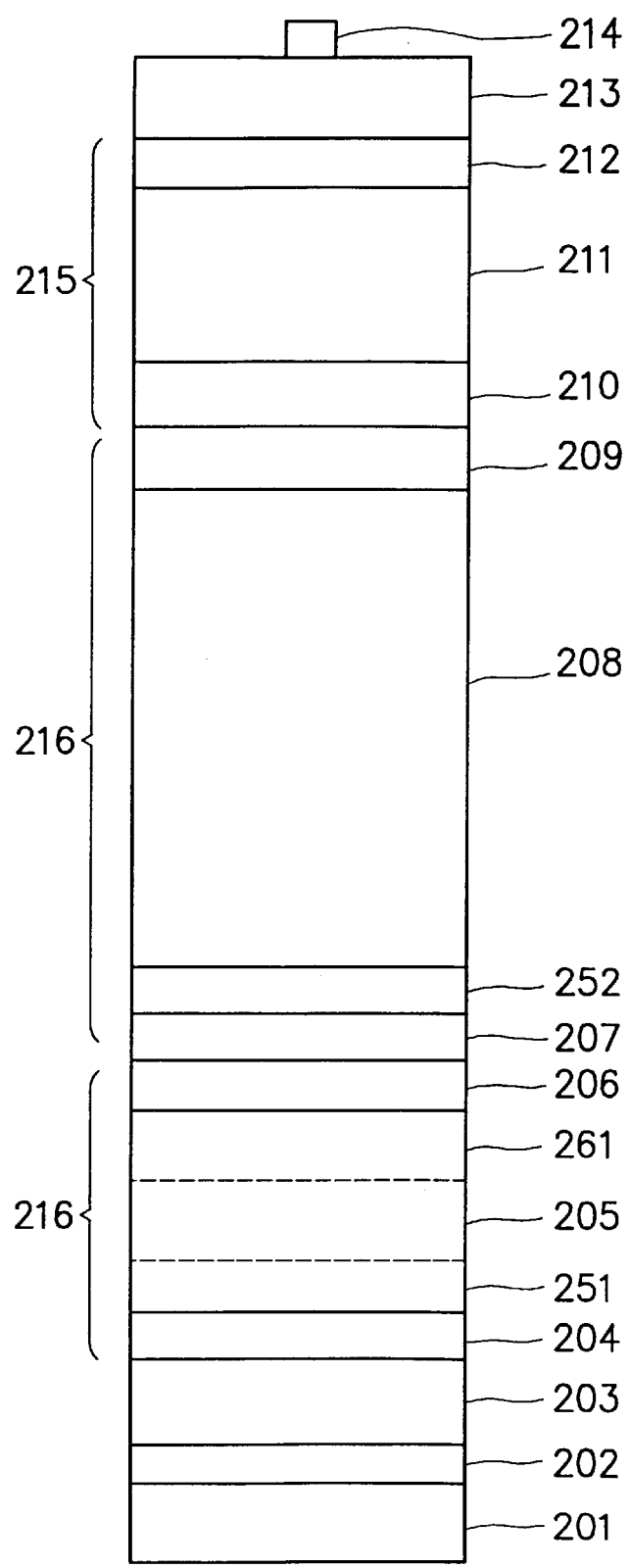

(a) :Ex.1-1
(b) :Ex.1-2
(c) :Ex.1-3          (f) :Comp.Ex.1-1
(d) :Ex.1-4          (g) :Comp.Ex.1-2
(e) :Ex.1-5          (h) :Comp.Ex.1-3

(a): Ex.7-1
(b): Ex.7-2
(c): Ex.7-3
(d): Ex.7-4
(e): Ex.7-5
(f): Comp.Ex.6-1
(g): Comp.Ex.6-2
(h): Comp.Ex.6-3

PHOTOVOLTAIC ELEMENT HAVING A SPECIFIC DOPED LAYER

BACKGROUND OF THE INVENTION

1. Field of the Invention

The present invention relates to a photovoltaic element having a specific doped layer. More particularly, the present invention relates to a photovoltaic element having a semiconductor junction comprising a specific doped layer containing a plurality of regions having a diminished density of an element belonging to group IV of the periodic table (this element will be hereinafter referred to as group IV element) as a principal constituent of said doped layer such that they are intermittently distributed in the inplane of said doped layer and which exhibits improved photovoltaic element characteristics.

The foregoing region having a diminished density of the group IV element will be hereinafter referred to as "group IV element low density region".

2. Related Background Art

There are presently a variety of photovoltaic elements (solar cells) which have been put into practical use as photoelectric conversion devices for converting light such as sunlight into an electric energy. Particularly, photovoltaic elements frequently have been used for power supply sources in commercial and home appliances. Besides, they sometimes have been used as power supply sources in vehicles and also in houses.

Incidentally, photovoltaic elements are expected to be a future power generation source which can substitute for oil-fired power generation and nuclear power generation, because they provides clean energy without causing $CO_2$ buildup as in the case of the oil-fired power generation and without causing radioactive wastes and radioactive materials as in the case of the nuclear power generation. In view of this, various studies have been conducted of photovoltaic elements.

These photovoltaic elements (solar cells) include single crystal photovoltaic elements, polycrystal photovoltaic elements, amorphous photovoltaic elements, copper indium selenide photovoltaic elements, and compound semiconductor photovoltaic elements.

Photovoltaic elements (solar cells) are based on the technology of utilizing photoelectromotive force generated in a semiconductor active region having a pn junction. In the semiconductor active region, light such as sunlight is absorbed, the absorbed light generates photocarriers including electrons and holes, and the photocarriers are drifted by the action of an internal electric field of the pn junction, whereby photoelectromotive force is outputted to the outside as an electric power.

Of the presently known photovoltaic elements, a photovoltaic element made of a single crystalline silicon material has been found to be highly reliable and high in photoelectric conversion efficiency (this photovoltaic element will be hereinafter called "single crystal silicon photovoltaic element"). However, there are disadvantages for the single crystal silicon photovoltaic element as will be described in the following. That is, it is unavoidably costly since it is produced by way of the so-called semiconductor wafer process wherein a single crystalline silicon material whose valence electron having been controlled to p- or n-type is prepared by way of crystal growth by means of CZ process, the resultant single crystalline material is sliced to obtain a silicon wafer of about 300 $\mu$m in thickness, and the resultant silicon wafer is made have a layer with a conduction type which is opposite to that of the silicon wafer, for instance, by a manner of diffusing a given valence electron-controlling agent, whereby a semiconductor active region having a pn junction is formed. In addition, the single crystalline silicon material by which the single crystal silicon photovoltaic element is constituted is relatively small in light absorbance because of indirect transition and therefore, it is necessary for the single crystal silicon photovoltaic element to have a thick semiconductor active region with a thickness of at least 50 $\mu$m in order to facilitate its function to absorb light such as sunlight. Further, the single crystalline silicon material by which the single crystal silicon photovoltaic element is of about 1.1 eV in band gap and because of this, short wavelength energy components of the sunlight spectrum are not efficiently utilized for photoelectric conversion in the single crystal silicon photovoltaic element. Further in addition, it is extremely difficult for the single crystal silicon photovoltaic element to be of a large area because there is a limit for the size of silicon wafers that can be produced because of the requirement for growing a single crystal. Therefore, in order to obtain a large quantity of electric power, it is necessary that a number of single crystal silicon photovoltaic elements are integrated in series or parallel connection by way of wiring. Besides, in the case where the single crystal silicon photovoltaic element is used in outdoors, it is necessary to have expensive mounting in order to protect the single crystal silicon photovoltaic element from suffering from damages caused by various meteorological conditions. In this connection, the cost of the generated energy per unit is rather expensive in comparison with that of existing power generation system.

There are known photovoltaic elements made of a polycrystalline silicon material (this photovoltaic element will be hereinafter called "polycrystal silicon photovoltaic element"). The polycrystal silicon photovoltaic element is advantageous in that it can be produced at a cost which is lower than that of the single crystal silicon photovoltaic element. However, for the polycrystal silicon photovoltaic element, there are disadvantages similar to those in the case of the single crystal silicon photovoltaic element. Particularly, the polycrystalline silicon material by which the polycrystal silicon photovoltaic element is constituted is relatively low in light absorbance because of indirect transition and therefore, it is necessary for the polycrystal silicon photovoltaic element to have a thick semiconductor active region as well as in the case of the single crystal silicon photovoltaic element. In addition, the semiconductor active region of the polycrystal silicon photovoltaic element contains grain boundaries and because of this, the polycrystal silicon photovoltaic element is not satisfactory in terms of photovoltaic element characteristics.

In view of the above, photovoltaic elements made of a non-single crystalline material, for instance, such as an amorphous material (this photovoltaic element will be hereinafter referred to as non-single crystal photovoltaic element) have been spotlighted because of advantages such that they can be relatively easily formed in a large area at a reasonable cost. Some of these non-single crystal photovoltaic elements have been put into practical use as power supply sources installed in outdoors. And various studies have been made in order to achieve a non-single crystal photovoltaic having an improved power-generating performance.

As such non-single crystal photovoltaic element, there can be mentioned, for example, amorphous photovoltaic elements whose photovoltaic force-generating layer being constituted by an amorphous semiconductor material of a tetrahedral group IV element such as amorphous silicon (a-Si), amorphous silicon-germanium (a-SiGe) or amorphous silicon carbide (a-SiC); and compound semiconductor photovoltaic elements whose photovoltaic force-generating layer being constituted by a compound semiconductor material comprising groups II and VI elements such as CdS or $Cu_2S$ or a compound semiconductor material comprising groups III and V elements such as GaAs or GaAlAs. Of these, so-called thin film amorphous photovoltaic elements whose photovoltaic force-generating layer being constituted by such amorphous semiconductor material as above described have various advantages which are not provided in the case of a single crystal photovoltaic element, such that their constituent semiconductor film can be relatively easily formed in a large area, thinned as desired, and formed on an appropriate substrate.

There is, however, a disadvantage of such an amorphous photovoltaic element in that its photoelectric conversion efficiency is inferior to that of the single crystal photovoltaic element. In this connection, various studies have been made in order to attain a reliable amorphous photovoltaic element having a improved photoelectric conversion efficiency which can be desirably used a daily power supply source.

There are various proposals for improving the photoelectric conversion efficiency of the non-single crystal photovoltaic element. For instance, in order for a non-single crystal photovoltaic element having a pin semiconductor junction to have an improved photoelectric conversion efficiency, there is known a manner of improving the property of each of the constituent p-type semiconductor layer, i-type semiconductor layer, n-type semiconductor layer, transparent electrode layer, and back face electrode layer.

U.S. Pat. No. 2,949,498 proposes a technique of attaining an improved photoelectric conversion efficiency by employing a stacked structure comprising a plurality of photovoltaic cell units having a pn semiconductor junction being stacked. This technique can be applied in not only in the case of an amorphous photovoltaic element but also in the case of a crystalline photovoltaic element. In accordance with this technique, it is possible that the sunlight spectrum is efficiently absorbed by plural photovoltaic cell units each having a different band gap to increase the open-circuit voltage (Voc) whereby attaining an improved power generation efficiency. This technique using the stacked cell structure is to improve the photoelectric conversion efficiency by stacking a plurality of photovoltaic cell units each having a different band gap so that the respective energy components of the sunlight spectrum can be absorbed by said photovoltaic cell units. In this case, the so-called top layer in each photovoltaic cell unit situated on the light incident side is made have a band gap which is larger than that of the so-called bottom layer situated under the top layer.

However, also in the case of this technique using stacked cell structure as well as in the case of using a single cell structure, it is necessary to improve the property of each of the constituent p-type semiconductor layer, i-type semiconductor layer, n-type semiconductor layer, transparent electrode layer, and back face electrode layer, in order to attain a desirable photoelectric conversion efficiency. For instance, the i-type semiconductor layer is necessary to be designed such that it has an appropriate band gap depending upon the photovoltaic force-generating layer structure such as single cell structure or stacked cell structure. In addition, it is necessary to decrease the localized states as much as possible and to heighten the mobility of photocarrier.

Besides the above proposal to improve the property of the i-type semiconductor layer in order to attain an improvement in the photoelectric conversion efficiency of a photovoltaic element, there are other proposals. For instance, U.S. Pat. No. 4,254,429 and U.S. Pat. No. 4,377,723 propose a technique of using a buffer layer of providing a graded band gap at the junction interface of the i-type semiconductor layer with the p-type semiconductor layer or/and the n-type semiconductor layer. It is understood that the buffer layer herein is used for the following purpose. Since at the junction interface of the i-type semiconductor layer constituted by an a-SiGe material with the p-type or n-type semiconductor layer constituted by an a-Si material, interface states are generated due to differences in the lattice constant, such states are prevented from generating by using a given a-Si material as the buffer layer at the junction interface to make photocarrier effectively mobilize whereby attaining an improved open-circuit voltage (Voc).

There is also a proposal of providing a so-called graded layer in the i-type semiconductor layer constituted by an a-SiGe material by changing the composition ratio between the silicon atoms and germanium atoms of a part of the a-SiGe material as the constituent of the i-type semiconductor layer to improve the characteristics of the i-type semiconductor layer. Particularly, for instance, U.S. Pat. No. 4,816,082 discloses a technique in that in the constitution comprising an i-type semiconductor layer interposed between first and second semiconductor layers whose valence electron having been controlled, the i-type semiconductor layer is made have such a graded band gap that it is relatively large at the position in contact with the first semiconductor layer situated on the light incident side, followed by gradually decreasing toward the central position, then followed by gradually increasing toward the second semiconductor layer. According to this technique, carriers generated from light impinged are efficiently separated by virtue of the internal electric field to improve the photoelectric conversion efficiency.

There is a further proposal of improving the hole mobility of the i-type semiconductor layer constituted by an a-Si or a-SiGe material by incorporating a slight amount of a valence electron-controlling agent of p-type into the i-type semiconductor layer because the i-type layer often has a slight n-type property.

By the way, for the so-called doped layer such as p-type semiconductor layer or n-type semiconductor layer, it is required that the density of an activated acceptor or donor is high and the activation energy of a thin film as the doped layer is small. By this, there is provided a large diffusion potential (built-in potential) when a pin semiconductor junction is formed, whereby the open-circuit voltage (Voc) of the photovoltaic element is increased, resulting in an improvement in the photoelectric conversion efficiency.

The doped layer is also required not to hinder light from impinging into the i-type semiconductor layer (which functions to generate photocurrent) to the utmost since the doped layer basically does not function to generate photocurrent. In this respect, it is important for the doped layer to have a large optical band gap and a thin thickness.

For the doped layer, it is further required that it has a property capable of forming a homo or hetero pin semiconductor junction with the i-type semiconductor layer and the interface states in the semiconductor junction are slight.

In the case of a stacked cell structure, the doped layer is required to have such characteristics as will be described below in addition to the above requirements. In the case where a plurality of cells having a pn or pin semiconductor junction are stacked, a reverse semiconductor junction portion where the p-type semiconductor layer and the n-type semiconductor layer are contacted is caused. This portion is required to establish a tunneling junction having an ohmic property and to be small in series resistance.

In order to attain such a doped layer having the foregoing property, there are known materials usable as the constituent of the doped layer and methods for forming the doped layer.

Specific examples of such constituent material usable as the doped layer are Si, SiC, SiN, and SiO. Specific examples of such method for forming the doped layer are RF plasma CVD, ECR plasma CVD, and photo CVD.

Particularly, as the constituent material of the doped layer situated on the back side of the i-type semiconductor layer with respect to the light incident side, amorphous silicon (a-Si) materials are preferable in view of easiness in layer formation. As the constituent material of the doped layer situated on the light incident side of the i-type semiconductor, amorphous silicon carbide (a-SiC) materials which are small in light absorption coefficient, and microcrystalline silicon ($\mu$c-Si) materials which are small in light absorption coefficient and small in activation energy are preferable.

Now, in the case where the doped layer is constituted by, for instance, amorphous silicon carbide (a-SiC) material as a principal constituent which has been made to have a relatively large optical band gap by incorporating an appropriate element into said a-SiC material, by using, as said element, an element selected from the group consisting of H, C, N, O, and halogen elements (X) which are capable of enlarging the optical band gap and increasing the amount of the element to be added, it is possible to decrease the light absorption coefficient of the doped layer whereby increasing the short-circuit current (Jsc) of the photovoltaic element. However, for any of the foregoing elements capable of enlarging the optical band gap, even when the amount thereof added is increased, the activation energy of the doped layer tends to increase where the built-in potential of the photovoltaic element is decreased, resulting in a reduction in the open-circuit voltage (Voc). And there is a tendency that as the difference between the chemical composition of the doped layer and that of the i-type semiconductor layer is increased, the interface states at the interface between the doped layer and the i-type semiconductor layer are increased.

In addition, for the doped layer, as the concentration of a valence electron-controlling agent (a dopant) contained in the doped layer is increased, the activation energy of the doped layer is decreased where the built-in potential of the photovoltaic element is increased, resulting in an increase in the open-circuit voltage (Voc). However, there is a tendency that as the concentration of the dopant contained in the doped layer is increased, the optical band gap of the doped layer is decreased to increase the light absorption coefficient of the doped layer where the short-circuit current (Jsc) of the photovoltaic element is decreased.

With respect to the constituent of the doped layer, it is considered that the doped layer is preferred to be constituted by a microcrystalline material rather than an amorphous material, since in comparison of the former with the latter, the former has a smaller light absorption coefficient, a larger optical band gap and a smaller activation energy. However, in the case where the doped layer is constituted by the microcrystalline material, there are such problems as will be described in the following. It is difficult to form a desirable microcrystalline material in which the density of an activated acceptor or donor is high and which has a small activation energy.

Particularly, there is no report for a photovoltaic element having a relatively large open-circuit voltage (Voc) and a relatively large photoelectric conversion efficiency prepared using other microcrystalline materials than microcrystalline Si ($\mu$c-Si). And there is found no example for practical use of those microcrystalline materials other than $\mu$c-Si in the preparation of a photovoltaic element. Even in the case where a $\mu$c-Si material is used, the $\mu$c-Si material can be formed only under certain limited conditions which are difficult to be controlled.

Further, in the case where a microcrystalline doped layer is formed on an amorphous i-type semiconductor layer, since the conditions for the formation of the microcrystalline doped layer are different from those for the formation of the amorphous i-type semiconductor layer, the amorphous i-type semiconductor layer is liable to damage upon the formation of the microcrystalline doped layer. And in the case where the amorphous i-type semiconductor layer and the microcrystalline doped layer form a hetero semiconductor junction, there is a tendency that the interface states are increased to provide an adverse effect to a pin semiconductor junction when it is formed.

Further in addition, for the thickness of the doped layer in a photovoltaic element, regardless of the kind of a constituent material by which the doped layer is constituted, as the thickness is decreased, the quantity of light transmitted through the doped layer into the i-type semiconductor layer is increased where the short-circuit current (Jsc) of the photovoltaic element is increased. However, there is a tendency that as the thickness of the doped layer is decreased, the activation energy of the doped layer is increased where the built-in potential of the photovoltaic element is lowered, resulting in a reduction in the open-circuit voltage (Voc). In this connection, a optimum thickness of the doped layer which maximizes the photoelectric conversion efficiency of the photovoltaic element is within a limited small extent. When the doped layer has a thickness which is not within said extent, the photoelectric conversion of the photovoltaic element tends to decrease.

As above described, in the prior art, it is difficult to realize a desirable doped layer (a desirable p-type or n-type semiconductor layer) composed of a non-single crystalline material which has a large built-in potential and is slight in the interfacial level for use in a photovoltaic element. Hence, in order to attain a non-single crystal photovoltaic element having a more improved photoelectric conversion efficiency, it is important that in addition to more improving the i-type semiconductor layer, the doped layer is idealized.

Separately, in order to more improve the photoelectric conversion efficiency of the conventional photovoltaic element, various studies have been made. For instance, Miyazi et als. have reported a single cell type amorphous silicon photovoltaic element comprising a stacked reflection preventive film/glass/carbon graded p-type layer/buffer layer/i-type layer/n-type layer/ITO/Ag and which has a initial photoelectric conversion efficiency of 13.19% (see, the pamphlet of the 53th Applied Physics Society Conference in 1992, page 746, 17p-B-5).

J. Yang et al. has reported that using a profiled band gap amorphous silicon-germanium alloy in the bottom cell, a stabilized active-area efficiency of 11.16% has been achieved (see, Applied Physics Letters, 61(24), 1992, pp. 2917–2919).

However, according to any of the techniques described in these two reports, it is difficult to make the light-induced degradation of the initial photoelectric conversion efficiency fall in the range of less than 5%.

J. Meier et al. have reported a photovoltaic element in which a microcrystalline silicon ($\mu$c-Si) material is used as the i-type semiconductor layer and which is slight in the light degradation and which has an initial photoelectric conversion efficiency of 9.1% (see, 1994 IEEE First World Conference on Photovoltaic Energy Conversion, pp. 409–412).

Referring to this report, it is understood that the photovoltaic element in which the $\mu$c-Si material is used can be produced by a plasma CVD process by way of glow discharge as well as in the case of producing a conventional amorphous series photovoltaic element. And it is considered that a large area photovoltaic element having an i-type layer composed of a $\mu$c-Si material could be produced by means of a relatively low-priced fabrication apparatus as well as in the case of producing an amorphous photovoltaic element having a large area. However, the photoelectric conversion efficiency of this microcrystalline photovoltaic element is inferior to that (about 13%) of the amorphous silicon single cell type photovoltaic element. Hence, for the photovoltaic element whose i-type semiconductor layer being composed of the $\mu$c-Si material, there is an important subject to be solved in that at least the photoelectric conversion efficiency is improved.

SUMMARY OF THE INVENTION

The present invention is aimed at eliminating the foregoing problems in the prior art and providing a highly reliable photovoltaic element having an ideal doped layer and which has an improved photoelectric conversion efficiency, can be practically used as a power generation source, and can be mass-produced at a reasonable cost.

The present inventor made extensive studies in order to achieve the above objects while principally focusing on the doped layer used in a photovoltaic element. As a result, there was obtained a finding that a photovoltaic element provided with a doped layer (a p-type or n-type semiconductor layer) configured as will be described in the following is sufficiently high in open-circuit voltage (Voc) and photoelectric conversion efficiency, is highly reliable, can be practically used as a power generation source, and can be mass-produced at a reasonable cost. The present invention is based on this finding.

A basic embodiment (a first embodiment) lies in a photovoltaic element having a semiconductor junction and which is provided with a specific doped layer constituted by a non-single crystalline material containing one or more elements belonging to group IV of the periodic table (this element will be hereinafter referred to as group IV element) as a principal constituent and which contains a plurality of regions having a diminished density of the group IV element as the principal constituent of the doped layer such that said plurality of regions are intermittently distributed in the inplane area of the doped layer. The "region having a diminished density of the group IV element" will be hereinafter referred to as "group IV element low density region".

The group IV element low density region means a region in which the density of the group IV element as the principal constituent of the doped layer is lowered than that of the remaining layer region of the doped layer. The group IV element low density region may be shaped in a spherical form, ellipsoid form, a solid polygonal form, or an undefined form. It is possible for the group IV element low density regions to be distributed in the doped layer such that they are spacedly situated or they are unevenly continued which adjacent group IV element low density regions being contacted with each other.

A second embodiment is that an average of the group IV element low density regions in the first embodiment is of a dimension which satisfies the following equations (a) and (b):

$$3 \text{ nm} \leq d \leq 40 \text{ nm} \tag{a}$$

$$3 \text{ nm} \leq L \leq 80 \text{ nm} \tag{b}$$

with d being an average height of the group IV element low density regions in the layer thickness direction, and L being an average diameter of the group IV element low density regions in the direction parallel to the surface of a substrate over which the doped layer is formed.

A third embodiment is that each of the group IV element low density regions in the first embodiment contains an optical band gap-enlarging element at a concentration which is greater than that of the optical band gap-enlarging element contained in the remaining layer region of the doped layer.

A fourth embodiment is that each of the group IV element low density regions in the first embodiment contains a valence electron-controlling agent at a concentration which is greater than that of the valence electron-controlling agent contained in the remaining layer region of the doped layer.

A fifth embodiment is that at least a part of the doped layer containing the group IV element low density regions in the first embodiment comprises a microcrystalline semiconductor material.

A sixth embodiment is that the group IV element low density regions in the first embodiment comprise an amorphous material.

A seventh embodiment is that the photovoltaic element in the first embodiment is of a stacked cell type comprising a plurality of photovotaic elements having a pin semiconductor junction being stacked in which a least one of reverse junction portions where the n-type and p-type semiconductor layers are contacted with each other comprises a specific doped layer constituted by a non-single crystalline material containing one or more group IV elements as a principal constituent and which contains a plurality of the group IV element low density regions such that said group IV element low density regions are intermittently distributed in the inplane area of the doped layer.

An eighth embodiment is that the photovoltaic element in the first embodiment has a substantially intrinsic semiconductor layer (that is, an i-type semiconductor layer) constituted by a microcrystalline semiconductor material.

According to the first embodiment, there are provided such advantages as will be described in the following. There is attained the provision of a desirable doped layer (that is, a desirable p-type or n-type semiconductor layer) in which the density of an activated acceptor or donor is high and which has a small activation energy and a small light absorption coefficient, in a photovoltaic element. By this, the open-circuit voltage (Voc), short-circuit current (Jsc), and fill factor (F.F.) of the photovoltaic element are heightened, where the photoelectric conversion efficiency is eventually improved. In addition, the stress in the doped layer is desirably relaxed, whereby layer peeling at the upper and lower interfaces of the doped layer is desirably prevented. As a result, the yield of a photovoltaic element mass-produced is improved.

The mechanism why these advantages are provided are not clear enough at the present time. But it is considered that such factors as will be described in the following would be involved. The group IV element low density regions which are intermittently distributed in the doped layer have a relatively large optical band gap and because of this, the light absorption by the entire doped layer is diminished, resulting in increasing the quantity of light impinged into the i-type semiconductor layer. This situation makes the photovoltaic element have an improved short-circuit current (Jsc) which is apparently greater than that of the conventional photovoltaic element in which a conventional doped layer is used.

Further, the group IV element low density regions which are intermittently distributed in the doped layer makes the doped layer have a lowered activation energy and because of this, the built-in potential is increased, resulting in making the photovoltaic element have an improved open-circuit voltage (Voc). In fact, in comparison of the case where the doped layer according to the present invention was used with the case where a conventional doped layer having a thickness adjusted so that the quantity of light absorbed by said doped layer is substantially the same as that by the doped layer according to the present invention was used, it was found that the activation energy of the former is apparently lower than that of the latter, the built-in potential of the former is apparently higher than that of the latter, and the open-circuit voltage of the photovoltaic element in the former is apparently higher than that in the latter.

In addition, because the built-in potential is increased as above described, the internal electric field of the i-type semiconductor layer is increased to diminish the probability for photocarriers to be recombined in the interface between the doped layer and the i-type semiconductor layer, whereby the fill factor (F.F.) is apparently improved.

In the second embodiment wherein the group IV element low density regions are made to have a dimension which satisfies the foregoing equations (a) and (b), the effects of the first embodiment are reinforced, wherein the open-circuit voltage (Voc), short-circuit current (Jsc) and fill factor (F.F.) of the photovoltaic element are more improved, resulting in a more improvement in the photoelectric conversion efficiency of the photovoltaic element. The mechanism why these advantages are provided is not clear enough at the present time. But it is considered that such factors as will be described in the following would be involved. Because the group IV element low density regions having a dimension which satisfies the foregoing equations (a) and (b) are intermittently distributed in the doped layer, the constituent portions of the remaining layer region of the doped layer other than the group IV element low density regions become to have minute dimensions as well as the group IV element low density regions, where so-called quantum well effects are occurred, whereby the optical band gap of the remaining layer region of the doped layer other than the group IV element low density regions is enlarged due to the group IV element low density regions, resulting in a further decrease in the quantity of light absorbed by the doped layer.

In the third embodiment wherein the group IV element low density regions contains an optical band gap-enlarging element at a concentration which is greater than that of the optical band gap-enlarging element contained in the remaining layer region of the doped layer, the effects of the first embodiment are reinforced, wherein the open-circuit voltage (Voc), short-circuit current (Jsc) and fill factor (F.F.) of the photovoltaic element are more improved, resulting in a more improvement in the photoelectric conversion efficiency of the photovoltaic element.

Herein, the optical band gap-enlarging element in the case where the IV element as the principal constituent of the doped layer is Si can include H, C, N, O, and halogen elements (X).

The mechanism why the above advantages are provided is not clear enough at the present time. But it is considered that such factors as will be described in the following would be involved.

In the case of the conventional doped layer having a uniform chemical composition, as previously described, when a large amount of one or more of these elements is contained therein, although the quantity of light absorbed by the doped layer is decreased, there is a tendency that the activation energy of the doped layer is increased to decrease the open-circuit voltage (Voc) of the photovoltaic element.

On the other hand, in the case of using the doped layer according to the present invention, a plurality of regions containing the optical band gap-enlarging element at an enhanced concentration are localized in the doped layer while being intermittently distributed therein, and because of this, the network structure of the doped layer is prevented from being disordered, and the acceptor or donor is desirably activated, where the activation energy of the doped layer is decreased. As a result, even when the short-circuit current (Jsc) is increased, the built-in potential is maintained at a desirably high level and therefore, the open-circuit voltage (Voc) of the photovoltaic element is desirably improved.

In the fourth embodiment wherein the group IV element low density regions contains a valence electron-controlling agent at a concentration which is greater than that of the valence electron-controlling agent contained in the remaining layer region of the doped layer, the effects of the first embodiment are reinforced, wherein the open-circuit voltage (Voc), short-circuit current (Jsc) and fill factor (F.F.) of the photovoltaic element are more improved, resulting in a more improvement in the photoelectric conversion efficiency of the photovoltaic element.

Herein, the valence electron-controlling agent in the case where the IV element as the principal constituent of the doped layer is Si can include p-type valence electron-controlling agents such as elements belonging to group III of the periodic table, e.g., B, Al, Ga, In, and Tl; and n-type valence electron-controlling agents such as elements belonging to group V of the periodic table, e.g., P, As, Sb, and Bi.

The mechanism why the above advantages are provided is not clear enough at the present time. But it is considered that such factors as will be described in the following would be involved.

In the case of the conventional doped layer having a uniform chemical composition, as previously described, when a large amount of one or more of these elements is contained therein, although the activation energy of the doped layer is decreased, there is a tendency that the optical band gap of the doped layer is decreased to increase the quantity of light absorbed by the doped layer.

On the other hand, in the case of using the doped layer according to the present invention, a plurality of regions (heavily doped regions) containing the valence electron-controlling agent at an enhanced concentration are localized in the doped layer since they are intermittently distributed therein and because of this, the network structure of the doped layer is prevented from being disordered, and because of this, even when the concentration of the valence electron-controlling agent contained is increased so as to decrease the activation energy of the doped layer, the optical band gap of the doped layer is slightly reduced, where the quantity of light absorbed by the doped layer is controlled to a desirably low level, and as a result, the short-circuit current (Jsc) of the photovoltaic element is maintained at a desirably high level. Further, as above described, since the heavily doped regions are localized in the doped layer while being intermittently distributed therein, it is considered that these regions become to have a relatively enlarged optical band gap due to the foregoing quantum well effects, whereby the quantity of light absorbed by the doped layer is decreased.

In the fifth embodiment wherein at least a part of the doped layer containing the group IV element low density regions comprises a microcrystalline semiconductor material, the optical band gap of the doped layer is enlarged, whereby the quantity of light absorbed by the doped layer is desirably decreased, and as a result, the short-circuit current (Jsc) of the photovoltaic element is increased. In addition, the activation energy of the doped layer is decreased and the built-in potential of the photovoltaic element is increased, whereby the open-circuit voltage (Voc) of the photovoltaic element is desirably improved.

In the sixth embodiment wherein the group IV element low density regions comprise an amorphous material, even when the remaining layer region of the doped layer other than the group IV element low density regions is principally constituted by a microcrystalline semiconductor material, the stress of the doped layer is desirably relaxed, where layer peeling at the upper and lower interfaces of the doped layer is desirably prevented. As a result, the yield of a photovoltaic element mass-produced is improved. In addition, the occurrence of interface states at the interface between the doped layer and the i-type semiconductor layer is desirably diminished and the fill factor (F.F.) of the photovoltaic element is desirably improved.

In the seventh embodiment wherein the photovoltaic element is of a stacked cell type comprising a plurality of photovotaic elements having a pin semiconductor junction being stacked in which a least one of reverse junction portions where the n-type and p-type semiconductor layers are contacted with each other comprises a specific doped layer constituted by a non-single crystalline material containing one or more group IV elements as a principal constituent and which contains a plurality of the group IV element low density regions such that said group IV element low density regions are intermittently distributed in the inplane area of the doped layer, the ohmic property of the reverse junction portion is desirably improved to result in an apparent improvement in the series resistance, whereby the fill factor (F.F.) of the photovoltaic element is desirably improve.

The reason for this is considered as will be described in the following. First, it is considered that by forming the doped layer by way of heavy doping while controlling the light absorption coefficient of the doped layer to a desirably low level so that the doped layer has a diminished activation energy, the reverse junction portion becomes a tunnel junction and as a result, the ohmic property of the reverse junction portion is desirably improved. In addition to this, it is considered that the stress of the doped layer is desirably relaxed to diminish the occurrence of interface states at the interface between the n-type and p-type semiconductor layers. Further, the light degradation of the photovoltaic element is diminished. The reason for this is considered as will be described in the following. The built-in potential of the photovoltaic element is improved to increase the intensity of the internal electric field in the i-type semiconductor layer whereby the influence of the Staebler-Wronski effect is diminished and in addition, the reverse junction portion becomes the tunnel junction whereby the ohmic property of the reverse junction portion is improved. Because of these factors, the light degradation of the reverse junction portion is desirably diminished.

In the eighth embodiment wherein the photovoltaic element has a substantially intrinsic semiconductor layer (that is, an i-type semiconductor layer) constituted by a microcrystalline semiconductor material, there are provided such advantages as will be described in the following.

In the conventional photovoltaic element in which the i-type semiconductor layer is constituted by a microcrystalline semiconductor material, problems are liable to entail in that photocarriers are recombined in a grain boundary of the microcrystalline semiconductor material as the i-type layer and particularly the portion in the vicinity of the interface between the doped layer and the i-type semiconductor layer greatly suffers from a negative influence of the photocurrent recombination, and the grain boundary portion of the microcrystalline semiconductor material as the i-type layer readily is liable to cause occurrence of leakage current. In addition, there is also a problem in that the photovoltaic element is liable to deteriorate due to thermal diffusion of the valence electron controlling agent in the grain boundary of the microcrystalline semiconductor material as the i-type layer.

The present invention is free of these problems. For the reasons for this, it is considered that such factors as will be described in the following would be involved. The IV element low density regions intermittently distributed in the doped layer function as a buffering portion to the contact of the doped layer with the grain boundary of the microcrystalline semiconductor material as the i-type layer to diminish not only the probability for photocarriers to be recombined but also the thermal diffusion of the valence electron-controlling agent through the above grain boundary, whereby the occurrence of the leakage current is desirably diminished, and the fill factor (F.F.) of the photovoltaic element is desirably improved, resulting in a desirable improvement in the photoelectric conversion efficiency of the photovoltaic element.

In the case where the i-type semiconductor layer is constituted by the microcrystalline semiconductor material, it is possible that (i) the volume ratio of the constituent microcrystalline semiconductor material of the i-type semiconductor layer is 50% or more, (ii) the microcrystalline semiconductor material is 3 nm or more in average grain size, or (iii) the average grain size of the microcrystalline semiconductor material in the direction perpendicular to the surface of the substrate over which the i-type semiconductor layer is formed is 2 times or more that in the direction parallel to the surface of the substrate.

In any of these cases (i), (ii) and (iii), such advantages as will be described in the following are provided.

In the case (i), the light absorption coefficient of the i-type semiconductor layer particularly for light having a wavelength in infrared region is increased to attain an improvement in the short-circuit current (Jsc) of the photovoltaic element. And the degradation rate of the initial photoelectric conversion efficiency is 5% or less.

In the case (ii), the mobility of photocarrier is facilitated to attain an improvement in the fill factor (F.F.) of the photovoltaic element. And the degradation rate of the initial photoelectric conversion efficiency is 5% or less.

In the case (iii), the i-type semiconductor layer has a relatively high light absorption coefficient for ultraviolet rays and visible light, where the mobility of photocarrier in the layer thickness direction in the i-type semiconductor layer is facilitated to attain an improvement in the fill factor (F.F.) of the photovoltaic element.

Further, it is possible that on an amorphous doped layer (which is constituted by an amorphous semiconductor material), a doped layer at least a partial portion of which being constituted by a microcrystalline semiconductor material and which has the same conduction type as the amorphous doped layer is stacked on the amorphous doped layer, and a substantially intrinsic semiconductor layer (that is, an i-type semiconductor layer) at least a partial portion of which being constituted by a microcrystalline material is stacked thereon. In this case, it is possible to prevent occurrence of a problem in that under layers such as a transparent and electrically conductive layer situated under the doped layer comprising the microcrystalline semiconductor material is sometimes damaged due to the doped layer, where the series resistance of the photovoltaic element is decreased and the fill factor (F.F.) of the photovoltaic element is improved.

BRIEF DESCRIPTION OF THE DRAWINGS

FIG. 4 is a schematic cross-sectional view illustrating another example of a stacked cell type photovoltaic element according to the present invention.

DETAILED DESCRIPTION OF THE INVENTION AND PREFERRED EMBODIMENTS

Figure 1:
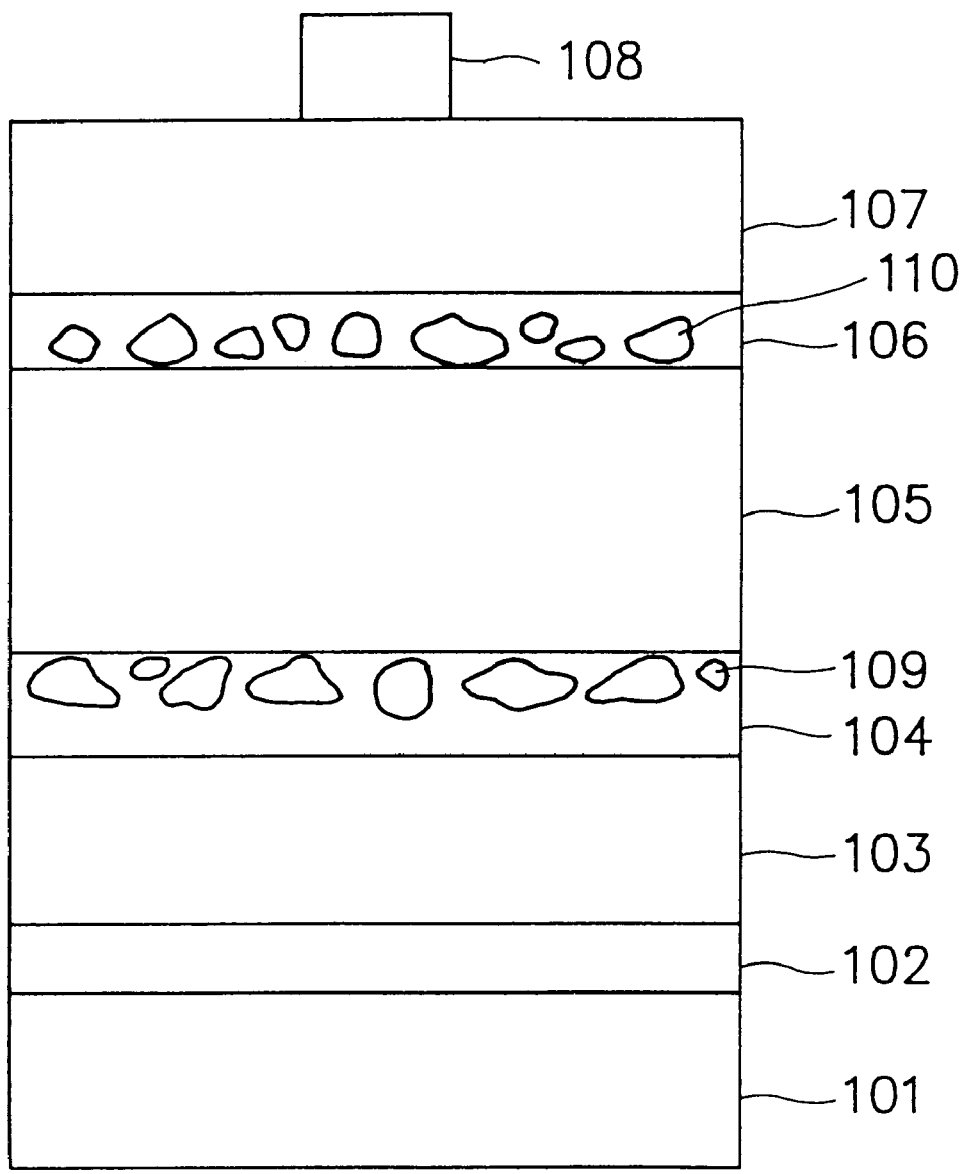
FIG. 1 is a schematic cross-sectional view illustrating an example of a single cell type photovoltaic element according to the present invention.

In the following, description will be made of a photovoltaic element (or a photovoltaic device) according to the present invention and the production thereof while referring to the drawings.

The photovoltaic element according to the present invention may be a single cell type photovoltaic element comprising a single photovoltaic cell having a semiconductor junction structure with a specific doped layer containing a plurality of the foregoing group IV element low density regions (that is, a plurality of regions having a diminished density of group IV element as a principal constituent of said doped layer) such that they are intermittently distributed in said doped layer or a stacked cell type photovoltaic element comprising a plurality of photovoltaic cells which are stacked, wherein each photovoltaic cell has a semiconductor junction having a semiconductor junction structure with a specific doped layer containing a plurality of the foregoing group IV element low density regions such that they are intermittently distributed in said doped layer.

Figure 2:
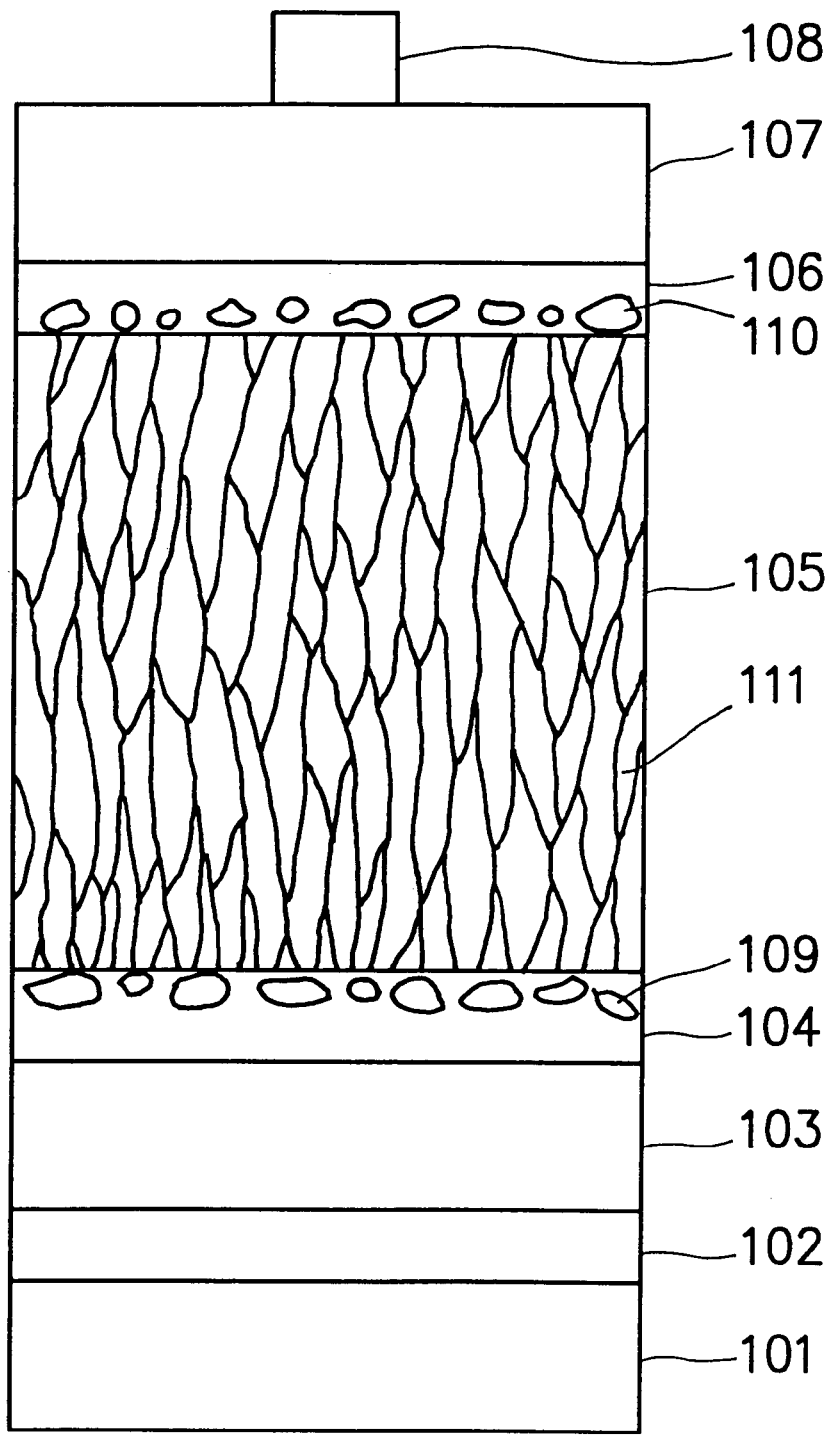
FIG. 2 is a schematic cross-sectional view illustrating another example of a single cell type photovoltaic element according to the present invention.

FIG. 1 is a schematic cross-sectional view illustrating an example of the single cell type photovoltaic element according to the present invention. FIG. 2 is a schematic cross-sectional view illustrating another example of the single cell type photovoltaic element according to the present invention.

In FIGS. 1 and 2, reference numeral 101 indicates a substrate, reference numeral 102 a back face electrode layer (or a lower electrode), reference numeral 103 a transparent and electrically conductive layer, reference numeral 104 an n-type semiconductor layer comprising a doped layer, reference numeral 105 an i-type semiconductor layer, reference numeral 106 a p-type semiconductor layer comprising a doped layer, reference numeral 107 a transparent electrode (or an upper electrode), and reference numeral 108 a collecting electrode (or a grid electrode).

Each of reference numerals 109 and 110 indicates a region with a diminished density of group IV element as a principal constituent of the doped layer (that is, the foregoing group IV element low density region). It is understood that the doped layer as the n-type semiconductor layer 104 and the doped layer as the p-type semiconductor layer 106 respectively contains a plurality of the group IV element low density regions such that they are intermittently distributed in the doped layer.

Reference numeral 111 in FIG. 2 indicates a microcrystalline semiconductor material by which the i-type semiconductor layer 105 is constituted.

Each of the photovoltaic elements shown in FIGS. 1 and 2 is of the configuration in that light is impinged through the side of the p-type semiconductor layer 106. This configuration may be modified such that light is impinged through the side of the substrate 101. In this case, the n-type semiconductor layer 104 and the p-type semiconductor layer 106 are usually exchanged such that the former is positioned on the side opposite the substrate 101 and the latter is positioned on the side of the substrate. Alternatively, it is possible that the stacking order shown in FIG. 1 or 2 excluding the substrate is reversed.

Figure 3:
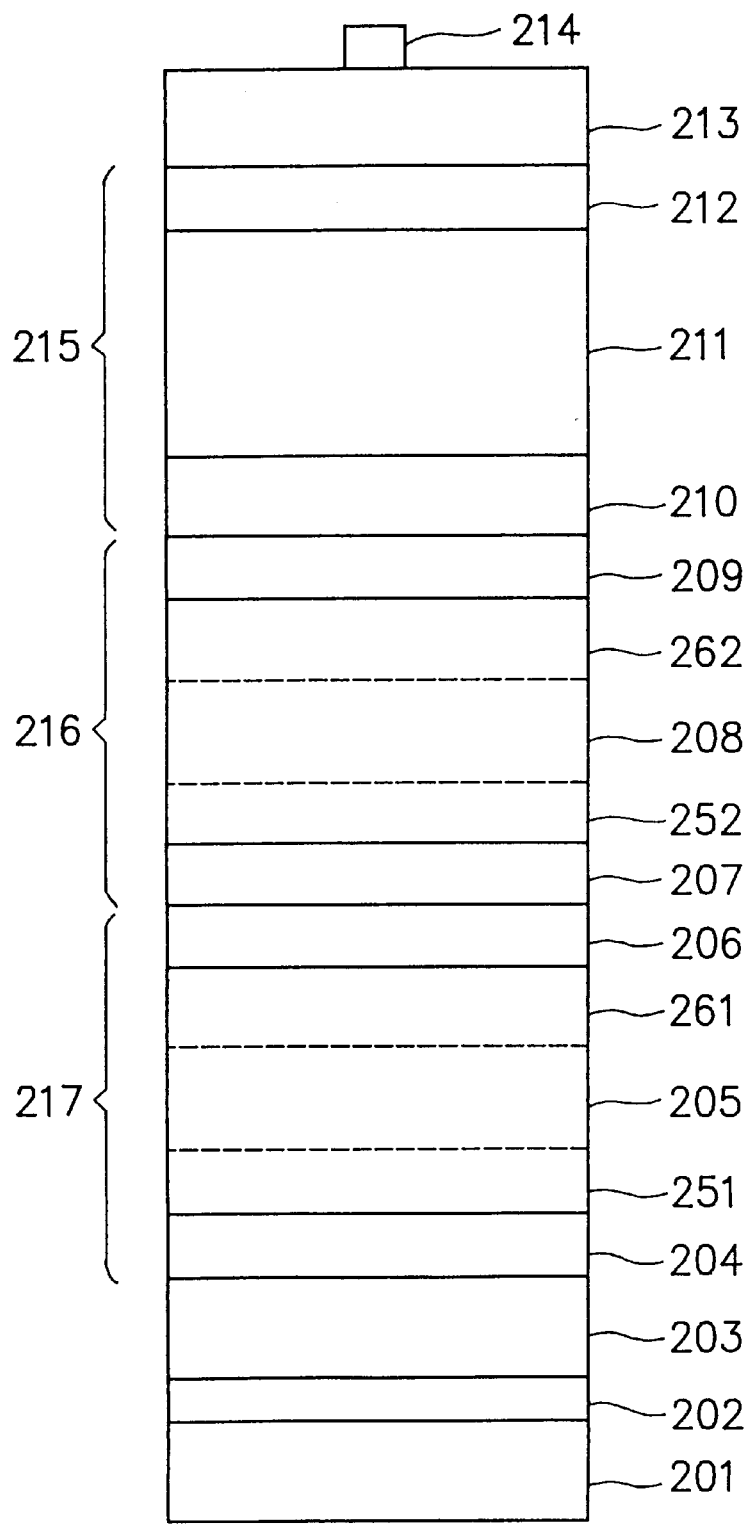
FIG. 3 is a schematic cross-sectional view illustrating an example of a stacked cell type photovoltaic element according to the present invention.

FIG. 3 is a schematic cross-sectional view illustrating an example of the stacked cell type photovoltaic element according to the present invention. FIG. 4 is a schematic cross-sectional view illustrating another example of the stacked cell type photovoltaic element according to the present invention.

Any of the stacked cell type photovotaic elements shown in FIGS. 3 and 4 has a structure in that three photovoltaic cells having a pin semiconductor junction are stacked.

In FIGS. 3 and 4, reference numeral 215 indicates a first photovoltaic cell (or a top cell) having a pin semiconductor junction structure which is situated on the light incident side, reference numeral 216 a second photovoltaic cell (or a middle cell) having a pin semiconductor junction structure which is situated under the first photovoltaic cell 215, and reference numeral 217 a third photovoltaic cell (or a bottom cell) having a pin semiconductor junction structure which is situated under the second photovoltaic cell 216 and on the substrate side.

Reference numeral 201 indicates a substrate, reference numeral 202 a back face electrode layer (or a lower electrode) formed on the substrate, and reference numeral 203 a transparent conductive layer formed on the back face electrode layer 202.

On the transparent and electrically conductive layer 203, the bottom cell 217, the middle cell 216 and the top cell 215 are stacked in the named order.

Reference numeral 213 indicates a transparent electrode (or an upper electrode) formed on the surface of the top cell 215, and reference numeral 214 a collecting electrode (or a grid electrode) formed on the transparent electrode 213.

Each of the three cells 215, 216 and 217 comprises a stacked structure comprising an n-type semiconductor layer (204, 207, 210) comprising a doped layer, an i-type semiconductor layer (205, 208, 211), and a p-type semiconductor layer (206, 209, 212). At least one of the two doped layers in each cell contains a plurality of the group IV element low density regions such that they are intermittently distributed in the doped layer.

In the configuration shown in FIG. 3, the i-type layer in each of the bottom cell 217 and the middle cell 216 comprises a three-layered structure comprising the i-type semiconductor layer (205, 208) composed of a given non-single crystalline material interposed between a pair of i-type semiconductor layers [(251 and 261) or (252 and 262)] which are composed of a given non-single crystalline material which is different from the non-single crystalline material by which the i-type semiconductor layer (205, 208) is constituted.

In the configuration shown in FIG. 4, the i-type layer in the bottom cell 217 comprises a three-layered structure comprising the i-type semiconductor layer 205 composed of a given non-single crystalline material interposed between a pair of i-type semiconductor layers 251 and 261 which are composed of a given non-single crystalline material which is different from the non-single crystalline material by which the i-type semiconductor layer 205 is constituted.

In any of the configurations shown in FIGS. 3 and 4, the stacking order of the doped layers or the electrodes may be properly changed according to the situation involved, as well as in the case of any of the configurations shown in FIGS. 1 and 2.

In the following, description will be made of each of constituents of the photovoltaic element according to the present invention.

Substrate

The substrate (101, 201) may be constituted by a single crystalline material or a non-single crystalline material. The substrate may be electrically conductive or electrically insulating, and it may be transparent or opaque.

In any case, it is desired for the substrate to be hardly deformed or distorted and to have an appropriate physical strength.

The electrically conductive substrate can include, for example, metals such as Fe, Ni, Cr, Al, Mo, Au, Nb, Ta, V, Ti, Pt, and Pb; alloys of these metals such as brass, stainless steel, and the like; and composites of these alloys.

In the case where the substrate comprises an electrically conductive material selected from those above mentioned, the substrate may serve also as the lower electrode (102, 202). In this case, the substrate may also serve as a current-outputting electrode.

The electrically insulating substrate can include, for example, films or sheets of heat resistant synthetic resins such as polyester, polyethylene, polycarbonate, cellulose acetate, polypropylene, polyvinyl chloride, polyvinylidene chloride, polystyrene, polyamide, polyimide, and epoxy resin; and composites of these with glass fiber, carbon fiber, boron fiber, or metallic fiber. Alternatively, it may comprise glass or ceramics.

Besides, the substrate may comprise a thin plate made of such metal or alloy as above mentioned having a surface coated by a thin film of a metal which is different from the constituent metallic material of the thin plate or an electrically insulating thin film of $SiO_2$, $Si_3N_4$, $Al_2O_3$, or AlN, formed by way of surface coating treatment by means of sputtering, vacuum evaporation, or plating. Alternatively, the substrate may be a sheet made of such heat resistant synthetic resin as above mentioned having a surface coated by a thin film of such metal or alloy as above mentioned or an electrically insulating thin film of $SiO_2$, $Si_3N_4$, $Al_2O_3$, or AlN, formed by way of surface coating treatment by means of sputtering, vacuum deposition, or metal plating.

In the case where the substrate comprises such an electrically insulating film or sheet as above mentioned, it is desired to form an electrically conductive film of a metal such as Al, Ag, Pt, Au, Ni, Ti, Mo, W, Fe, V, Cr or Cu, an alloy such as stainless steel, brass or nichrome, or a transparent and electrically conductive oxide (TCO) material such as $SnO_2$, $In_2O_3$, ZnO, or ITO ($In_2O_3+SnO_2$) on the surface of the electrically insulating substrate, on which a deposited film is to be formed, by means of metal plating, vacuum deposition, or sputtering. In this case, the electrically conductive film formed on the surface of the electrically insulating substrate may function as the current outputting electrode.

The substrate, even if it is composed of an electrically conductive material, may be provided with a metallic layer comprising a metal different from the constituent metal of the substrate on the surface thereof on which a deposited film is to be formed, in order to improve the long wavelength light reflection coefficient at the surface of the substrate and also in order to prevent occurrence of mutual interdiffusion of the constituent materials between the substrate and the deposited film formed on the surface thereof.

In the case of a photovoltaic element in which the substrate is relatively transparent and which is of the configuration that light is impinged from the substrate side, it is desired that the foregoing transparent electrically conductive oxide film or the foregoing electrically conductive metallic film is previously formed on the substrate.

It is possible for the substrate to have a flat surface or an uneven surface provided with minute irregularities. In the case where the substrate surface is provided with minute irregularities, the irregularities may be spherical, conical, or pyramid shape, in which the elevation (Rmax) is preferably 0.05 to 2 μm. There is an advantage in this case in that light is irregularly reflected at the uneven surface of the substrate, thereby increasing the optical path length of the light thus reflected.

The substrate may be of any configuration such as plate-like, belt-like or cylindrical shape, which can be properly determined depending upon the situation involved.

For the thickness of the substrate, it should be properly determined so that a photovoltaic element can be formed thereon as desired. In the case where flexibility is required for the photovoltaic element or in the case of a photovoltaic element of the type in that light is impinged from the substrate side, the substrate is desired to be made as thin as possible within a range capable of sufficiently providing the function as the substrate. However, the thickness is usually designed to be not less than 10 μm in view of facilitating the fabrication and handling efficiencies and also in view of mechanical strength of the substrate.

Electrodes

In the photovoltaic device of the present invention, appropriate electrodes are used in accordance with the configuration of a photovoltaic element. As such electrodes, there are the back face lower electrode layer (102, 202) (this electrode layer will be hereinafter referred to as "lower electrode"), the transparent electrode layer (107, 213) (this electrode layer will be hereinafter referred to as "upper electrode"), and the collecting electrode (108, 214) (or the grid electrode).

The upper electrode is positioned on the side from which light is impinged, and the lower electrode is positioned to oppose the upper electrode, with the semiconductor layers being arranged between the two electrodes.

In the following, description will be made of these electrodes.

Lower Electrode

As shown in FIGS. 1 to 4, the lower electrode (102, 202) (that is, the back face electrode layer) is positioned on the rear side of the semiconductor layer with respect to the direction for light to be impinged. In the case where the substrate (101, 201) is capable of allowing light transmission and light is impinged through the substrate side, the lower electrode is arranged at the position where the upper electrode (107, 213) (that is, the transparent electrode layer) is arranged.

The lower electrode is formed of a metal selected from the group consisting of Au, Ag, Cu, Al, Ni, Fe, Cr, Mo, W, Ti, Co, Ta, Nb, and Zr or an alloy selected from the group consisting of alloys of these metals. Of these, metals such as Al, Cu, Ag, and Au are particularly preferable, since they are relatively high in reflectance. In the case where the lower electrode is constituted by the metal having a high reflectance, the lower electrode can serves also as a light reflection layer which reflects light, which arrives at the lower electrode without being absorbed by the semiconductor layer, into the semiconductor layer. In this case, it is possible for the lower electrode (the back face electrode layer) to be formed by stacking two or more layers each constituted by a different metal so as to be capable of serving also as the back reflector.

The surface state of the lower electrode may be flat. In a preferred embodiment, the lower electrode is made have an irregular surface provided with minute irregularities which is capable of effectively reflecting light. In this case, there is an advantage in that light which arrives at the lower electrode without being absorbed by the semiconductor layer is reflected by the irregular surface of the lower electrode into the semiconductor layer to prolong the optical path length in the semiconductor layer, whereby the sensitivity of the photovoltaic element to light having a long wavelength is improved to increase the short-circuit current (Jsc), resulting in an improvement in the photoelectric conversion efficiency. The irregular surface of the lower electrode is desired to be of 0.2 to 2.0 μm in elevation (Rmax).

In the case where the substrate is designed such that it can also serves as the lower electrode, the lower electrode is not always necessary to be provided.

The lower electrode may be formed by a conventional manner such as vacuum deposition, sputtering, metal plating, or screen printing.

The formation of the lower electrode having such irregular surface as above described may be conducted by subjecting a film of a given metal or alloy to dry etching, wet etching, sand blasting or heat treatment. Alternatively, it may be conducted by vacuum-depositing a film of a given metal or alloy on the surface of a given substrate while heating the substrate.

Upper Electrode

The upper electrode (107, 213) (that is, the transparent electrode layer) is positioned on the light incident side to transmit incident light into the semiconductor layer. By optimizing the thickness thereof, it can serves also as a reflection preventive layer.

The upper electrode is required to have a high light transmittance for light having a wavelength which can be absorbed by the semiconductor layer and to have a low resistivity. Particularly, the upper electrode is desired to have a light transmittance of preferably 80% or more, more preferably 85% or more, respectively for light having a wavelength of 550 nm, and to have a resistivity of preferably $5\times10^{-3}$ Ωcm or less, more preferably $1\times10^{-3}$ Ωcm or less.

The upper electrode is formed of an electrically conductive metal oxide selected from the group consisting of $In_2O_3$, $SnO_2$, ITO ($In_2O_3+SnO_2$), ZnO, CdO, $Cd_2SnO_4$, $TiO_2$, $Ta_2O_5$, $Bi_2O_3$, $MoO_3$, and $Na_xWO_3$; and mixtures of these.

These materials which are used as the constituent of the upper electrode may contains an element (a dopant) capable of controlling the conductivity (this element will be hereinafter referred to as conductivity-controlling element). In the case where the upper electrode is composed of ZnO, the conductivity-controlling element can include, for example, Al, In, B, Ga, Si, and F.

In the case where the upper electrode is composed of $In_2O_3$, the conductivity-controlling element can include, for example, Sn, F, Te, Ti, Sb, and Pb.

In the case where the upper electrode is composed of $SnO_2$, the conductivity-controlling element can include, for example, F, Sb, P, As, In, Tl, Te, W, Cl, Br, and I.

The upper electrode (the transparent electrode layer) may be formed by a conventional manner such as vacuum deposition, CVD, spraying, spinning-on, or dipping.

Collecting Electrode

The collecting electrode (108, 214) (or the grid electrode) is disposed on the upper electrode (107, 213) (that is, the transparent electrode) if necessary, in the case where the resistivity of the upper electrode is difficult to be sufficiently reduced, wherein the collecting electrode functions to reduce the resistivity of the upper electrode whereby reducing the series resistance of the photovoltaic element.

The collecting electrode is formed of a metal selected from the group consisting of a metal selected from the group consisting of Au, Ag, Cu, Al, Ni, Fe, Cr, Mo, W, Ti, Co, Ta, Nb, and Zr; an alloy selected from the group consisting of alloys of these metals such as stainless steel; or an electrically conductive paste comprising a powdery material of any of the above mentioned metals.

Figure 8:
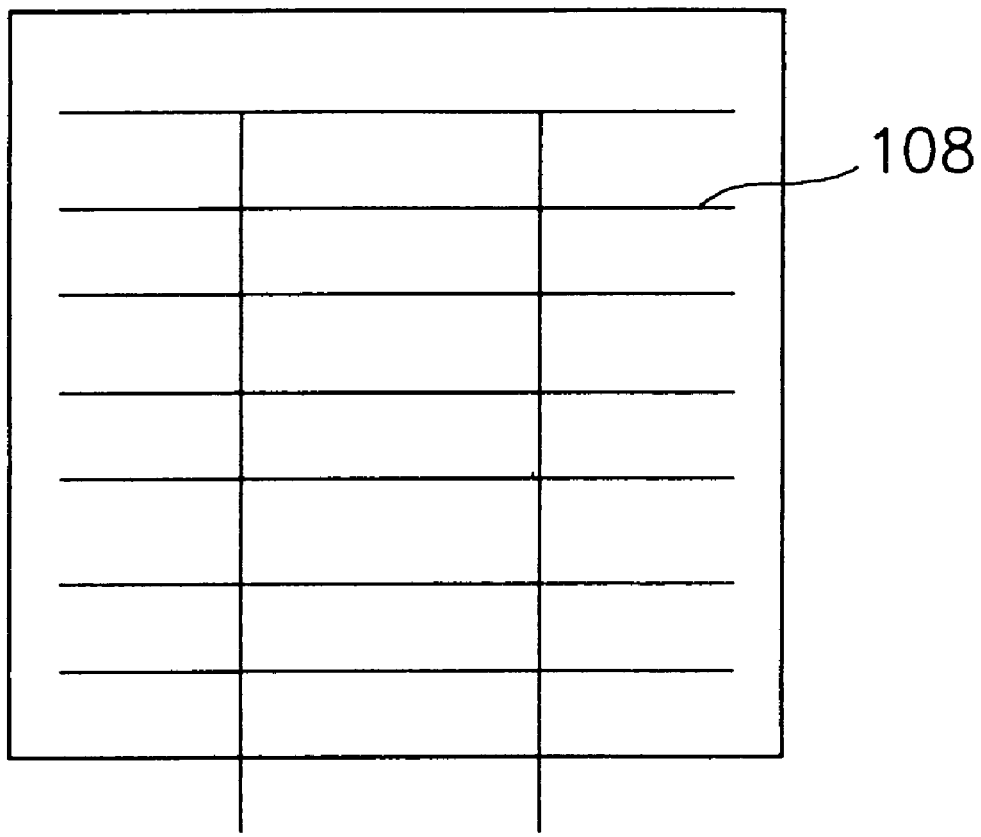
FIG. 8 is a schematic view illustrating a light receiving side of a photovoltaic element according to the present invention.

For the configuration of the collecting electrode, it is desired to designed so that the introduction of incident light into the semiconductor layer is not hindered as much as possible. Particularly, for instance, it is formed in a branched form as shown in FIG. 8. In FIG. 8, reference numeral 108 a collecting electrode (a grid electrode) in a branched form which is arranged on a light receiving face of a photovoltaic element.

For the area of the collecting electrode, it is desired to be designed such that it covers preferably 15% or less, more preferably 10% or less, most preferably 5% or less, of the light receiving face of the photovoltaic element.

The formation of the collecting electrode may be conducted using a patterning mask and by means of vacuum deposition, sputtering, metal plating, or screen printing.

Transparent and Electrically Conductive Layer

The transparent and electrically conductive layer (103, 203) is arranged between the back face electrode layer (102, 202) (the lower electrode or the back reflector) and the semiconductor layer (104, 204) (the doped layer) for such purposes as will be described in the following. A first purpose is that irregular reflection of light at the rear face of the power generation region of the photovoltaic element is improved and light is confined in the power generation region by virtue of multiple interference by thin film whereby the optical path length in the semiconductor layer is elongated to short-circuit current (Jsc) of the photovoltaic element. A second purpose is that the metallic component of the lower electrode (the back face electrode layer) which serves also as the back reflector is prevented from being diffused or migrated into the semiconductor layer whereby preventing the photovoltaic element from being shunted. A third purpose is that by making the transparent and electrically conductive layer have a certain resistivity, occurrence of short-circuit due to defects such as pinhole present in the semiconductor layer situated between the lower electrode (102, 202) (the back face electrode layer) and the upper electrode (107, 213) (the transparent electrode layer) is prevented.

The transparent and electrically conductive layer is required to have a high light transmittance for light having a wavelength which can be absorbed by the semiconductor layer and to have an adequate resistivity. Particularly, the transparent and electrically conductive layer is desired to have a light transmittance of preferably 80% or more, more preferably 85% or more, most preferably 90% or more, respectively for light having a wavelength of 650 nm, and to have a resistivity preferably in the range of from $1\times10^{-4}$ to $1\times10^{6}$ Ωcm, more preferably in the range of $1\times10^{-2}$ to $5\times10^{4}$ Ωcm.

The transparent and electrically conductive layer is formed of an electrically conductive metal oxide selected from the group consisting of $In_2O_3$, $SnO_2$, ITO ($In_2O_3$+$SnO_2$), ZnO, CdO, $Cd_2SnO_4$, $TiO_2$, $Ta_2O_5$, $Bi_2O_3$, $MoO_3$, and $Na_xWO_3$; and mixtures of these.

These materials which are used as the constituent of the transparent and electrically conductive layer may contains an element (a dopant) capable of controlling the conductivity (this element will be hereinafter referred to as conductivity-controlling element). In the case where the transparent and electrically conductive layer is composed of ZnO, the conductivity-controlling element can include, for example, Al, In, B, Ga, Si, and F.

In the case where the transparent and electrically conductive layer is composed of $In_2O_3$, the conductivity-controlling element can include, for example, Sn, F, Te, Ti, Sb, and Pb.

In the case where the transparent and electrically conductive layer is composed of $SnO_2$, the conductivity-controlling element can include, for example, F, Sb, P, As, In, Tl, Te, W, Cl, Br, and I.

The transparent and electrically conductive layer may be formed by means of vacuum deposition such as EB deposition, sputtering deposition, or the like; CVD, spraying, spinning-on, or dipping.

Semiconductor Layer

As the constituent material of the semiconductor layer used in the photovoltaic element according to the present invention, there can be mentioned non-single crystalline semiconductor materials containing one or more of group IV elements such as Si, C, Ge, and the like (this non-single crystalline semiconductor material will be hereinafter referred to as group IV series non-single crystalline semiconductor material), and alloy series non-single crystalline semiconductor materials comprising group IV elements such as a-SiGe, a-SiC, a-SiSn, and the like (this non-single crystalline semiconductor material will be hereinafter referred to as group IV alloy series non-single crystalline semiconductor material).

Specific representative examples of such semiconductor materials which are particularly suited to use in the photovoltaic element according to the present invention are a-Si:H, a-Si:F, a-Si:H:F, a-SiGe:H, a-SiGe:F, a-SiGe:H:F, a-SiC:H, a-SiC:F, a-SiC:H:F, $\mu$c-Si:H, $\mu$c-Si:F, $\mu$c-Si:H:F, $\mu$c-SiGe:H, $\mu$c-SiGe:F, $\mu$c-SiGe:H:F, $\mu$c-SiC:H, $\mu$c-SiC:F, $\mu$c-SiC:H:F, and the like.

For the semiconductor layer, the control of valence electron control or/and the control of forbidden band width may be conducted. In this case, the control of valence electron or forbidden band width for the semiconductor layer may be conducted, for instance, in a manner of introducing a gaseous raw material capable of supplying a valence electron-controlling element or a forbidden band width-controlling element into a film-forming chamber upon the formation of the semiconductor layer, wherein said gaseous raw material is introduced into the film-forming chamber independently or while mixing with a film-forming raw material gas for the formation of the semiconductor layer or dilution gas.

For the semiconductor layer, it is possible to form at least a pin semiconductor junction structure by doping a part of the semiconductor layer with a dopant of p-type and a dopant of n-type. And by forming a plurality of pin junction structures, a so-called stacked cell can be established.

The formation of the semiconductor layer may be conducted by means of CVD such as microwave plasma CVD, RF plasma CVD, photo-assisted CVD, thermal-induced CVD, or MO-CVD; vacuum evaporation such as EB, MBE, ion plating, or ion beam evaporation; sputtering; spraying; or printing. Of these, plasma CVD in which a raw material gas is decomposed by plasma to form a deposited film on a substrate is particularly preferable.

As the film-forming apparatus suitable for the formation of the semiconductor layer, either a batch film-forming apparatus or a continuous film-forming apparatus can be optionally used.

In the following, description will be made of the formation of the semiconductor layer using a group IV series non-single crystalline semiconductor material or a group IV alloy series non-single crystalline semiconductor material which are particularly suitable for the formation of the semiconductor layer in the photovoltaic element according to the present invention.

I-Type Semiconductor Layer (Intrinsic Semiconductor Layer)

In a photovoltaic element having a pin semiconductor junction structure in which a group IV series non-single crystalline semiconductor material or a group IV alloy series non-single crystalline semiconductor material is used, the i-type semiconductor layer used in the pin semiconductor junction structure is an important layer to generate and transport a carrier against light irradiated.

As the i-type semiconductor layer herein, it is possible to use also a substantially intrinsic semiconductor layer having a slight p-type or n-type property.

The group IV series non-single crystalline semiconductor material or the group IV alloy series non-single crystalline semiconductor material by which the i-type semiconductor layer is constituted contains hydrogen atoms (H, D) or/and halogen atoms (X), and these atoms function to compensate dangling bonds present in the i-type semiconductor layer and to improve the product of the mobility and lifetime of carrier in the i-type semiconductor layer. Further the hydrogen atoms or/and the halogen atoms function to compensate the interface states in the interface between the p-type semiconductor layer and the i-type semiconductor layer and that in the interface between the n-type semiconductor layer and the i-type semiconductor layer, whereby improving the photoelectromotive force, photocurrent and photoresponsibility of the photovoltaic element.

For the amount of the hydrogen atoms or/and the halogen atoms contained in the i-type semiconductor layer, it is most preferably in the range of 1 to 40 atomic %.

It is desired for the hydrogen atoms or/and the halogen atoms to be contained in the i-type semiconductor layer such that their concentration distribution is enhanced on the side of the interface between the i-type semiconductor layer and the p-type semiconductor layer and also on the side of the interface between the i-type semiconductor layer and the n-type semiconductor layer. The content of the hydrogen atoms or/and the halogen atoms contained in each of the opposite interface neighboring layer regions of the i-type semiconductor layer is desired to be 1.1 to 2 times the content of the hydrogen atoms or/and the halogen atoms contained in a bulk layer region (excluding the opposite interface neighboring layer regions) of the i-type semiconductor layer.

In addition, it is desired that the content of the hydrogen atoms or/and the halogen atoms contained in the semiconductor layer is changed in accordance with the content of the silicon atoms contained in the i-type semiconductor layer.

In the case of a stacked cell type photovoltaic element, it is desired that the i-type semiconductor layer in the pin semiconductor junction structure in the vicinity of the light incident side is constituted by a non-single crystalline semiconductor material having a relatively large band gap and the i-type semiconductor layer in the pin semiconductor junction structure which is remote from the light incident side is constituted by a non-single crystalline semiconductor material having a relatively small band gap.

The non-single crystalline semiconductor material by which the i-type semiconductor layer can include, for example, amorphous silicon (a-Si) materials; amorphous silicon-germanium (a-SiGe) material; microcrystalline silicon ($\mu$c-Si) materials; and microcrystalline silicon-germanium ($\mu$c-SiGe) materials. These materials contain hydrogen atoms (H) or/and halogen atoms (X) which compensate the dangling bonds as above described. Specific preferable examples of these materials are a-Si:H, a-Si:F, a-Si:H:F, a-SiGe:H, a-SiGe:F, a-SiGe:H:F, $\mu$c-Si:H, $\mu$c-Si:F, $\mu$c-Si:H:F, $\mu$c-SiGe:H, $\mu$c-SiGe:F, $\mu$c-SiGe:H:F, and the like.

In the case where the i-type semiconductor layer is constituted by such microcrystalline semiconductor material as above mentioned, the volume ratio of the microcrystalline semiconductor material in the i-type semiconductor layer is desired to be preferably 50% or more, more preferably 60% or more, most preferably 70% or more. For the average grain size of the microcrystalline semiconductor material, it is preferably 3 nm or more, more preferably 4 nm or more, most preferably 5 nm or more. And for the average grain size of the microcrystalline semiconductor material in the i-type semiconductor layer in the direction perpendicular to the surface of the substrate over which the i-type semiconductor layer is formed, it is preferably 2 times or more, more preferably 3 times or more, most preferably 5 times or more, over that in the direction parallel to the surface of the substrate.

The volume ratio of the microcrystalline semiconductor material may be examined by observing a cross section thereof by means of a transmission electron microscope (TEM) or by analyzing the ratio of peaks by Raman spectrum. The average grain size of the microcrystalline semiconductor material may be obtained based on the peak width at half height by X-ray diffraction.

By constituting the i-type semiconductor layer by such microcrystallne semiconductor material as above described, the absorption coefficient of the i-type semiconductor layer against ultraviolet rays, visible rays, and infrared rays is improved to increase the mobility of photocarrier in the i-type semiconductor layer. This situation diminishes the degradation of the photovoltaic element due to continuous light irradiation thereto. The result of the experimental studies by the present inventor revealed that in the case where the i-type semiconductor layer is constituted by a microcrystalline silicon semiconductor material, the band gap thereof obtained on the basis of a graph of the interrelation between the light absorption coefficient and light energy is 1.0 eV which is relatively smaller than the band gap (1.1 eV) of a single crystalline silicon semiconductor material. For the thickness of the i-type semiconductor layer at least part of which being constituted by the microcrystalline semiconductor material, although being somewhat different depending upon the kind thereof, for instance in the case of using a microcrystalline silicon semiconductor material, it is preferably in the range of 0.2 to 10 $\mu$m, more preferably in the range of 0.4 to 5 $\mu$m.

Now, in a preferred embodiment of the i-type semiconductor layer in the photovoltaic element according to the present invention, when the i-type semiconductor layer comprises an amorphous semiconductor material, the amorphous semiconductor material is desired to have a hydrogen content ($C_H$) of 1.0 to 25.0 atomic %; a photoconductivity ($\sigma$ p) of $1.0 \times 10^{-7}$ S/cm or more under irradiation of pseudo sunlight (AM 1,5) of 100 mW/cm$^2$; a dark conductivity ($\sigma$ d) of $1.0 \times 10^{-9}$ S/cm or less; an Urbach energy by CPM (constant photocurrent method) of 55 meV or less; and a localized states density of $10^{17}$/cm$^3$ or less; when the i-type semiconductor layer comprises a microcrystalline semiconductor material, the microcrystalline semiconductor material is desired to have a hydrogen content ($C_H$) of 0.1 to 15.0 atomic %; a photoconductivity ($\sigma$ P) of $1.0 \times 10^{-6}$ S/cm or more under irradiation of pseudo sunlight (AM 1,5) of 100 mW/cm$^2$; a dark conductivity ($\sigma$ d) of $1.0 \times 10^{-3}$ S/cm or less; an Urbach energy by CPM (constant photocurrent method) of 57 meV or less; and a localized states density of $10^{17}$/cm$^3$ or less.

Doped Layer (p-type Semiconductor Layer or n-type Semiconductor Layer)

A principal feature of the photovoltaic element according to the present invention lies in the doped layer (the p-type or n-type semiconductor layer).

The doped layer is an important layer which governs the characteristics of the photovoltaic element.

As previously described, the doped layer in the present invention is characterized in that the doped layer is composed of a non-single crystalline semiconductor material principally comprising a group IV element and contains a plurality of group IV element low density regions (that is, a plurality of regions having a diminished density of the group IV element as the principal constituent of the doped layer) such that they are intermittently distributed in the doped layer.

In a preferred embodiment, an average of the group IV element low density regions is of a dimension which satisfies the following equations (a) and (b):

$$3 \text{ nm} \leq d \leq 40 \text{ nm} \quad \text{(a)}$$

$$3 \text{ nm} \leq L \leq 80 \text{ nm} \quad \text{(b)}$$

with d being an average height of the group IV element low density regions in the layer thickness direction, and L being an average diameter of the group IV element low density regions in the direction parallel to the surface of a substrate over which the doped layer is formed.

In a more preferred embodiment, an average of the group IV element low density regions is of a dimension which satisfies the following equations (a-i) and (b-i).

$$4 \text{ nm} \leq d \leq 30 \text{ nm} \quad \text{(a-i)}$$

$$4 \text{ nm} \leq L \leq 60 \text{ nm} \quad \text{(b-i)}$$

In a most preferred embodiment, an average of the group IV element low density regions is of a dimension which satisfies the following equations (a-ii) and (b-ii).

$$5 \text{ nm} \leq d \leq 20 \text{ nm} \quad \text{(a-ii)}$$

$$5 \text{ nm} \leq L \leq 40 \text{ nm} \quad \text{(b-ii)}$$

In the case where the group IV element low density regions are of a dimension which is smaller than the above described range, there is a tendency for the light absorption coefficient of the doped layer to be increased.

In the case where the group IV element low density regions are of a dimension which is beyond the above described range, there is a tendency for the group IV element low density regions to be connected with each other into a continuous state. In this case, although the light absorption coefficient of the doped layer is decreased, the activation energy of the doped layer is increased to result in reducing the open-circuit voltage (Voc) of the photovoltaic element.

By making each of the group IV element low density regions have a dimension in the foregoing range, it is possible to decrease the light absorption coefficient of the doped layer while maintaining the activation energy of the doped layer at a lowered level, whereby improving the open-circuit voltage (Voc) and the short-circuit current (Jsc) of the photovoltaic element.

The group IV element low density region may be shaped in a spherical form, ellipsoid form, a solid polygonal form, or an undefined form.

The presence of the group IV element low density regions in the doped layer may be confirmed by an appropriate analytical method. For instance, it can be confirmed by observing a cross section obtained by cutting the photovoltaic element in a direction perpendicular to the substrate by means of a transmission electron microscope (TEM).

Each of the IV element low density regions intermittently distributed in the doped layer is desired to contain an optical band gap-enlarging element at a concentration which is greater than that of the optical band gap-enlarging element contained in the remaining layer region of the doped layer. Specific examples of such optical band gap-enlarging element in the case where the IV element as the principal constituent of the doped layer is Si are H, C, N, O, and halogen elements.

The preferable concentration of the optical band gap-enlarging element contained in the group IV element low density regions is somewhat different depending upon the kind of an optical band gap-enlarging element used. However, in general, it is preferably in the range of 1 to 90 atomic %, more preferably in the range of 3 to 80 atomic %. And for the concentration of the optical band gap-enlarging element contained in the remaining layer region of the doped layer, it is preferably in the range of 0.1 to 50 atomic %, more preferably in the range of 1 to 40 atomic %. Particularly, the concentration of the optical band gap-enlarging element contained in the group IV element low density regions is desired to be preferably 2 to 200 times, more preferably 3 to 100 times, respectively over the concentration of the optical band gap-enlarging element contained in the remaining layer region of the doped layer.

Further, each of the IV element low density regions intermittently distributed in the doped layer is desired to contain a valence electron-controlling agent at a concentration which is greater than that of the valence electron-controlling agent contained in the remaining layer region of the doped layer.

The preferable concentration of the valence electron-controlling agent contained in the group IV element low density regions is somewhat different depending upon the kind of a valence electron-controlling agent used. However, in general, it is preferably in the range of 0.5 to 90 atomic %, more preferably in the range of 1 to 80 atomic %. And for the concentration of the valence electron-controlling agent contained in the remaining layer region of the doped layer, it is preferably in the range of 0.05 to 50 atomic %, more preferably in the range of 0.1 to 40 atomic %. Particularly, the concentration of the valence electron-controlling agent contained in the group IV element low density regions is desired to be preferably 2 to 500 times, more preferably 3 to 300 times, respectively over the concentration of the valence electron-controlling agent contained in the remaining layer region of the doped layer.

For the doped later in which the group IV element low density regions are intermittently distributed, at least a partial layer region thereof is desired to be constituted by a microcrystalline semiconductor material. And the group IV element low density regions are desired to be constituted by an amorphous semiconductor material.

Preferable typical examples of the constituent non-single crystalline material of the doped layer are amorphous (a-) semiconductor materials, microcrystalline ($\mu$c-) semiconductor materials, and polycrystalline (poly-) semiconductor materials.

Specific examples of such amorphous semiconductor material are a-Si:H, a-Si:H:X, a-SiC:H, a-SiC:H:X, a-SiGe:H, a-SiGe:H:X, a-SiGeC:H, a-SiGeC:H:X, a-SiO:H, a-SiO:H:X, a-SiN:H, a-SiN:H:X, a-SiON:H, a-SiON:H:X, a-SiOCN:H, and a-SiOCN:H:X, which are doped with a p-type or n-type valence electron-controlling agent at a high concentration. The p-type valence electron-controlling agent can include elements belonging to group III of the periodic table such as B, Al, Ga, In, and Tl. The n-type valence electron-controlling agent can include elements belonging to group V of the periodic table such as P, As, Sb, and Bi.

Specific examples of such microcrystalline semiconductor material are μc-Si:H, μc-Si:H:X, μc-SiC:H, μc-SiC:H:X, μc-SiGe:H, μc-SiGe:H:X, μc-SiGeC:H, μc-SiGeC:H:X, μc-SiO:H, μc-SiO:H:X, μc-SiN:H, μc-SiN:H:X, μc-SiON:H, μc-SiON:H:X, μc-SiOCN:H, and μc-SiOCN:H:X, which are doped with a p-type or n-type valence electron-controlling agent at a high concentration. The p-type valence electron-controlling agent can include elements belonging to group III of the periodic table such as B, Al, Ga, In, and Tl. The n-type valence electron-controlling agent can include elements belonging to group V of the periodic table such as P, As, Sb, and Bi.

Specific examples of such polycrystalline semiconductor material are poly-Si:H, poly-Si:H:X, poly-SiC:H, poly-SiC:H:X, poly-SiGe:H, poly-SiGe:H:X, poly-SiGeC:H, poly-SiGeC:H:X, poly-SiO:H, poly-SiO:H:X, poly-SiN:H, poly-SiN:H:X, poly-SiON:H, poly-SiON:H:X, poly-SiOCN:H, poly-SiOCN:H:X, poly-Si, poly-SiC, poly-SiO, and poly-SiN, which are doped with a p-type or n-type valence electron-controlling agent at a high concentration. The p-type valence electron-controlling agent can include elements belonging to group III of the periodic table such as B, Al, Ga, In, and Tl. The n-type valence electron-controlling agent can include elements belonging to group V of the periodic table such as P, As, Sb, and Bi.

The doped layer (the p-type semiconductor layer or the n-type semiconductor layer) positioned on the side from which light is impinged is desired to comprise a crystalline semiconductor layer which is slight in light absorption or an amorphous semiconductor layer having a large band gap.

The non-single crystalline semiconductor material by which the doped layer as the p-type or n-type semiconductor layer is constituted contains hydrogen atoms (H, D) or/and halogen atoms (X). These atoms function to compensate dangling bonds present in the doped layer as the p-type or n-type semiconductor layer whereby facilitating the doping efficiency. For the amount of the hydrogen atoms or/and the halogen atoms contained in the doped layer as the p-type or n-type semiconductor layer, it is preferably in the range of 1 to 40 atomic %. In the case where the doped layer as the p-type or n-type semiconductor layer comprises a crystalline semiconductor layer, it is most preferably in the range of 0.1 to 10 atomic %.

The doped layer as the p-type or n-type semiconductor layer is desired to have such electric characteristics as will be described in the following. The activation energy is preferably 0.2 eV or less, most preferably 0.1 eV or less, and the resistivity is preferably 100 Ωcm or less, most preferably 1 Ωcm or less.

For the thickness of the doped layer as the p-type or n-type semiconductor layer, it is preferably in the range of 1 to 50 nm, most preferably in the range of 3 to 10 nm.

Formation of Semiconductor Layer

The formation of a semiconductor layer constituted by a group IV series non-single crystalline semiconductor material or a group IV alloy series non-single crystalline semiconductor material, which is suitable as the semiconductor layer in the photovoltaic element according to the present invention, may be conducted by a conventional film-forming process.

Preferable examples of such film-forming process are plasma CVD processes with the use of alternate current (AC) or high frequency, such as RF plasma CVD process, and microwave plasma CVD process.

The formation of the semiconductor layer by the microwave plasma CVD process is conducted, for instance, in the following manner. given film-forming raw material gas is introduced into a deposition chamber capable of being vacuumed together with dilution gas if necessary, the gas pressure in the deposition chamber is made constant at a desired value while evacuating the inside of the deposition chamber by means of a vacuuming pump, a microwave power from a microwave power source is introduced into the deposition chamber through a waveguide and a dielectric window (made of alumina ceramics or the like), where plasma is generated in the deposition chamber to decompose the gases introduced therein whereby causing the formation of a desired deposited film as the semiconductor layer on a substrate arranged in the deposition chamber.

According to the microwave plasma CVD process, a deposited film usable in a photovoltaic element can be formed under relatively wide film-forming conditions.

Preferable film-forming conditions for the formation of a semiconductor layer used in the photovoltaic element according to the present invention by the microwave plasma CVD process are 100 to 450° C. for the substrate temperature; 0.5 to 30 mTorr for the inner pressure (the gas pressure) in the deposition chamber; 0.01 to 1 W/cm$^3$ for the wattage of the microwave power; 0.1 to 10 GHz for the oscillation frequency of the microwave power; and 0.05 to 20 nm/sec. for the deposition rate.

The formation of the semiconductor layer by the RF plasma CVD process may be conducted in the same manner as in the above microwave plasma CVD process, except for using an RF power instead of the microwave power.

Preferable film-forming conditions for the formation of a semiconductor layer used in the photovoltaic element according to the present invention by the RF plasma CVD process are 100 to 350° C. for the substrate temperature; 0.1 to 10 Torr for the inner pressure (the gas pressure) in the deposition chamber; 0.001 to 0.5 W/cm$^3$ for the wattage of the RF power; and 0.01 to 3 nm/sec. for the deposition rate.

In the case of forming an i-type semiconductor layer composed of a microcrystalline semiconductor material comprising a group IV element as the principal component by the microwave plasma CVD process, the formation thereof may be conducted, for example, in the manner of using a microwave power with an oscillation frequency of 0.1 to 10 GHz while overlapping an RF high frequency power with an oscillation frequency of 0.1 to 100 MHz. In this case, it is desired to apply a negative bias voltage to the RF high frequency electrode (the cathode electrode) to which the RF high frequency power is applied. In addition, it is possible to use a DC bias voltage by overlapping thereto. It is also possible that the electrode to which the RF high frequency power is applied is used as a common electrode from which the microwave power with an oscillation frequency of 0.1 to 10 GHz is also applied.

It is desired that a bias voltage of preferably −100 V or less, more preferably −200 V or less is applied to the RF high frequency electrode. By this, the surface of a deposited film formed is prevented from being damaged due to positive ion, where an i-type semiconductor layer containing a microcrystalline semiconductor material having such desirable properties as above described can be formed.

In addition, for the ratio of the flow rate of hydrogen gas to the flow rate of a film-forming raw material gas containing the constituent elements of the deposited film, it is desired to be preferably 10 times or more, more preferably 20 times or more. Further, it is desired that the RF high frequency power of a magnitude which is greater than that of the microwave power is applied.

Now, As the film-forming raw material gas used in the formation of a semiconductor layer constituted by a group IV series non-single crystalline semiconductor material or a group IV alloy series non-single crystalline semiconductor material, there can be mentioned silicon-containing compounds which are in the gaseous state at room temperature or can be easily gasified upon the film formation; germanium-containing compounds which are in the gaseous state at room temperature or can be easily gasified upon the film formation; carbon-containing compounds which are in the gaseous state at room temperature or can be easily gasified upon the film formation; and mixtures of these compounds.

Such gaseous or easily gasifiable silicon-containing compound can include chain silane compounds and cyclic silane compounds. Specific examples are $SiH_4$, $Si_2H_6$, $SiF_4$, $SiFH_3$, $SiF_2H_2$, $SiF_3H$, $Si_3H_8$, $SiD_4$, $SiHD_3$, $SiH_2D_2$, $SiH_3D$, $SiFD_3$, $SiF_2D_2$, $Si_2D_3H_3$, $(SiF_2)_5$, $(SiF_2)_6$, $(SiF_2)_4$, $Si_2F_6$, $Si_3F_8$, $Si_2H_2F_4$, $Si_2H_3F_3$, $SiCl_4$, $(SiCl_2)_5$, $SiBr_4$, $(SiBr_2)_5$, $Si_2Cl_6$, $SiHCl_3$, $SiH_2Br_2$, $SiH_2Cl_2$, and $Si_2Cl_3F_3$.

Specific examples of such gaseous or easily gasifiable germanium-containing compound are $GeH_4$, $GeD_4$, $GeF_4$, $GeFH_3$, $GeF_2H_2$, $GeF_3H$, $GeHD_3$, $GeH_2D_2$, $GeH_3D$, $Ge_2H_6$, and $Ge_2D_6$.

Specific examples of such gaseous or easily gasifiable carbon-containing compound are $CH_4$, $CD_4$, $C_nH_{2n+2}$ (with n being an integer), $C_nH_{2n}$ (with n being an integer), $C_2H_2$, $C_6H_6$, $CO_2$, and CO.

Besides these film-forming raw materials, if necessary, it is possible to additionally use a gaseous or easily gasifiable nitrogen-containing compound or a gaseous or easily gasifiable oxygen-containing compound.

Specific examples of such nitrogen-containing compound are $N_2$, $NH_3$, $ND_3$, NO, $NO_2$, and $N_2O$. Specific examples of such oxygen-containing compound are $O_2$, CO, $CO_2$, NO, $NO_2$, $N_2O$, $CH_3CH_2OH$, $CH_3OH$, and $H_2O$.

As previously described, the valence electron-controlling agent contained in the doped layer as the p-type or n-type semiconductor layer includes group III elements and group V elements.

In order to incorporate such group III or V element as the valence electron-controlling agent, there is an appropriate compound capable of supplying a group III or V element which is in the gaseous state at room temperature or can be easily gasified upon the film formation.

Specific examples of such group III element-supplying gaseous or easily gasifiable compound are boron hydrides such as $B_2H_6$, $B_4H_{10}$, $B_5H_9$, $B_5H_{11}$, $B_6H_{10}$, $B_6H_{12}$, and $B_6H_{14}$; and boron halides such as $BF_3$, $BCl_3$, and $BBr_3$. Besides, $AlCl_3$, $GaCl_3$, $InCl_3$, and $TlCl_3$ are also usable. Of these, $B_2H_6$ and $BF_3$ are particularly appropriate.

Specific examples of such group V element-supplying gaseous or easily gasifiable compound are phosphorous hydrides such as $PH_3$ and $P_2H_4$; and phosphorous halides such as $PH_4I$, $PF_3$, $PF_5$, $PCl_3$, $PCl_5$, $PBr_3$, $PBr_5$, and $PI_3$. Besides, $AsH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$, and $BiBr_3$ are also usable. Of these, $PH_3$ and $PF_3$ are particularly appropriate.

Any of the above mentioned raw materials may be diluted with adequate gas such as $H_2$ gas, inert gas of He, Ne, Ar, Xe, or Kr, or a mixture of these gases, if necessary, upon the introduction thereof into the deposition chamber upon the film formation.

Particularly in the case of forming a semiconductor layer composed of a microcrystalline semiconductor material, a polycrystalline semiconductor material or an a-SiC:H semiconductor material, which have a small light absorption coefficient or a large band gap, by the microwave plasma CVD process or the RF plasma CVD process, it is preferred that the foregoing raw material in the gaseous state is introduced into the deposition chamber while being diluted with $H_2$ gas and a microwave power or an RF power is introduced into the deposition chamber at a relatively high wattage upon the formation of the semiconductor layer.

Formation of Doped Layer

The doped layer as a principal feature of the present invention, which is composed of a non-single crystalline semiconductor material principally comprising a group IV element and contains a plurality of group IV element low density regions (that is, a plurality of regions having a diminished density of the group IV element as the principal constituent of the doped layer) such that they are intermittently distributed in the doped layer, may be formed basically by using the foregoing manner of forming the semiconductor layer, except for the following points. That is, at least the following two film-forming conditions are important to be adequately controlled.

Condition (1): bias voltage applied to a high frequency electrode (a cathode electrode) against a substrate for film formation, and Condition (2): dilution ratio of a film-forming raw material gas diluted by hydrogen gas ($H_2$ gas).

Preferable ranges of these conditions are different depending upon the film-forming process employed and therefore, it is difficult for them to be generalized.

Herein, description will be made of an example in the case where the RF plasma CVD process using an oscillation frequency of 13.56 MHz is used and an example in the case where the microwave plasma CVD process using an oscillation frequency of 2.45 GHz is used.

For the condition (1), the bias voltage applied to the high frequency electrode (the cathode electrode) is necessary to be made such that a positive bias voltage is applied to the electrode, where positive ion is incided to the substrate, resulting in causing the formation of the doped layer of the present invention.

For the self-bias voltage of the high frequency electrode (the cathode electrode), it is appeared as a negative voltage. For the reason for this, it is considered such that because the surface area of the high frequency electrode (the cathode electrode) is usually small, electrons having large mobility which can follow the oscillation frequency of a high frequency power will be charged up to the high frequency electrode.

However, in the present invention, for instance, the area of forming a sheath by contacting with plasma on the surface of the high frequency electrode (the cathode electrode) is made to be greater than the area of forming a sheath by contacting with plasma on an electrically grounded portion such as the inner face of deposition chamber. By this, a positive self-bias voltage is applied to the high frequency electrode (the cathode electrode). Hence, when the substrate is electrically grounded, a positive bias voltage against the substrate is applied to the high frequency electrode (the cathode electrode).

In the present invention, the positive bias voltage of the high frequency electrode (the cathode electrode) against the substrate is made to be preferably 100 V or more, more preferably 130 V or more in the case of using the RF plasma CVD process with the use of a high frequency power with an oscillation frequency of 13.56 MHz. The value of the positive bias voltage of the high frequency electrode (the cathode electrode) against the substrate herein is greatly governed by the magnitude of the RF power applied and the gas pressure upon the film formation, in addition to the ratio of the surface area of the high frequency electrode (the cathode electrode). Besides, it is varied also depending upon the kind of film-forming raw material gas used and the mixing ratio of raw material gases used. Therefore, it is necessary to properly adjust these factors so that the bias voltage in the foregoing range can be provided.

To make the high frequency electrode (the cathode electrode) have the positive bias voltage against the substrate as above described may conducted also by a manner of overlapping a positive DC voltage to the high frequency electrode (the cathode electrode) or a manner of electrically floating the substrate and overlapping a negative DC voltage on the substrate side.

Separately, in the case where the oscillation frequency of the high frequency power is great, particularly, for instance, in the case of using the microwave plasma CVD with the use of a microwave power with an oscillation frequency of 2.45 GHz, it is preferred to introduce the microwave power through a microwave transmissive window made of a dielectric material in the deposition chamber rather than to use the high frequency electrode (the cathode electrode), and therefore, it is desired that by electrically floating the substrate and overlapping a negative DC voltage to the substrate side, or by arranging an electrode capable of applying a bias voltage of DC or RF in a space where microwave plasma is generated, the system is adjusted so that a desired positive bias voltage against the substrate is applied to the corresponding electrode.

The foregoing condition (2) of the dilution ratio by the hydrogen gas is of a ratio of the flow rate of the hydrogen gas to the flow rate of a film-forming raw material gas containing the constituent elements of a deposited film formed (this ratio will be hereinafter referred to as hydrogen dilution ratio). The preferable range thereof is different depending upon the kind of a deposited film formed. For instance, in the case of using the RF plasma CVD process with the use of a high frequency power with an oscillation frequency of 13.56 MHz, in general, it is preferably 100 times or more, more preferably 200 times or more. In this case, the resulting deposited film will sometimes contain a microcrystalline material.

For the upper limit of the hydrogen dilution ratio, it is difficult to be generalized since it is different depending upon the kind of the film-forming raw material gas. For instance, the hydrogen dilution ratio in the case of forming a non-single crystalline silicon deposited film containing boron is desired to be higher than that in the case of forming a non-single crystalline silicon deposited film containing phosphorous.

In addition, for instance, in the case of using the microwave plasma CVD process with the use of a microwave power with an oscillation frequency of 2.45 GHz, the preferable range of the hydrogen dilution ratio is also different depending upon the kind of a deposited film formed. However, in general, it is preferably 20 times or more, more preferably 30 times or more. In this case, the resulting deposited film will sometimes contain a microcrystalline material.

As above described, by adjusting at least each of the condition (1) (the bias voltage against the substrate) and the condition (2) (the hydrogen dilution ratio), among others, to such preferable range as above described, it is possible to form a doped layer of the present invention which is composed of a non-single crystalline semiconductor material principally comprising a group IV element and contains a plurality of group IV element low density regions (that is, a plurality of regions having a diminished density of the group IV element as the principal constituent of the doped layer) such that they are intermittently distributed in the doped layer.

The mechanism why the above doped layer is formed is not clear enough at the present time. However, it is considered such that in the case where the foregoing condition (1) (the bias voltage against the substrate) is adjusted as above described by making the bias voltage of the cathode electrode against the substrate to be positive or relatively making the bias voltage of the substrate to be negative and also the foregoing condition (2) (the hydrogen dilution ratio) is adjusted as above described, at least positive ion of hydrogen, positive ion of the band gap-enlarging element, or positive ion of the valence electron-controlling element is accelerated to the substrate at an adequate energy, whereby a plurality of regions having a diminished density of the group IV element as the principal constituent of the doped layer are intermittently formed in the doped layer.

Now, in the case of producing a photovoltaic module or panel using a photovoltaic element according to the present invention, the production thereof may be conducted, for example, in the following manner.

There are provided a plurality of photovoltaic elements according to the present invention, and they are integrated in series connection or in parallel connection depending upon a desired outputting voltage or outputting electric current. A protective member is disposed on each of the surface and the back face of the integrated body obtained and a pair of power outputting terminals are fixed to the resultant. It is possible to dispose the integrated body on an insulating member. For the integrated body in series connection, an appropriate reversecurrent preventive diode may be installed therein.

Figure 7:
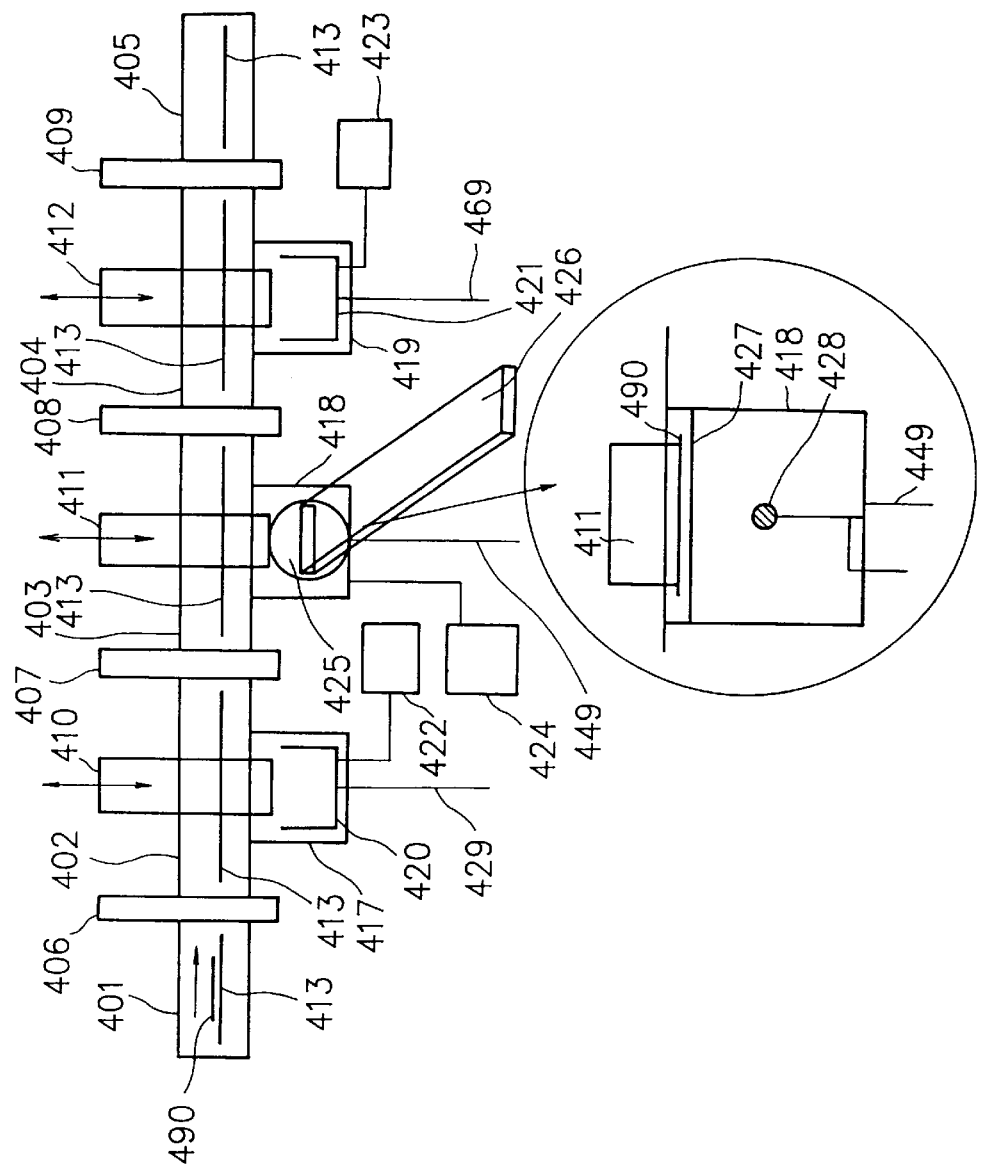
FIG. 7 is a schematic diagram illustrating an example of a film-forming apparatus suitable for the formation of a semiconductor layer of a photovoltaic element according to the present invention.
Figure 9:
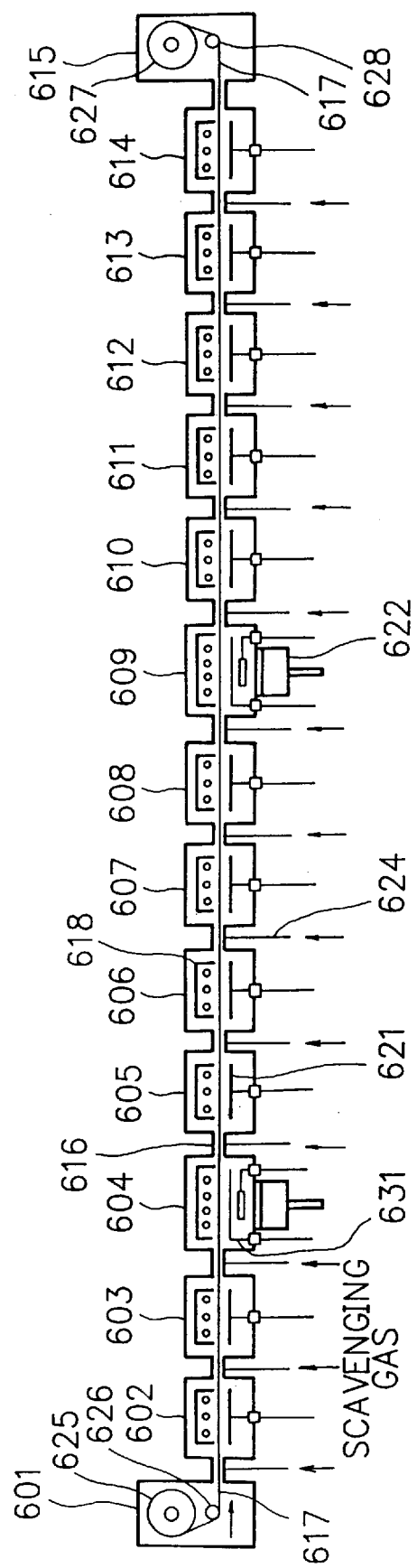
FIG. 9 is a schematic diagram illustrating a continuous film-forming apparatus suitable for the production of a photovoltaic element by way of roll-to-roll system.
Figure 9:
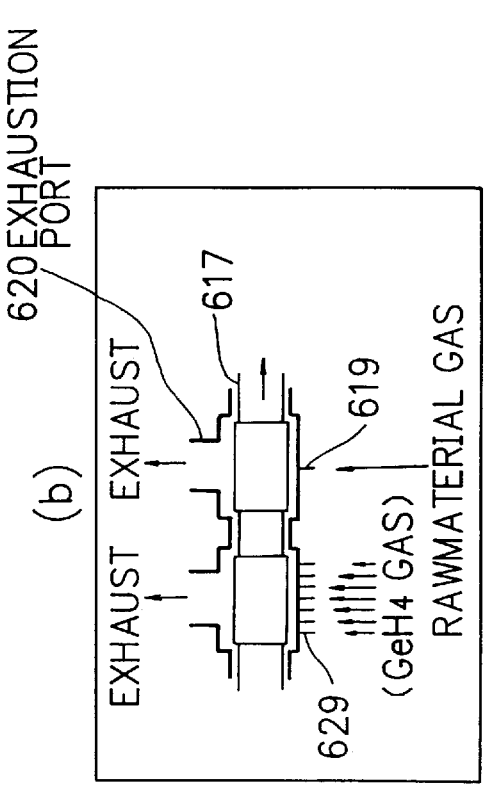

The production of a photovoltaic element according to the present invention may be conducted, for instance, by using a film-forming apparatus of the constitution shown in FIG. 7 or FIG. 9 (FIGS. 9(a) and 9(b)).

The film-forming apparatus shown in FIG. 7 is suitable for the production of a photovoltaic element having a relatively small area according to the present invention.

The film-forming apparatus shown in FIG. 7 basically comprises transportation chambers 401, 402, 403, 404 and 405 which are communicated with each other wherein the transportation chamber 401 serves as a load rock chamber and the transportation chamber 405 serves as an unload chamber; three deposition chambers 417, 418 and 419 for the formation of a semiconductor layer which are provided respectively under the transportation chambers 402, 403 and 404; gate valves 406, 407, 408 and 409; substrate temperature-controlling means 410, 411 and 412; RF power introduction cups 420 and 421 (or RF high frequency electrodes or cathode electrodes) respectively electrically connected to an RF power source 422 or 423; microwave introduction means comprising a microwave introduction window 425 and a waveguide 426 (connected to the microwave introduction window 425) extending from a microwave power source (not shown); raw material gas supply pipes 429, 449 and 469 respectively extending from a raw material gas supply system including gas reservoirs, stop valves, mass flow controllers, and the like (not shown); and exhaustion ports (not shown) respectively connected a vacuuming means (not shown) through an exhaust pipe provided with a conductance valve (not shown).

Each of the deposition chambers 417, 418 and 419 serves to form a given semiconductor layer. Particularly, in the deposition chamber 417, an n-type semiconductor layer is formed by an RF plasma CVD process; in the deposition chamber 418, an i-type semiconductor layer is formed by a microwave (MW) plasma CVD process; and in the deposition chamber 419, a p-type semiconductor layer is formed by an RF plasma CVD process.

Reference numeral 413 indicates a transportation rail, and reference numeral 490 a substrate holder. Reference numeral 424 indicates an RF power source electrically connected to the deposition chamber 418.

The figure shown in a circle of FIG. 7 is an enlarged view of the inside of the deposition chamber 418. In the deposition chamber 418, in addition to a microwave power introduced through the microwave introduction window 425, a bias power of RF or/and DC is introduced through a bias power introduction electrode 428 which is electrically connected to a bias power source.

Each of the RF high frequency electrodes 420 and 421 (the RF power introduction cups) is designed to have a large surface area in contact with plasma (which is greater than that of the conventional RF high frequency electrode) so that the doped layer of the present invention can be formed.

The film-forming apparatus shown in FIG. 9 is suitable for continuously producing a photovoltaic element according to the present invention. The film-forming apparatus shown in FIG. 9 is to conduct a so-called roll-to-roll film-forming process of continuously forming a plurality of semiconductor layers while stacking them on a long substrate web while moving the substrate web to pass through a plurality of semiconductor layer-forming chambers. This roll-to-roll film-forming process is effective in improving the uniformity of mass-producing a photovoltaic element while improving the uniformity of a deposited film formed at a reasonable cost.

Herein, description will made of the film-forming apparatus shown in FIGS. 9(a) and 9(b). FIG. 9(a) is a schematic diagram illustrating the constitution of the film-forming apparatus. FIG. 9(b) is a schematic view of the multi-chambered arrangement in the film-forming apparatus shown in FIG. 9(a), viewed from above the multi-chambered arrangement.

The film-forming apparatus shown in FIGS. 9(a) and 9(b) comprises a substrate pay-out chamber 601 containing a pay-out reel 625 having a substrate web 617 wound thereon, a plurality of deposition chambers 602–614, and a substrate take-up chamber 615 containing a take-up reel 627 for taking up the substrate web 617 transported. Each adjacent chambers are isolated by an isolation passage 616. Each chamber is provided with an exhaust port extending from a vacuuming means so that the inside of the chamber can be vacuumed.

The substrate web 617 paid out from the pay-out reel 625 in the substrate pay-out chamber 601 is transported while being guided by a guide roller 626 into the deposition chamber 602 through the isolation passage 616. In this way, the substrate web 617 is transported into the successive chambers 603–614, and it is finally taken up and wound on the take-up reel 627 in the take-up chamber 615. The film-forming apparatus is structured such that a desired raw material gas is introduced into the respective deposition chambers while flowing a scavenging gas into the respective isolation passage 616, where film formation in each deposition chamber can be independently conducted without influencing to adjacent deposition chambers.

Each of the deposition chambers 602–614 is provided with a halogen lump heater 618 for heating the substrate web 617 at a desired temperature suitable for the formation of a deposited film therein. Each of the deposition chambers 602–614 is provided with a raw material gas introduction port 619 extending from a raw material gas supply system (not shown) and an exhaust port 620 connected to a vacuuming pump such as oil diffusion pump, mechanical booster pump or the like.

Each of the deposition chambers 602–603, 605–608, and 610–614 is provided with a RF power introduction electrode 621 electrically connected to a RF power source (not shown).

Each of the deposition chambers 604 and 609 is provided with a microwave applicator 622 extending from a microwave power source (not shown) and a RF bias electrode 631 electrically connected to a RF power source (not shown).

Each isolation passage 616 is provided with an inlet port 624 for flowing a scavenging gas thereinto. The pay-out chamber 601 is provided with the guide roller 626 for delivering the substrate web paid out from the pay-out reel 625 toward the take-up chamber 615 while passing through the respective deposition chambers. The take-up chamber 615 is provided with a guide roller 628 for maintaining the substrate web 617 in a horizontal state with an adequate tensile force.

In the following, the present invention will be described in more detail with reference to examples. It should be understood that the present invention is not limited to these examples.

EXAMPLE 1

In this example, there was prepared a photovoltaic element of the configuration shown in FIG. 1 using the film-forming apparatus shown in FIG. 7.

As previously described, the film-forming apparatus shown in FIG. 7 is provided with the load rock chamber 401 and the unload chamber 405. In this film-forming apparatus, a substrate on which a deposited film is to be formed is transported from the load rock chamber 401 toward the unload chamber 405 under reduced pressure condition while passing through the deposition chambers 417, 418 and 419, where a deposited film is formed on the substrate in each deposition chamber. In this film-forming apparatus, the microwave plasma CVD process and the RF plasma CVD process can be conducted, as previously described. In this example, the formation of semiconductor layers was conducted using this film-forming apparatus.

The previously described raw material gas supply system (not shown in the figure) from which the raw material gas supply pipes 429, 449 and 469 are extending includes a plurality of gas reservoirs (not shown in the figure) each containing a given raw material gas having a ultra-high purity, stop valves, and mass flow controllers (these are not shown in the figure). These gas reservoirs are a gas reservoir containing $SiH_4$ gas; a gas reservoir containing $SiF_4$ gas; a gas reservoir containing $CH_4$ gas; a gas reservoir containing $GeH_4$ gas; a gas reservoir containing $GeF_4$ gas; a gas reservoir containing $Si_2H_6$ gas; a gas reservoir containing $PH_3/H_2$ gas ($PH_3$ gas diluted with $H_2$ gas to a concentration of 2%); a gas reservoir containing $BF_3/H_2$ gas ($BF_3$ gas diluted with $H_2$ gas to a concentration of 2%); a gas reservoir containing $H_2$ gas; a gas reservoir containing He gas; and a gas reservoir containing $SiH_4/H_2$ gas ($SiH_4$ gas diluted with $H_2$ gas to a concentration to 10%).

The photovoltaic element was prepared by sequentially conducting the following steps.

Step (1): substrate 101 is provided;
Step (2): back face electrode layer 102 is formed;
Step (3): transparent and electrically conductive layer 103 is formed;
Step (4): n-type semiconductor layer 104 is formed;
Step (5): i-type semiconductor layer 105 (substantially intrinsic layer) is formed;
Step (6): p-type semiconductor layer 106 is formed;
Step (7): transparent electrode layer 107 is formed; and
Step (8): collecting electrode 108 is formed.

In the step (4), as the n-type semiconductor layer 104, there was formed a three-layered n-type semiconductor layer comprising (i) a first n-type semiconductor layer (comprising an n-type hydrogenated amorphous silicon (a-Si:H) layer), (ii) a second n-type semiconductor layer (comprising an n-type microcrystalline silicon ($\mu$c-Si) semiconductor layer), and (iii) a third n-type semiconductor layer (comprising an n-type hydrogenated amorphous silicon (a-Si:H) layer) being stacked in the named order, wherein the n-type semiconductor layer 104 comprising the three-layered n-type semiconductor layer contains a plurality of silicon low density regions having various dimensions such that they are intermittently distributed therein.

The steps (4) to (6) were conducted using the above described film-forming apparatus shown in FIG. 7.

Each of the steps (1) to (8) was conducted as will be described below.

Step (1):

A plate made of stainless steel (SUS430BA) having a thickness of 0.5 mm and a size of 50 mm×50 mm was subjected to ultrasonic cleaning using acetone and isopropanol, followed by warm air drying. By this, there was provided a stainless steel substrate having a well cleaned surface as the substrate 101.

Step (2):

A 0.3 $\mu$m thick Ag film as the back face electrode layer 102 was formed on the surface of the substrate 101 by a conventional DC magnetron sputtering process at room temperature.

Step (3):

On the Ag film as the back face electrode layer 102, a 1.0 $\mu$m thick ZnO film as the transparent and electrically conductive layer 103 was formed by a conventional magnetron sputtering process under condition of 350° C. for the substrate temperature.

Step (4):

The substrate 101 having the back face electrode layer 102 and the transparent and electrically conductive layer 103 formed thereon was introduced into the film-forming apparatus shown in FIG. 7, where as the n-type semiconductor layer 104, there were sequentially formed (i) a 20 nm thick n-type hydrogenated amorphous silicon (a-Si:H) layer (this layer will be hereinafter referred to as "first n-type semiconductor layer");
(ii) a 30 nm thick n-type microcrystalline silicon ($\mu$c-Si) semiconductor layer (this layer will be hereinafter referred to as "second n-type semiconductor layer"); and
(iii) a 10 nm thick n-type hydrogenated amorphous silicon (a-Si:H) layer (this layer will be hereinafter referred to as "third n-type semiconductor layer"), as will be described below.

First, all the transportation systems and deposition chambers of the film-forming apparatus shown in FIG. 7 were evacuated to a relatively high vacuum.

The above substrate 101 was fixed to the rear face of the substrate holder 490, followed by introducing into the load rock chamber 401, where the substrate holder 490 was positioned on the transportation rail 413. The inside of the load rock chamber 401 was evacuated to a vacuum degree of about $1\times10^{-5}$ Torr by means of a vacuuming means (not shown). $H_2$ gas was flown into both the load rock chamber and the transportation chamber 402 including the deposition chamber 417 to make the inner pressure of the load rock chamber and that of the transportation chamber to be substantially the same.

Then, the gate valve 406 was opened, and the substrate holder 490 having the substrate 101 was moved into the transportation chamber 402 including the deposition chamber 417. The gate valve 406 was closed. Then, the substrate holder 490 having the substrate 101 was moved to position under the substrate temperature controlling means 410 of the deposition chamber 417. The substrate temperature controlling means 410 was descended to start heating the substrate 101.

Formation of the First n-type Semiconductor Layer:

$H_2$ gas from the raw material gas supply system was introduced into the deposition chamber 417 through the gas supply pipe 429, where the flow rate of the $H_2$ gas was controlled to 50 sccm by means of the corresponding mass flow controller (not shown) while regulating the corresponding valve (not shown). The inner pressure in the deposition chamber 417 was adjusted to 1.2 Torr by regulating the opening of the conductance valve (not shown). The temperature of the substrate 101 was controlled to and maintained at 350° C. by means of the substrate temperature controlling means. Thereafter, while continuing the introduction of the $H_2$ gas at the flow rate of 50 sccm into the deposition chamber 417, the corresponding valves (not shown) of the raw material gas supply system (not shown) were opened to introduce $SiH_4$ gas and $PH_3/H_2$ gas into the deposition chamber 417 through the raw material gas supply pipe 429 while controlling their flow rates to 2 sccm and 0.5 sccm by means of the corresponding mass flow controllers (not shown) and by regulating the corresponding valves (not shown).

Then, the inner pressure of the deposition chamber 417 was controlled to and maintained at 1.2 Torr. Thereafter, the RF power source 422 was switched on to apply a RF power of 5 mW/cm$^3$ into the deposition chamber 417 through the RF power introduction cup 420, where glow discharge was caused to form a 20 nm thick n-type a-Si semiconductor film as the first n-type semiconductor layer on the ZnO film as the transparent and electrically conductive layer 103.

In the above, the substrate 101 was electrically grounded, and the RF power introduction cup 420 as the RF electrode had a self-bias voltage of +13 V.

Formation of the Second n-type Semiconductor Layer:

Using the same deposition chamber 417 used in the formation of the first n-type a-Si layer, the procedures of forming the first n-type a-Si layer were repeated under the conditions shown in the column "Ex. 1-1" of Table 1 where the SiH4 gas used in the formation of the first n-type a-Si layer was replaced by $SiH_4/H_2$ gas (the concentration of the $SiH_4$ gas diluted with the $H_2$ gas: 10%) and the ratio of the flow rate of the $PH_3/H_2$ gas to that of the $SiH_4/H_2$ gas was controlled to be 1/4, and the inner pressure (the gas pressure) of the deposition chamber was controlled to 1.0 Torr, whereby a 30 nm thick n-type microcrystalline silicon ($\mu c$-Si) semiconductor film as the second n-type semiconductor layer was formed on the first n-type semiconductor layer.

Formation of the Third n-type Semiconductor Layer:

Using the same deposition chamber 417 used in the formation of the first n-type a-Si layer, the procedures of forming the first n-type a-Si layer were repeated to form a 10 nm thick n-type a-Si semiconductor film as the third n-type semiconductor layer on the second n-type semiconductor layer.

In this way, the formation of the n-type semiconductor layer 104 on the transparent and electrically conductive layer 103 was completed.

After the formation of the n-type semiconductor layer 104, the introduction of the $SiH_4$ gas and $PH_3/H_2$ gas into the deposition chamber 417 and the application of the RF power to the RF electrode were terminated, where the introduction of the $H_2$ gas into the deposition chamber was continued for 5 minutes. Thereafter, the introduction of the $H_2$ gas was terminated. And the inside of the transportation chamber 402 including the deposition chamber 417 and the insides of the gas pipe ways were evacuated to a vacuum of about $1 \times 10^{-5}$ Torr.

Now, separately, there was formed a three-layered n-type semiconductor layer (as the n-type semiconductor layer 104) comprising a first n-type semiconductor layer comprising an n-type hydrogenated amorphous silicon (a-Si:H) layer), a second n-type semiconductor layer (comprising an n-type microcrystalline silicon ($\mu c$-Si) semiconductor layer), and a third n-type semiconductor layer (comprising an n-type hydrogenated amorphous silicon (a-Si:H) layer) being stacked in the named order on a stainless steel substrate by repeating the foregoing procedures for the formation of the n-type semiconductor layer 104.

And for the resultant sample, its cross section obtained by cutting in the direction perpendicular to the substrate was examined by means of TEM (transmission electron microscope). As a result, it was found that the three layered n-type semiconductor layer contains a plurality of silicon lower density regions having various dimensions such that they are intermittently distributed therein.

And for these silicon low density regions, the average height "d" in the layer thickness direction and the average diameter "L" in the direction parallel to the surface of the substrate were found as shown in the column "Ex. 1-1 of Table 1.

In addition, the inside of each of the silicon low density regions was found to comprise an amorphous silicon material.

Step (5):

As the i-type semiconductor layer 105, a 400 nm thick i-type a-Si semiconductor film was formed by a microwave plasma CVD process as will be described below.

The substrate controlling means 410 was lifted. The gate valve 407 was opened, and the substrate holder 490 having the substrate 101 was moved into the transportation chamber 403 including the deposition chamber 418 which had been previously evacuated as above described. The gate valve 407 was closed.

The substrate holder 490 having the substrate 101 was moved to position under the substrate temperature controlling means 411 of the deposition chamber 418. The substrate temperature controlling means 411 was descended to start heating the substrate 101. The inside of the deposition chamber 418 was evacuated to a vacuum of about $1 \times 10^{-5}$ Torr by means of a vacuuming means (not shown). Then, the temperature of the substrate was controlled to and maintained at 350° C. by means of the substrate temperature controlling means 411. Thereafter, the corresponding valves (not shown) of the raw material gas supply system (not shown) were opened to introduce $SiH_4$ gas and $H_2$ gas into the deposition chamber 418 through the raw material gas supply pipe 449 while controlling their flow rates to 50 sccm and 100 sccm by means of the corresponding mass flow controllers (not shown) and by regulating the corresponding valves (not shown). The inner pressure (the gas pressure) of the deposition chamber 418 was controlled to and maintained at a vacuum of 5 mTorr by regulating the opening of the conductance valve (not shown).

While maintaining a shutter 427 of the deposition chamber 418 in a closed state, the RF power source 424 was switched on to impress an RF power of 0.5 W/cm³ to the RF bias power introduction electrode 428. Then, the microwave power source (not shown) was switched on to apply a microwave power of 0.2 W/cm³ into the deposition chamber 418 through the waveguide 426 and the microwave introduction window 425, where glow discharge was generated to produce plasma in the deposition chamber 418. When the plasma became stable, the shutter 427 was opened to cause the formation of a 400 nm thick i-type a-Si semiconductor film as the i-type semiconductor layer 105 on the n-type semiconductor layer 104.

After the formation of the i-type semiconductor layer 105, the introduction of the $SiH_4$ gas into the deposition chamber 418, the application of the RF power and the application of the microwave power were terminated, where the introduction of the $H_2$ gas into the deposition chamber was continued for 2 minutes. Thereafter, the introduction of the $H_2$ gas was terminated. And the inside of the transportation chamber 403 including the deposition chamber 418 and the insides of the gas pipe ways were evacuated to a vacuum of about $1 \times 10^{-5}$ Torr.

Step (6):

As the p-type semiconductor layer 106, a 10 nm thick p-type $\mu c$-Si semiconductor film was formed as will be described below.

The substrate controlling means 411 was lifted. The gate valve 408 was opened, and the substrate holder 490 having the substrate 101 was moved into the transportation chamber 404 including the deposition chamber 419 which had been previously evacuated as above described. The gate valve 408 was closed.

The substrate holder 490 having the substrate 101 was moved to position under the substrate temperature controlling means 412 of the deposition chamber 419. The substrate temperature controlling means 412 was descended to start controlling the temperature of the substrate 101. The inside of the deposition chamber 419 was evacuated to a vacuum of about $1 \times 10^{-5}$ Torr by means of a vacuuming means (not shown). Then, the temperature of the substrate was controlled to and maintained at 230° C. by means of the substrate temperature controlling means 412. Thereafter, the corresponding valves (not shown) of the raw material gas supply system (not shown) were opened to introduce $SiH_4$ gas, $H_2$ gas and $BF_3/H_2$ gas into the deposition chamber 419 through the raw material gas supply pipe 469 while controlling their flow rates to 0.2 sccm, 35 sccm and 0.5 sccm by means of the corresponding mass flow controllers (not shown) and by regulating the corresponding valves (not shown). The inner pressure (the gas pressure) of the deposition chamber 419 was controlled to and maintained at a vacuum of 2.0 Torr by regulating the opening of the conductance valve (not shown).

Thereafter, the RF power source 423 was switched on to apply an RF power of 65 mW/cm$^3$ into the deposition chamber 419 through the RF power introduction cup 421, where glow discharge was generated to form a 10 nm thick p-type μc-Si semiconductor film as the p-type semiconductor layer 106 on the i-type semiconductor layer 105.

In the above, the substrate 101 was electrically grounded, and the RF power introduction cup 426 as the RF electrode had a self-bias voltage of +72 V.

After the formation of the p-type semiconductor layer 106, the introduction of the SiH$_4$ gas and BF$_3$/H$_2$ gas into the deposition chamber 419 and the application of the RF power to the RF electrode were terminated, where the introduction of the H$_2$ gas into the deposition chamber was continued for 3 minutes. Thereafter, the introduction of the H$_2$ gas was terminated. And the inside of the transportation chamber 404 including the deposition chamber 419 and the insides of the gas pipe ways were evacuated to a vacuum of about $1 \times 10^{-5}$ Torr.

After this, the substrate temperature controlling means 412 was lifted. H$_2$ gas was flown into the both the transportation chamber 404 including the deposition chamber 419 and the unload chamber 405 which had been previously evacuated to make their inner pressures to be substantially the same. Then, the gate valve 409 was opened, and the substrate holder 490 having the substrate 101 (having the back face electrode layer 102, the transparent and electrically conductive layer 103, and the n-type, i-type and p-type semiconductor layers 104, 105 and 106 formed thereon) was moved into the unload chamber 405. The gate valve 409 was closed, and the substrate was taken out from the unload chamber 405.

Now, separately, there was formed a p-type semiconductor layer (as the p-type semiconductor layer 106) comprising a 10 nm thick p-type μc-Si semiconductor film on a stainless steel substrate by repeating the foregoing procedures for the formation of the p-type semiconductor layer 106.

And for the resultant sample, its cross section obtained by cutting in the direction perpendicular to the substrate was examined by means of TEM (transmission electron microscope). As a result, it was found that the p-type semiconductor layer contains a plurality of silicon lower density regions of about 2 nm in each of the "d" and the "L" such that they are intermittently distributed therein.

Step (7):

A patterning mask having 25 perforations having an area of 0.25 cm$^2$ was superposed on the surface of the p-type semiconductor layer of the resultant obtained in the step (6), followed by forming a 70 nm thick ITO (In$_2$O$_3$+SnO$_2$) film as the transparent electrode layer 107 by means of a conventional resistance heating vacuum deposition process.

Step (8):

A patterning mask having a comb-shaped opening was superposed on the surface of the transparent electrode layer 107 formed in the step (7), followed by forming a comb-shaped collecting electrode (having such configuration as shown in FIG. 8) comprising Cr (40 nm)/Ag (1000 nm)/Cr (40 nm) as the collecting electrode 108 by means of a conventional electron beam vacuum deposition process.

By this, there was obtained a photovoltaic element having the configuration shown in FIG. 1. This photovoltaic element was made to be Sample Ex. 1-1 (see, Table 1).

The procedures of preparing the Sample Ex. 1-1 were repeated, except that the conditions for the formation of the second μc-Si n-type semiconductor layer were changed as shown in the column Ex. 1-2, Ex. 1-3, Ex. 1-4, or Ex. 1-5 of Table 1, to obtain four photovoltaic elements as Samples Ex. 1-2 to Ex. 1-5 (see, Table 1).

For each of these five samples, there were prepared a plurality of photovoltaic elements.

Each of the resultant samples was subjected to irradiation of pseudo sunlight (AM 1.5) with an intensity of 100 mW/cm$^2$ under environmental condition of 25° C. to measure its V-I characteristics, whereby its open-circuit voltage (Voc), short-circuit current (Jsc), fill factor (F.F.), and photoelectric conversion efficiency (η) were obtained.

Figure 5:
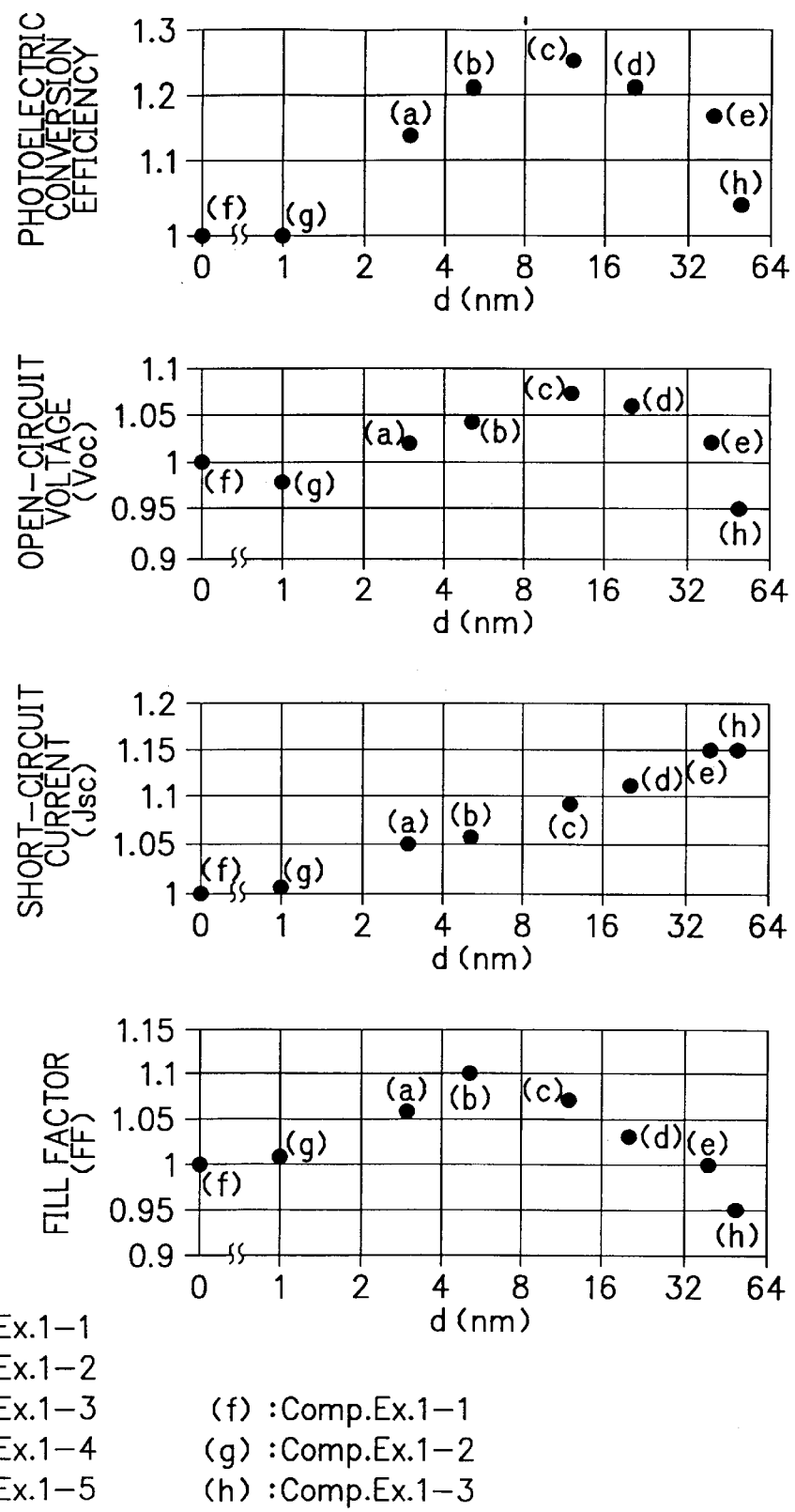
FIG. 5 shows graphs of photoelectric conversion efficiencies, open-circuit voltages (Voc), short-circuit currents (Jsc), and fill factors (F.F.) of photovoltaic elements obtained in Example 1 which will be described later, wherein the abscissa is of the average height [d (nm)] of the group IV element low density regions.

The measured results are graphically shown in FIG. 5. The values shown in FIG. 5 are values relative to those of Sample Comp. Ex. 1-1 obtained in Comparative Example 1 (which will be later described), which are respectively set at 1.

In addition, for each of the above five samples, the yield (that is, the yield in the mass-production of a photovoltaic element) was evaluated. The evaluation of the yield herein was conducted in a manner in which 100 photovoltaic elements of 0.25 cm$^2$ in size for each sample are produced, the proportion of the photovoltaic elements having a shunt resistance of more than $5 \times 10^4 \Omega/cm^2$ is examined, and the resultant proportion is made to be a yield. The results obtained are collectively shown in Table 1.

COMPARATIVE EXAMPLE 1

The procedures of preparing the photovoltaic element sample Ex. 1-1 in Example 1 were repeated, except that the conditions of forming the μc-Si n-type semiconductor layer in the step (4) were changed as shown in Table 2, to obtain three kinds of photovoltaic element samples (Comp. Ex. 1-1 to Comp. Ex. 1-3). The n-type semiconductor 104 of each of the Comp. Ex. 1-1 and Comp. Ex. 1-2 was found to substantially comprise an amorphous silicon semiconductor material as a whole. And in the case of the Comp. Ex. 1-1, no silicon low density region was observed.

Each of the resultant these samples was subjected to irradiation of pseudo sunlight (AM 1.5) with an intensity of 100 mW/cm$^2$ under environmental condition of 25° C. to measure its V-I characteristics, whereby its open-circuit voltage (Voc), short-circuit current (Jsc), fill factor (F.F.), and photoelectric conversion efficiency (η)) were obtained.

The measured results are graphically shown in FIG. 5. The values shown in FIG. 5 are values relative to those of Sample Comp. Ex. 1-1, which are respectively set at 1.

In addition, for each of the above three samples, its yield was examined in the same manner as in Example 1. The results obtained are collectively shown in Table 2.

EXAMPLE 2

The procedures of preparing the photovoltaic element sample Ex. 1-3 in Example 1 were repeated, except that the conditions of forming the μc-Si p-type semiconductor layer 106 in the step (6) were changed as shown in Table 3, to obtain two kinds of photovoltaic element samples (Ex. 2-1 and Ex. 2-2).

Particularly, in each case shown in Table 3, instead of the SiH4 gas used in Example 1, there was used SiH$_4$/H$_2$ gas (that is, SiH$_4$ diluted with H$_2$ gas to a concentration of 10%). And the flow rate of the SiH$_4$ gas and that of the BF$_3$ gas in Table 3 are respectively a value obtained by multiplying the flow rate of the SiH$_4$/H$_2$ gas by 10% as the concentration and a value obtained by multiplying the flow rate of the BF$_3$/H$_2$ gas by 2% as the concentration.

Each of the resultant these samples was subjected to irradiation of pseudo sunlight (AM 1.5) with an intensity of 100 mW/cm² under environmental condition of 25° C. to measure its V-I characteristics, whereby its open-circuit voltage (Voc), short-circuit current (Jsc), fill factor (F.F.), and photoelectric conversion efficiency (η) were obtained.

The measured results are collectively shown in Table 3 together with the measured result of the photovoltaic element sample Ex. 1-3. The values shown in Table 3 are values relative to those of Sample Comp. Ex. 1-1, which are respectively set at 1.

In addition, for each of the above two samples, its yield was examined in the same manner as in Example 1. The results obtained are collectively shown in Table 3.

Further, the p-type semiconductor layer 106 of each sample was examined in the same manner as in the step (6) of Example 1. As a result, the p-type semiconductor layer 106 in each case was found to contain a plurality of silicon low density regions whose "d" value and "L" value being as shown in Table 3 such that they are intermittently distributed therein.

For the reason why any of the three photovoltaic element samples are relatively superior to the photovoltaic element sample Ex. 1-3 in terms of the open-circuit voltage (Voc), short-circuit current (Jsc), fill factor (F.F.) and photoelectric conversion efficiency, it is considered as follows. As a result of having increased the hydrogen dilution rate, reducing the inner pressure (the gas pressure) of the deposition chamber, increased the wattage of the RF power applied, and adjusted the self-bias voltage of the RF electrode as shown in Table 3, such silicon low density regions having a relatively large dimension as above described were provided in the p-type semiconductor layer 106 in such a state that they are intermittently distributed therein, whereby the open-circuit voltage (Voc), short-circuit current (Jsc), fill factor (F.F.) and photoelectric conversion efficiency were improved.

Further in addition, in comparison of the photovoltaic element sample Ex. 2-1 with the photovoltaic element sample Ex. 2-2, although they are different only in terms of the dimensions of the silicon low density regions contained in the p-type semiconductor layer 106, the analysis of the chemical composition of the p-type semiconductor layer 106 in each case by SIMS revealed that an intensity detected of each of the hydrogen (H), boron (B) and fluorine (F) is increased as that of the Si is decreased to a certain extent. Based on this, it is considered that the density of each of the H, B and F in the silicon low density regions is higher than that in the remaining layer regions (excluding the silicon low density regions). And the ratio of each of them is estimated such that the H density in the former is about 5 times that in the latter, the B density in the former is about 4 times that in the latter, and the F density in the former is about 4 times that in the latter.

EXAMPLE 3

The procedures of preparing the photovoltaic element sample Ex. 1-1 in Example 1 were repeated, except that the n-type semiconductor layer 104 was replaced by a conventional n-type semiconductor layer comprising a 20 nm thick single n-type silicon hydride (a-Si:H) semiconductor film formed by the conventional n-type semiconductor film-forming manner and the conditions of forming the p-type semiconductor layer 106 in the step (6) were changed as shown in Table 4 to form a 15 nm thick p-type amorphous silicon carbide (a-SiC) semiconductor film as the p-type semiconductor layer 106, to obtain two kinds of photovoltaic element samples (Ex. 3-1 and Ex. 3-2).

Particularly, in this example, as shown in Table 4, in each case, CH₄ gas was used in addition to those raw material gases used in the formation of the p-type semiconductor layer 106 in Example 1, and the substrate temperature upon the formation of the p-type semiconductor layer was made to be 200° C. The flow rate of the BF₃ gas in Table 4 is based on a calculated value obtained by multiplying the flow rate of BF₃/H₂ gas by the concentration of the BF₃ gas.

Each of the resultant these samples was subjected to irradiation of pseudo sunlight (AM 1.5) with an intensity of 100 mW/cm² under environmental condition of 25° C. to measure its V-I characteristics, whereby its open-circuit voltage (Voc), short-circuit current (Jsc), fill factor (F.F.), and photoelectric conversion efficiency (η) were obtained.

The measured results are collectively shown in Table 4. The values shown in Table 4 are values relative to those of the photovoltaic element sample (Comp. Ex. 2-1) obtained in Comparative Example 2 (which will be described later), which are respectively set at 1.

In addition, for each of the above two samples, its yield was examined in the same manner as in Example 1. The results obtained are collectively shown in Table 4.

Further, the p-type semiconductor layer 106 of each sample was examined in the same manner as in the step (6) of Example 1. As a result, the p-type a-SiC semiconductor layer 106 in each case was found to contain a plurality of silicon low density regions whose "d" value and "L" value being as shown in Table 4 such that they are intermittently distributed therein.

For the reasons why any of the two photovoltaic element samples is apparently superior to the photovoltaic element sample Comp. Ex. 2-1 in terms of the open-circuit voltage (Voc), short-circuit current (Jsc), fill factor (F.F.) and photoelectric conversion efficiency and also in terms of the yield, it is considered as follows. As a result of having increased the hydrogen dilution rate, increased the wattage of the RF power applied, and adjusted the self-bias voltage of the RF electrode as shown in Table 4, such silicon low density regions having a relatively large dimension as shown in Table 4 were provided in the p-type a-SiC semiconductor layer 106 in each of the two photovoltaic element samples in such a state that they are intermittently distributed therein, whereby the open-circuit voltage (Voc), short-circuit current (Jsc), fill factor (F.F.) and photoelectric conversion efficiency were improved, and the yield was also improved.

COMPARATIVE EXAMPLE 2

The procedures of preparing the photovoltaic element sample Ex. 3-1 in Example 3 were repeated, except that the conditions of forming the p-type a-SiC semiconductor layer 106 were changed as shown in Table 5, to obtain one kind of photovoltaic element sample (Comp. Ex. 2-1).

The resultant photovoltaic sample Comp. Ex. 2-1 was subjected to irradiation of pseudo sunlight (AM 1.5) with an intensity of 100 mW/cm² under environmental condition of 25° C. to measure its V-I characteristics, whereby its open-circuit voltage (Voc), short-circuit current (Jsc), fill factor (F.F.), and photoelectric conversion efficiency (η) were obtained.

The measured results are collectively shown in Table 5. The values shown in Table 5 are values which are respectively set at 1 for the purpose of comparing with the photovoltaic element samples in Example 3.

In addition, for the photovoltaic element sample Comp. Ex. 2-1, its yield was examined in the same manner as in Example 1. The result obtained is shown in Table 5.

Further, the p-type a-SiC semiconductor layer 106 of the photovoltaic element sample Comp. Ex. 2-1 was examined in the same manner as in the step (6) of Example 1. As a result, the p-type a-SiC semiconductor layer 106 in this case was found to contain substantially no silicon low density region having a relatively large dimension. This situation is shown in Table 5.

Based on the results shown in Tables 4 and 5, it is understood that the photovoltaic element sample Comp. Ex. 2-1 is apparently inferior to any of the photovoltaic element samples Ex. 3-1 and Ex. 3-2 in terms of the photovoltaic element characteristics and also in terms of the yield.

EXAMPLE 4

The procedures of preparing the photovoltaic element sample Ex. 1-1 in Example 1 were repeated, except that the n-type semiconductor layer 104 was replaced by a conventional n-type semiconductor layer comprising a 20 nm thick single n-type silicon hydride (a-Si:H) semiconductor film formed by the conventional n-type semiconductor film-forming manner and the conditions of forming the p-type semiconductor layer 106 in the step (6) were changed as shown in Table 6 to form a 15 nm thick p-type amorphous silicon nitride (a-SiN) semiconductor film as the p-type semiconductor layer 106, to obtain two kinds of photovoltaic element samples (Ex. 4-1 and Ex. 4-2).

Particularly, in this example, as shown in Table 4, in each case, $NH_3/H_2$ gas (that is, $NH_3$ gas having diluted with $H_2$ gas to a concentration of 10%) was used in addition to those raw material gases used in the formation of the p-type semiconductor layer 106 in Example 1, and the substrate temperature upon the formation of the p-type semiconductor layer was made to be 250° C. The flow rate of the $NH_3$ gas shown in Table 6 is based on a calculated value obtained by multiplying the flow rate of the $NH_3/H_2$ gas by the concentration of the $NH_3$ gas, and the flow rate of the $BF_3$ gas in Table 6 is based on a calculated value obtained by multiplying the flow rate of $BF_3/H_2$ gas by the concentration of the $BF_3$ gas.

Each of the resultant these two photovoltaic element samples was subjected to irradiation of pseudo sunlight (AM 1.5) with an intensity of 100 mW/cm² under environmental condition of 25° C. to measure its V-I characteristics, whereby its open-circuit voltage (Voc), short-circuit current (Jsc), fill factor (F.F.), and photoelectric conversion efficiency (η) were obtained.

The measured results are collectively shown in Table 6. The values shown in Table 6 are values relative to those of the photovoltaic element sample (Comp. Ex. 3-1) obtained in Comparative Example 3 (which will be described later), which are respectively set at 1.

In addition, for each of the above two samples, its yield was examined in the same manner as in Example 1. The results obtained are collectively shown in Table 6.

Further, the p-type a-SiN semiconductor layer 106 of each sample was examined in the same manner as in the step (6) of Example 1. As a result, the p-type a-SiN semiconductor layer 106 in each case was found to contain a plurality of silicon low density regions whose "d" value and "L" value being as shown in Table 6 such that they are intermittently distributed therein.

For the reasons why any of the two photovoltaic element samples is apparently superior to the photovoltaic element sample Comp. Ex. 3-1 in terms of the open-circuit voltage (Voc), short-circuit current (Jsc), fill factor (F.F.) and photoelectric conversion efficiency and also in terms of the yield, it is considered as follows. As a result of having increased the hydrogen dilution rate, increased the wattage of the RF power applied, and adjusted the self-bias voltage of the RF electrode as shown in Table 6, such silicon low density regions having a relatively large dimension as shown in Table 6 were provided in the p-type a-SiN semiconductor layer 106 in each of the two photovoltaic element samples in such a state that they are intermittently distributed therein, whereby the open-circuit voltage (Voc), short-circuit current (Jsc), fill factor (F.F.) and photoelectric conversion efficiency were improved, and the yield was also improved.

COMPARATIVE EXAMPLE 3

The procedures of preparing the photovoltaic element sample Ex. 4-1 in Example 4 were repeated, except that the conditions of forming the p-type a-SiN semiconductor layer 106 were changed as shown in Table 7, to obtain one kind of photovoltaic element sample (Comp. Ex. 3-1).

The resultant photovoltaic sample Comp. Ex. 3-1 was subjected to irradiation of pseudo sunlight (AM 1.5) with an intensity of 100 mW/cm² under environmental condition of 25° C. to measure its V-I characteristics, whereby its open-circuit voltage (Voc), short-circuit current (Jsc), fill factor (F.F.), and photoelectric conversion efficiency (η) were obtained.

The measured results are collectively shown in Table 7. The values shown in Table 7 are values which are respectively set at 1 for the purpose of comparing with the photovoltaic element samples in Example 4.

In addition, for the photovoltaic element sample Comp. Ex. 3-1, its yield was examined in the same manner as in Example 1. The result obtained is shown in Table 7.

Further, the p-type a-SiN semiconductor layer 106 of the photovoltaic element sample Comp. Ex. 3-1 was examined in the same manner as in the step (6) of Example 1. As a result, the p-type a-SiN semiconductor layer 106 in this case was found to contain substantially no silicon low density region having a relatively large dimension. This situation is shown in Table 7.

Based on the results shown in Tables 6 and 7, it is understood that the photovoltaic element sample Comp. Ex. 3-1 is apparently inferior to any of the photovoltaic element samples Ex. 4-1 and Ex. 4-2 in terms of the photovoltaic element characteristics and also in terms of the yield.

EXAMPLE 5

The procedures of preparing the photovoltaic element sample Ex. 1-1 in Example 1 were repeated, except that the n-type semiconductor layer 104 was replaced by a conventional n-type semiconductor layer comprising a 20 nm thick single n-type silicon hydride (a-Si:H) semiconductor film formed by the conventional n-type semiconductor film-forming manner and the formation of the p-type semiconductor layer 106 was conducted in the deposition chamber 418 by means of the microwave plasma CVD process under the film-forming conditions shown in Table 8 to form a 15 nm thick p-type microcrystalline silicon oxide (μc-SiO) semiconductor film as the p-type semiconductor layer 106, to obtain two kinds of photovoltaic element samples (Ex. 5-1 and Ex. 5-2). In the formation of the p-type μc-SiO semiconductor layer 106 in each case, as shown in Table 8, in addition to a predetermined RF power applied to the bias introduction electrode 428, a predetermined positive DC voltage from a DC power source (not shown) was overlapped to the bias power introduction electrode 428.

And in this example, as shown in Table 8, in the formation of the p-type μc-SiO semiconductor layer 106 in each case, gasified $H_2O$ was used in addition to those raw material gases used in the formation of the p-type semiconductor layer 106 in Example 1, and the substrate temperature upon the formation of the p-type μc-SiO semiconductor layer was made to be 250° C. The flow rate of the $BF_3$ gas in Table 8 is based on a calculated value obtained by multiplying the flow rate of $BF_3/H_2$ gas by the concentration of the $BF_3$ gas.

Each of the resultant these two photovoltaic element samples was subjected to irradiation of pseudo sunlight (AM 1.5) with an intensity of 100 mW/cm² under environmental condition of 25° C. to measure its V-I characteristics, whereby its open-circuit voltage (Voc), short-circuit current (Jsc), fill factor (F.F.), and photoelectric conversion efficiency (η) were obtained.

The measured results are collectively shown in Table 8. The values shown in Table 8 are values relative to those of the photovoltaic element sample (Comp. Ex. 4-1) obtained in Comparative Example 4 (which will be described later), which are respectively set at 1.

In addition, for each of the above two samples, its yield was examined in the same manner as in Example 1. The results obtained are collectively shown in Table 8.

Further, the p-type μc-SiO semiconductor layer 106 of each sample was examined in the same manner as in the step (6) of Example 1. As a result, the p-type μc-SiO semiconductor layer 106 in each case was found to contain a plurality of silicon low density regions whose "d" value and "L" value being as shown in Table 8 such that they are intermittently distributed therein.

For the reasons why any of the two photovoltaic element samples is apparently superior to the photovoltaic element sample Comp. Ex. 4-1 in terms of the open-circuit voltage (Voc), short-circuit current (Jsc), fill factor (F.F.) and photoelectric conversion efficiency and also in terms of the yield, it is considered as follows. As a result of having increased the hydrogen dilution rate, increased the RF power applied, and increased the DC voltage as shown in Table 8, such silicon low density regions having a relatively large dimension as shown in Table 8 were provided in the p-type μc-SiO semiconductor layer 106 in each of the two photovoltaic element samples in such a state that they are intermittently distributed therein, whereby the open-circuit voltage (Voc), short-circuit current (Jsc), fill factor (F.F.) and photoelectric conversion efficiency were improved, and the yield was also improved.

COMPARATIVE EXAMPLE 4

The procedures of preparing the photovoltaic element sample Ex. 5-1 in Example 5 were repeated, except that the conditions of forming the p-type μc-SiO semiconductor layer 106 were changed as shown in Table 9, to obtain one kind of photovoltaic element sample (Comp. Ex. 4-1).

The resultant photovoltaic sample Comp. Ex. 4-1 was subjected to irradiation of pseudo sunlight (AM 1.5) with an intensity of 100 mW/cm² under environmental condition of 25° C. to measure its V-I characteristics, whereby its open-circuit voltage (Voc), short-circuit current (Jsc), fill factor (F.F.), and photoelectric conversion efficiency (η) were obtained.

The measured results are collectively shown in Table 9. The values shown in Table 9 are values which are respectively set at 1 for the purpose of comparing with the photovoltaic element samples in Example 5.

In addition, for the photovoltaic element sample Comp. Ex. 4-1, its yield was examined in the same manner as in Example 1. The result obtained is shown in Table 9.

Further, the p-type μc-SiO semiconductor layer 106 of the photovoltaic element sample Comp. Ex. 4-1 was examined in the same manner as in the step (6) of Example 1. As a result, the p-type μc-SiO semiconductor layer 106 in this case was found to contain substantially no silicon low density region having a relatively large dimension. This situation is shown in Table 9.

Based on the results shown in Tables 8 and 9, it is understood that the photovoltaic element sample Comp. Ex. 4-1 is apparently inferior to any of the photovoltaic element samples Ex. 5-1 and Ex. 5-2 in terms of the photovoltaic element characteristics and also in terms of the yield.

EXAMPLE 6

In this example, there was prepared a triple cell type photovoltaic element of the configuration shown in FIG. 3 and having a stacked triple cell semiconductor structure (comprising Si/SiGe/SiGe), wherein the constituents other than the triple cell semiconductor structure were formed in the same manner as in Example 1.

Particularly, the stacked triple cell semiconductor structure comprises a pin junction top cell 215, a pin junction middle cell 216, and a pin junction bottom cell 217 being stacked in the named order from the light incident side, wherein the pin junction bottom cell 217 comprises:

an n-type amorphous silicon (a-Si) semiconductor layer 204 (having a thickness of 20 nm) (this layer will be hereinafter referred to as "n-type layer 204"), a three layered i-type semiconductor layer comprising an i-type amorphous silicon (a-Si) layer 251 (having a thickness of 10 nm) formed by RF plasma CVD (this layer will be hereinafter referred to as "RF i-type layer 251"), an i-type amorphous silicon-germanium (a-SiGe) layer 205 (having a thickness of 80 nm) formed by microwave plasma CVD (this layer will be hereinafter referred to as "MW i-type layer 205"), and an i-type amorphous silicon (a-Si) layer 261 (having a thickness of 25 nm) formed by RF plasma CVD (this layer will be hereinafter referred to as "RF i-type layer 261"), and a p-type microcrystalline silicon (μc-Si) semiconductor layer 206 (having a thickness of 10 nm) (this layer will be hereinafter referred to as "p-type layer 206");

the pin junction middle cell 216 comprises:

an n-type amorphous silicon (a-Si) semiconductor layer 207 (having a thickness of 10 nm) (this layer will be hereinafter referred to as "n-type layer 207"), a three layered i-type semiconductor layer comprising an i-type amorphous silicon (a-Si) layer 252 (having a thickness of 10 nm) formed by RF plasma CVD (this layer will be hereinafter referred to as "RF i-type layer 252"), an i-type amorphous silicon-germanium (a-SiGe) layer 208 (having a thickness of 60 nm) formed by microwave plasma CVD (this layer will be hereinafter referred to as "MW i-type layer 208"), and an i-type amorphous silicon (a-Si) layer 262 (having a thickness of 25 nm) formed by RF plasma CVD (this layer will be hereinafter referred to as "RF i-type layer 262"), and a p-type microcrystalline silicon (μc-Si) semiconductor layer 209 (having a thickness of 10 nm) (this layer will be hereinafter referred to as "p-type layer 209"); and the pin junction top cell 215 comprises:

an n-type amorphous silicon (a-Si) semiconductor layer 210 (having a thickness of 10 nm) (this layer will be hereinafter referred to as "n-type layer 210"), a single-layered i-type amorphous silicon (a-Si) semiconductor layer 211 (having a thickness of 90 nm) formed by RF plasma CVD (this layer will be hereinafter referred to as "RF i-type layer 211"), and a p-type microcrystalline silicon (μc-Si) semiconductor layer 212 (having a thickness of 8 nm) (this layer will be hereinafter referred to as "p-type layer 212"). [see, Table 10]

The triple cell type photovoltaic element having this stacked triple cell semiconductor structure was prepared in the following manner using the roll-to-roll type multi-chambered film-forming apparatus shown in FIGS. 9(a) and 9(b).

There was provided a long substrate web made of stainless steel (SUS430BA) of 100 m in length, 30 cm in width and 0.15 mm in thickness as the substrate 201. The substrate web was wound on a rotary pay-out bobbin (not shown) in a vacuum RF plasma etching vessel (not shown) containing also a rotary take-up bobbin (not shown) which is arranged to oppose the pay-out bobbin, and a part of the substrate web on the pay-out bobbin was released to fix to the take-up bobbin while extending the substrate web in the RF plasma etching vessel. And while moving the substrate web from the pay-out bobbin toward the take-up bobbin by rotating the take-up bobbin, the surface of the substrate web was subjected to RF plasma etching surface treatment with Ar plasma under the conditions shown in Table 10. Then, on the plasma-etched surface of the substrate web, there were sequentially formed a 100 nm thick back face electrode 202 comprising AlSi and a 1.0 μm thick ZnO transparent and electrically conductive layer 203 by means of a roll-to-roll DC magnetron sputtering method (see, Table 10).

The substrate web thus treated was introduced in the film-forming apparatus shown in FIGS. 9(a) and 9(B), where the foregoing stacked triple cell semiconductor structure was formed on the transparent and electrically conductive layer 203 formed on the substrate web under the conditions shown in Tables 11 and 12.

The substrate web was wound on the pay-out reel 625 (having an average radius of curvature of 30 cm). The pay-out reel 625 having the substrate web wound thereon was set in the pay-out chamber 601, the substrate web was delivered to pass through the respective deposition cambers and its tip was fixed to the take-up reel 627 in the take-up chamber 615. The entire inside of the film-forming apparatus was vacuum-exhausted by means of the vacuuming pump, and the halogen lump heaters 618 were actuated so that the substrate web could be maintained a desired temperature in each of the deposition chambers 602–614.

When the entire inside of the film-forming apparatus became less than 1 mTorr, scavenging gas was flown into the film-forming apparatus through the respective scavenging gas inlet ports 624, where while moving the substrate web in a direction indicated by an arrow mark toward the take-up chamber 615, the substrate web was successively taken up by and wound on the take-up reel 627. In this case, desired raw material gas was introduced into each deposition chamber, where the raw material gas was prevented from diffusing into adjacent deposition chambers by properly adjusting the flow rate of the scavenging gas introduced into the respective isolation passages or the inner pressures of the respective deposition chambers. Then, by introducing a predetermined RF power into each of the deposition chambers 602, 603, 605–608, and 610–614, and a predetermined microwave power and a predetermined RF bias power into each of the 604 and 609, glow discharge was generated to produce plasma in each of these deposition chambers. By this, on the transparent and electrically conductive layer 203 of the substrate web, under the conditions shown in Tables 10 and 11, there were continuously formed:

the pin junction bottom cell 217 in a first zone comprising the deposition chambers 602–606 where the n-type layer 204 was formed in the deposition chamber 602, the RF i-type layer 251 was formed in the deposition chamber 603, the MW i-type layer 205 was formed in the deposition chamber 604, the RF i-type layer 261 was formed in the deposition chamber 605, and the p-type layer 206 was formed in the deposition chamber 606 under the bottom cell-forming conditions shown in Table 11 and the p-type layer-forming conditions shown in Table 12;

the pin junction middle cell 216 in a second zone comprising the deposition chambers 607–611 where the n-type layer 207 was formed in the deposition chamber 607, the RF i-type layer 252 was formed in the deposition chamber 608, the MW i-type layer 208 was formed in the deposition chamber 609, the RF i-type layer 262 was formed in the deposition chamber 610, and the p-type layer 209 was formed in the deposition chamber 611 under the middle cell-forming conditions shown in Table 11 and the p-type layer-forming conditions shown in Table 12; and the pin junction top cell 215 in a third zone comprising the deposition chambers 612–614 where the n-type layer 210 was formed in the deposition chamber 612, the RF i-type layer 211 was formed in the deposition chamber 613, and the p-type layer 212 was formed in the deposition chamber 614 under the top cell-forming conditions shown in Table 11 and the p-type layer-forming conditions shown in Table 12.

For the $GeH_4$ gas, it was introduced into the corresponding deposition chamber through a plurality of gas inlet ports 629 as shown in FIG. 9(b).

After the entire of the substrate web product was wounded on the take-up reel 627, the introduction of the RF power, microwave power, and RF bias power were terminated. At the same time, the introduction of the raw material gases and scavenging gas were terminated. And the entire inside of the film-forming apparatus was returned to atmospheric pressure, and the take-up reel 627 was taken out from the film-forming apparatus.

By this, there was formed a triple cell (pin-pin-pin) semiconductor structure on the substrate web.

On the surface of the p-type layer 212 of the top cell of the triple cell semiconductor structure formed on the substrate web, there was formed a 70 nm thick ITO film as the transparent electrode layer 213 using a conventional reactive sputtering apparatus. Then, on the surface of the transparent electrode layer 213, there was formed a comb-shaped electrode as the collecting electrode 214 by screen-printing a carbon paste at a thickness of 5 μm and at a line width of 0.5 mm and screen-printing an Ag paste at a thickness of 10 μm and at a line width of 0.5 mm.

By this, there was obtained a belt-like photoconductive element (or a belt-like solar cell). The belt-like photovoltaic element was cut to obtain a plurality of photovoltaic elements (or solar cells) of 250 mm×100 mm in size as Sample Ex. 6-1.

Each of the resultant photovoltaic element samples was subjected to irradiation of pseudo sunlight (AM 1.5) with an intensity of 100 $mW/cm^2$ under environmental condition of 25° C. to measure its V-I characteristics, whereby its open-circuit voltage (Voc), short-circuit current (Jsc), fill factor (F.F.), and photoelectric conversion efficiency (η) were obtained.

Herein, each of the resultant photovoltaic element samples was evaluated with respect to the light-induced degradation ratio (that is, the change ratio between the intitial photoelectric conversion efficiency and the photoelectric conversion efficiency after having suffered from light-induced degradation) in a manner in which the sample is maintained in an atmosphere of 50° C., followed by subjecting to irradiation of pseudo sunlight (AM 1.5) with an intensity of 100 mW/cm$^2$ for 1,000 hours. After this, its V-I characteristics are measured under environmental condition of 25° C. to obtain a photoelectric conversion efficiency (η); and the resultant photoelectric conversion efficiency is compared with the initial photoelectric conversion efficiency.

The evaluated results in terms of average value are collectively shown in Table 12. The values shown in Table 12 are values relative to those of the photovoltaic element sample (Comp. Ex. 5-1) obtained in Comparative Example 5 (which will be described later), which are respectively set at 1.

In addition, the yield was examined in the same manner as in Example 1. The result obtained is shown in Table 12.

Further, each of the three p-type layers of the photovoltaic element sample was examined with respect to silicon low density region contained therein by observing a cross section of the photovoltaic element (obtained by cutting the photovoltaic element in the direction perpendicular to the substrate) by means of TEM (transmission electron microscope). As a result, each p-type layer was found to contain a plurality of silicon low density regions whose "d" value and "L" value being as shown in Table 12 such that they are intermittently distributed therein.

For the reasons why the photovoltaic element sample is apparently superior to the photovoltaic element sample Comp. Ex. 5-1 in terms of the open-circuit voltage (Voc), short-circuit current (Jsc), fill factor (F.F.), photoelectric conversion efficiency, and light-induced degradation, and also in terms of the yield, it is considered as follows. As a result of having increased the hydrogen dilution rate, increased the RF power applied, and increased the bias voltage as shown in Table 12, such silicon low density regions having a relatively large dimension as shown in Table 12 were provided in each of the three p-type layers in such a state that they are intermittently distributed therein, whereby the open-circuit voltage (Voc), short-circuit current (Jsc), fill factor (F.F.), photoelectric conversion efficiency and light-induced degradation were improved, and the yield was also improved.

COMPARATIVE EXAMPLE 5

The procedures of preparing the photovoltaic element sample Ex. 6-1 in Example 6 were repeated, except that the conditions of forming each of the p-type layers 206, 209 and 212 were changed as shown in Table 13, to obtain a plurality of photovoltaic element samples (Comp. Ex. 5-1).

Each of the resultant photovoltaic samples was subjected to irradiation of pseudo sunlight (AM 1.5) with an intensity of 100 mW/cm$^2$ under environmental condition of 25° C. to measure its V-I characteristics, whereby its open-circuit voltage (Voc), short-circuit current (Jsc), fill factor (F.F.), and photoelectric conversion efficiency (η) were obtained. In addition, for each of the resultant photovoltaic samples, evaluation was conducted with respect to the light-induced degradation ratio in the same manner as in Example 6.

The evaluated results in terms of average value are collectively shown in Table 13. The values shown in Table 13 are values, which are respectively set at 1 for the purpose of comparing with the photovoltaic element samples in Example 6.

In addition, the yield was examined in the same manner as in Example 1. The result obtained is shown in Table 13.

Further, for each of the three p-type layers of the photovoltaic element sample was examined with respect to silicon low density region in the same manner as in Example 6. As a result, any of the three p-type layers was found to contain a few silicon low density regions whose "d" value and "L" value being quite small as shown in Table 13 which are distributed therein.

Based on the results shown in Tables 12 and 13, it is understood that the photovoltaic element samples Comp. Ex. 5-1 are apparently inferior to any of the photovoltaic element samples Ex. 6-1 in terms of the photovoltaic element characteristics and also in terms of the yield.

EXAMPLE 7

In this example, there was prepared a photovoltaic element of the configuration shown in FIG. 2 using the film-forming apparatus shown in FIG. 7 in a manner similar to that in Example 1.

The photovoltaic element was prepared by sequentially conducting the following steps.

Step (1): substrate 101 is provided;

Step (2): back face electrode layer 102 is formed;

Step (3): transparent and electrically conductive layer 103 is formed;

Step (4): n-type semiconductor layer 104 is formed;

Step (5): i-type semiconductor layer 105 is formed;

Step (6): p-type semiconductor layer 106 is formed;

Step (7): transparent electrode layer 107 is formed; and

Step (8): collecting electrode 108 is formed.

In the step (4), as the n-type semiconductor layer 104, there was formed a two-layered n-type semiconductor layer comprising (i) a first n-type semiconductor layer (comprising an n-type hydrogenated amorphous silicon (a-Si:H) layer) and (ii) a second n-type semiconductor layer (comprising an n-type microcrystalline silicon (μc-Si) semiconductor layer) being stacked in the named order, wherein the n-type semiconductor layer 104 comprising the two-layered n-type semiconductor layer contains a plurality of silicon low density regions having various dimensions such that they are intermittently distributed therein. In the step (5), as the i-type semiconductor layer 105, there was formed a substantially intrinsic semiconductor layer composed of a microcrystalline silicon (μc-Si) semiconductor material. In the step (6), as the p-type semiconductor layer, there was formed a p-type semiconductor layer composed of a microcrystalline silicon (μc-Si) semiconductor material and which contains a plurality of silicon low density regions having various dimensions such that they are intermittently distributed therein.

The steps (4) to (6) were conducted using the above described film-forming apparatus shown in FIG. 7.

Each of the steps (1) to (8) was conducted as will be described below.

Step (1):

A plate made of stainless steel (SUS430BA) having a thickness of 0.5 mm and a size of 50 mm×50 mm was subjected to ultrasonic cleaning using acetone and isopropanol, followed by warm air drying. By this, there was provided a stainless steel substrate having a well cleaned surface as the substrate 101.

Step (2):

A 0.3 μm thick Ag film as the back face electrode layer 102 was formed on the surface of the substrate 101 by a conventional DC magnetron sputtering process at room temperature.

Step (3):

On the Ag film as the back face electrode layer 102, a 1.0 μm thick ZnO film as the transparent and electrically conductive layer 103 was formed by a conventional magnetron sputtering process under condition of 350° C. for the substrate temperature.

Step (4):

The substrate 101 having the back face electrode layer 102 and the transparent and electrically conductive layer 103 formed thereon was introduced into the film-forming apparatus shown in FIG. 7, where as the n-type semiconductor layer 104, there were sequentially formed (i) a 20 nm thick n-type hydrogenated amorphous silicon (a-Si: H) layer (this layer will be hereinafter referred to as "first n-type semiconductor layer"); and (ii) a 30 nm thick n-type microcrystalline silicon (μc-Si) semiconductor layer (this layer will be hereinafter referred to as "second n-type semiconductor layer"), as will be described below.

First, all the transportation systems and deposition chambers of the film-forming apparatus shown in FIG. 7 were evacuated to a relatively high vacuum.

The above substrate 101 was fixed to the rear face of the substrate holder 490, followed by introducing into the load rock chamber 401, where the substrate holder 490 was positioned on the transportation rail 413. The inside of the load rock chamber 401 was evacuated to a vacuum degree of about $1 \times 10^{-5}$ Torr by means of a vacuuming means (not shown). $H_2$ gas was flown into both the load rock chamber and the transportation chamber 402 including the deposition chamber 417 to make the inner pressure of the load rock chamber and that of the transportation chamber to be substantially the same.

Then, the gate valve 406 was opened, and the substrate holder 490 having the substrate 101 was moved into the transportation chamber 402 including the deposition chamber 417. The gate valve 406 was closed. Then, the substrate holder 490 having the substrate 101 was moved to position under the substrate temperature controlling means 410 of the deposition chamber 417. The substrate temperature controlling means 410 was descended to start heating the substrate 101.

Formation of the First n-type Semiconductor Layer:

$H_2$ gas from the raw material gas supply system was introduced into the deposition chamber 417 through the gas supply pipe 429, where the flow rate of the $H_2$ gas was controlled to 50 sccm by means of the corresponding mass flow controller (not shown) while regulating the corresponding valve (not shown). The inner pressure in the deposition chamber 417 was adjusted to 1.2 Torr by regulating the opening of the conductance valve (not shown). The temperature of the substrate 101 was controlled to and maintained at 350° C. by means of the substrate temperature controlling means. Thereafter, while continuing the introduction of the $H_2$ gas at the flow rate of 50 sccm into the deposition chamber 417, the corresponding valves (not shown) of the raw material gas supply system (not shown) were opened to introduce $SiH_4$ gas and $PH_3/H_2$ gas into the deposition chamber 417 through the raw material gas supply pipe 429 while controlling their flow rates to 2 sccm and 0.5 sccm by means of the corresponding mass flow controllers (not shown) and by regulating the corresponding valves (not shown).

Then, the inner pressure of the deposition chamber 417 was controlled to and maintained at 1.2 Torr. Thereafter, the RF power source 422 was switched on to apply a RF power (with an oscillation frequency of 13.56 MHz) of 5 mW/cm³ into the deposition chamber 417 through the RF power introduction cup 420, where glow discharge was caused to form a 20 nm thick n-type a-Si semiconductor film as the first n-type semiconductor layer on the ZnO film as the transparent and electrically conductive layer 103.

In the above, the substrate 101 was electrically grounded, and the RF power introduction cup 420 as the RF electrode had a self-bias voltage of +13 V.

Formation of the Second n-type Semiconductor Layer:

Using the same deposition chamber 417 used in the formation of the first n-type a-Si layer, the procedures of forming the first n-type a-Si layer were repeated under the conditions shown in the column "Ex. 7-1" of Table 14 where the $SiH_4$ gas used in the formation of the first n-type a-Si layer was replaced by $SiH_4/H_2$ gas (the concentration of the $SiH_4$ gas diluted with the $H_2$ gas: 10%), the ratio of the flow rate of the $PH_3/H_2$ gas to that of the $SiH_4/H_2$ gas was controlled to 1/4, the substrate temperature was made to be 300° C., and the inner pressure (the gas pressure) of the deposition chamber was controlled to 1.0 Torr, whereby a 30 nm thick n-type microcrystalline silicon (μc-Si) semiconductor film as the second n-type semiconductor layer was formed on the first n-type semiconductor layer.

In this way, the formation of the n-type semiconductor layer 104 on the transparent and electrically conductive layer 103 was completed.

After the formation of the n-type semiconductor layer 104, the introduction of the $SiH_4$ gas and $PH_3/H_2$ gas into the deposition chamber 417 and the application of the RF power to the RF electrode were terminated, where the introduction of the $H_2$ gas into the deposition chamber was continued for 5 minutes. Thereafter, the introduction of the $H_2$ gas was terminated. And the inside of the transportation chamber 402 including the deposition chamber 417 and the insides of the gas pipe ways were evacuated to a vacuum of about $1 \times 10^{-5}$ Torr.

Now, separately, there was formed a two-layered n-type semiconductor layer (as the n-type semiconductor layer 104) comprising a first n-type semiconductor layer comprising an n-type hydrogenated amorphous silicon (a-Si:H) layer) and a second n-type semiconductor layer (comprising an n-type microcrystalline silicon (μc-Si) semiconductor layer) being stacked in the named order on a stainless steel substrate by repeating the foregoing procedures for the formation of the n-type semiconductor layer 104.

And for the resultant sample, its cross section obtained by cutting in the direction perpendicular to the substrate was examined by means of TEM (transmission electron microscope). As a result, it was found that the two layered n-type semiconductor layer contains a plurality of silicon lower density regions having various dimensions such that they are intermittently distributed therein.

And for these silicon low density regions, the average height "d" in the layer thickness direction and the average diameter "L" in the direction parallel to the surface of the substrate were found as shown in the column "Ex. 7-1 of Table 14.

In addition, the inside of each of the silicon low density regions was found to comprise an amorphous silicon material.

Step (5):

As the i-type semiconductor layer 105, a 2 μm thick i-type microcrystalline silicon (μc-Si) semiconductor film was formed by a microwave plasma CVD process as will be described below.

The substrate controlling means 410 was lifted. The gate valve 407 was opened, and the substrate holder 490 having the substrate 101 was moved into the transportation chamber 403 including the deposition chamber 418 which had been previously evacuated as above described. The gate valve 407 was closed.

The substrate holder 490 having the substrate 101 was moved to position under the substrate temperature controlling means 411 of the deposition chamber 418. The substrate temperature controlling means 411 was descended to start heating the substrate 101. The inside of the deposition chamber 418 was evacuated to a vacuum of about $1\times10^{-5}$ Torr by means of a vacuuming means (not shown). Then, the temperature of the substrate was controlled to and maintained at 350° C. by means of the substrate temperature controlling means 411. Thereafter, the corresponding valves (not shown) of the raw material gas supply system (not shown) were opened to introduce $SiH_4$ gas and $H_2$ gas into the deposition chamber 418 through the raw material gas supply pipe 449 while controlling their flow rates to 40 sccm and 1300 sccm by means of the corresponding mass flow controllers (not shown) and by regulating the corresponding valves (not shown). The inner pressure (the gas pressure) of the deposition chamber 418 was controlled to and maintained at a vacuum of 25 mTorr by regulating the opening of the conductance valve (not shown).

While maintaining the shutter 427 of the deposition chamber 418 in a closed state, the RF power source 424 was switched on to impress an RF power (with an oscillation frequency of 13.56 MHz) of 65 $W/cm^3$ to the RF bias power introduction electrode 428. Then, the microwave power source (not shown) was switched on to apply a microwave power (with an oscillation frequency of 2.45 GHz) of 50 $mW/cm^3$ into the deposition chamber 418 through the waveguide 426 and the microwave introduction window 425, where glow discharge was generated to produce plasma in the deposition chamber 418. When the plasma became stable, the shutter 427 was opened to cause the formation of a 2 $\mu$m thick i-type $\mu$c-Si semiconductor film as the i-type semiconductor layer 105 on the n-type semiconductor layer 104.

After the formation of the i-type semiconductor layer 105, the introduction of the $SiH_4$ gas into the deposition chamber 418, the application of the RF power and the application of the microwave power were terminated, where the introduction of the $H_2$ gas into the deposition chamber was continued for 2 minutes. Thereafter, the introduction of the $H_2$ gas was terminated. And the inside of the transportation chamber 403 including the deposition chamber 418 and the insides of the gas pipe ways were evacuated to a vacuum of about $1\times10^{-5}$ Torr.

Now, separately, there was formed a 2 $\mu$m thick i-type $\mu$c-Si semiconductor film as the i-type semiconductor layer 105 on a stainless steel substrate by repeating the foregoing procedures for the formation of the i-type semiconductor layer 105.

And for the resultant sample, its cross section obtained by cutting in the direction perpendicular to the substrate was examined by means of TEM (transmission electron microscope). As a result, it was found that the i-type $\mu$c-Si semiconductor film substantially comprises a microcrystalline material and that the volume ratio of the microcrystalline material is 85% and the microcrystalline material comprises microcrystal grains having a dimension of an average length in the direction perpendicular to the surface of the substrate which is about 5 times that in the direction parallel to the surface of the substrate. In addition, the analysis by way of X-ray diffraction revealed that the microcrystalline material is 12 nm in average grain size.

Step (6):

As the p-type semiconductor layer 106, a 10 nm thick p-type $\mu$c-Si semiconductor film was formed as will be described below.

The substrate controlling means 411 was lifted. The gate valve 408 was opened, and the substrate holder 490 having the substrate 101 was moved into the transportation chamber 404 including the deposition chamber 419 which had been previously evacuated as above described. The gate valve 408 was closed.

The substrate holder 490 having the substrate 101 was moved to position under the substrate temperature controlling means 412 of the deposition chamber 419. The substrate temperature controlling means 412 was descended to start controlling the temperature of the substrate 101. The inside of the deposition chamber 419 was evacuated to a vacuum of about $1\times10^{-5}$ Torr by means of a vacuuming means (not shown). Then, the temperature of the substrate was controlled to and maintained at 230° C. by means of the substrate temperature controlling means 412. Thereafter, the corresponding valves (not shown) of the raw material gas supply system (not shown) were opened to introduce $SiH_4/H_2$ gas (the concentration of the $SiH_4$ gas diluted with the $H_2$ gas: 10%), $H_2$ gas, and $BF_3/H_2$ gas (the concentration of the $BF_3$ gas diluted with the $H_2$ gas: 2%) into the deposition chamber 419 through the raw material gas supply pipe 469 while controlling their flow rates to 0.2 sccm, 40 sccm and 0.5 sccm by means of the corresponding mass flow controllers (not shown) and by regulating the corresponding valves (not shown). The inner pressure (the gas pressure) of the deposition chamber 419 was controlled to and maintained at a vacuum of 2.0 Torr by regulating the opening of the conductance valve (not shown).

Thereafter, the RF power source 423 was switched on to apply an RF power of 170 $mW/cm^3$ into the deposition chamber 419 through the RF power introduction cup 421, where glow discharge was generated to form a 10 nm thick p-type $\mu$c-Si semiconductor film as the p-type semiconductor layer 106 on the i-type semiconductor layer 105.

In the above, the substrate 101 was electrically grounded, and the RF power introduction cup 426 as the RF electrode had a self-bias voltage of +140 V.

After the formation of the p-type semiconductor layer 106, the introduction of the $SiH_4/H_2$ gas and $BF_3/H_2$ gas into the deposition chamber 419 and the application of the RF power to the RF electrode were terminated, where the introduction of the $H_2$ gas into the deposition chamber was continued for 3 minutes. Thereafter, the introduction of the $H_2$ gas was terminated. And the inside of the transportation chamber 404 including the deposition chamber 419 and the insides of the gas pipe ways were evacuated to a vacuum of about $1\times10^{-5}$ Torr.

After this, the substrate temperature controlling means 412 was lifted. $H_2$ gas was flown into the both the transportation chamber 404 including the deposition chamber 419 and the unload chamber 405 which had been previously evacuated to make their inner pressures to be substantially the same. Then, the gate valve 409 was opened, and the substrate holder 490 having the substrate 101 (having the back face electrode layer 102, the transparent and electrically conductive layer 103, and the n-type, i-type and p-type semiconductor layers 104, 105 and 106 formed thereon) was moved into the unload chamber 405. The gate valve 409 was closed, and the substrate was taken out from the unload chamber 405.

Now, separately, there was formed a 10 nm thick p-type $\mu$c-Si semiconductor film as the p-type semiconductor layer 106 on a stainless steel substrate by repeating the foregoing procedures for the formation of the p-type semiconductor layer 106.

And for the resultant sample, its cross section obtained by cutting in the direction perpendicular to the substrate was examined by means of TEM (transmission electron microscope). As a result, it was found that the p-type semiconductor layer contains a plurality of silicon lower density regions of 8 nm in the "d" and 10 nm in the "L" such that they are intermittently distributed therein.

Step (7):

A patterning mask having 25 perforations having an area of 0.25 cm$^2$ was superposed on the surface of the p-type semiconductor layer of the resultant obtained in the step (6), followed by forming a 70 nm thick ITO (In$_2$O$_3$+SnO$_2$) film as the transparent electrode layer 107 by means of a conventional resistance heating vacuum deposition process.

Step (8):

A patterning mask having a comb-shaped opening was superposed on the surface of the transparent electrode layer 107 formed in the step (7), followed by forming a comb-shaped collecting electrode (having such configuration as shown in FIG. 8) comprising Cr (40 nm)/Ag (1000 nm)/Cr (40 nm) as the collecting electrode 108 by means of a conventional electron beam vacuum deposition process.

By this, there was obtained a photovoltaic element having the configuration shown in FIG. 2. This photovoltaic element was made to be Sample Ex. 7-1 (see, Table 14).

The procedures of preparing the Sample Ex. 7-1 were repeated, except that the conditions for the formation of the second μc-Si n-type semiconductor layer were changed as shown in the column Ex. 7-2, Ex. 7-3, Ex. 7-4, or Ex. 7-5 of Table 14, to obtain four photovoltaic elements as Samples Ex. 7-2 to Ex. 7-5 (see, Table 14). Similarly, the procedures of preparing the Sample Ex. 7-1 were repeated, except that the conditions for the formation of the second μc-Si n-type semiconductor layer were changed as shown in the column Comp. Ex. 6-1, Comp. Ex. 6-2, or Comp. Ex. 6-3 of Table 14, to obtain three comparative photovoltaic elements as Samples Comp. Ex. 6-1 to Comp. Ex. 6-3 (see, Table 14).

The n-type semiconductor layer 104 of each sample (excluding the sample Ex. 7-1) was examined with respect to the presence or absence of silicon low density region and also with respect to "d" and "L" of silicon low density regions when they are present, in the same manner described in the foregoing step (4). The examined results obtained are collectively shown in Table 14.

The n-type semiconductor layer 104 of each samples Ex. 7-2 to Ex. 7-5 was found to contain a plurality of silicon low density regions having the "d" and "L" as shown in Table 14 such that they are intermittently distributed therein. And it was found that the silicon low density regions contained in the n-type semiconductor layer in each case comprise an amorphous silicon material.

Each of the above samples was subjected to irradiation of pseudo sunlight (AM 1.5) with an intensity of 100 mW/cm$^2$ under environmental condition of 25° C. to measure its V-I characteristics, whereby its open-circuit voltage (Voc), short-circuit current (Jsc), fill factor (F.F.), and photoelectric conversion efficiency (η) were obtained.

Figure 6:
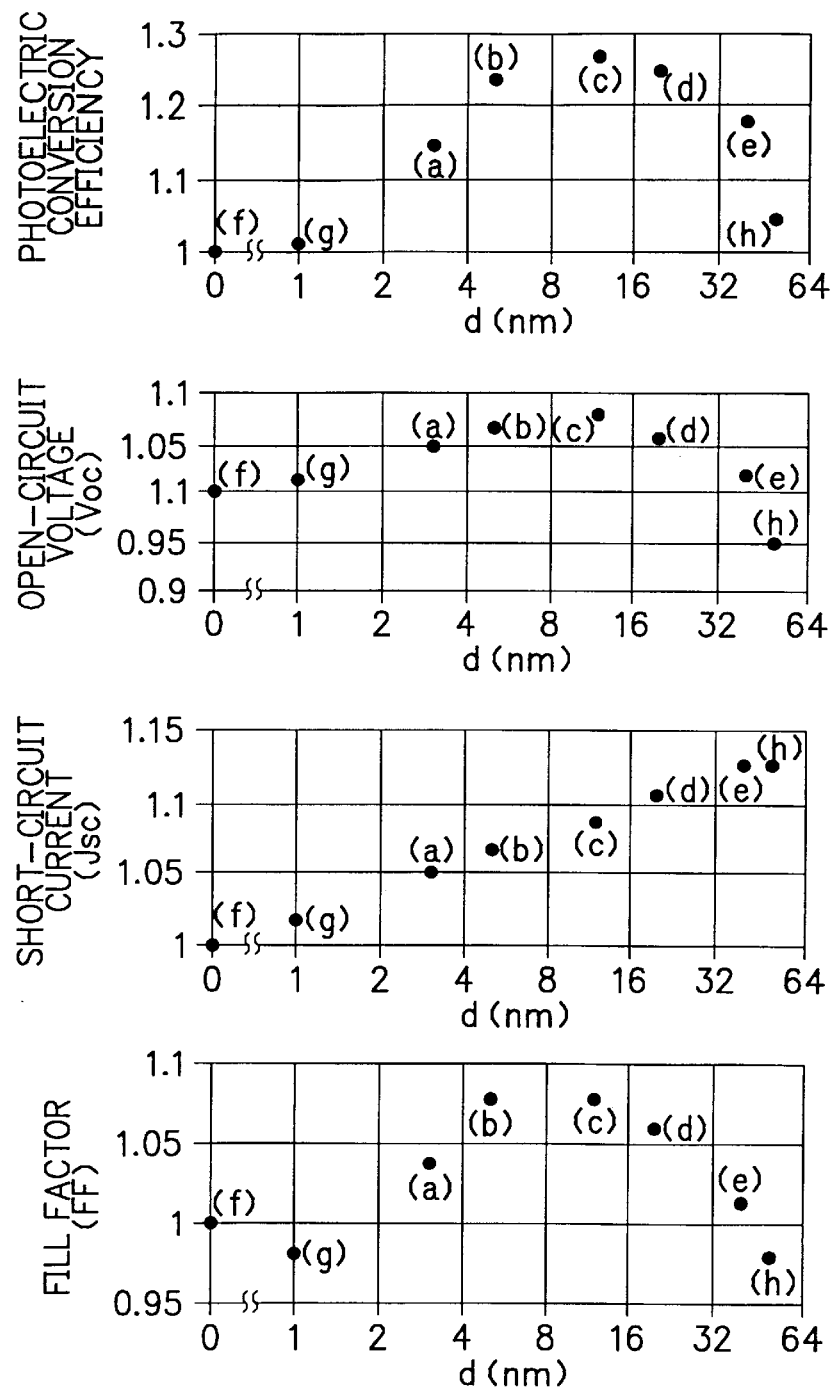
FIG. 6 shows graphs of photoelectric conversion efficiencies, open-circuit voltages (Voc), short-circuit currents (Jsc), and fill factors (F.F.) of photovoltaic elements obtained in Example 7 which will be described later, wherein the abscissa is of the average height [d (nm)] of the group IV element low density regions.

The measured results thus obtained are graphically shown in FIG. 6. The values shown in FIG. 6 are values relative to those of Sample Comp. Ex. 6-1, which are respectively set at 1. In FIG. 6, the abscissa indicates "d" (the average height of the group IV element low density region in the layer thickness direction).

The measured results of the photoelectric conversion efficiency are also collectively shown in Table 14.

As the graphs of FIG. 6 illustrate, it is understood that the semiconductor junction of the doped layer (containing a plurality of group IV element (such as silicon) low density regions such that they are intermittently distributed in the layer) with the microcrystalline i-type semiconductor layer in the photovoltaic element according to the present invention desirably improves the open-circuit voltage (Voc), short-circuit current (Jsc) and fill factor (F.F.), resulting an improvement in the photoelectric conversion efficiency (η). Particularly, it is understood that when the group IV element low density regions have a dimension which satisfies the previously described equations (a) and (b) (that is, 3 nm≦d≦40 nm—(a) and 3 nm≦L≦80 nm—(b), with d being an average height of the group IV low density regions in the layer thickness direction, and L being an average diameter of the group IV low density regions in the direction parallel to the surface of the substrate), the photoelectric conversion efficiency is markedly improved.

And the yield in the mass-production of a photovoltaic element is improved as shown in Table 14. The yield herein was evaluated in a manner in which 100 photovoltaic elements of 0.25 cm$^2$ in size for each of the foregoing samples are produced, the proportion of the photovoltaic elements having a shunt resistance of more than 5×10$^4$ Ω/cm$^2$ is examined, and the resultant proportion is made to be a yield.

Further, each of the foregoing samples was subjected to heat resistance test in an atmosphere of 180° C. for 24 hours. After this, evaluation was conducted with respect to thermal degradation ratio (the rate of change between the initial photoelectric conversion efficiency and that after the heat resistance test).

The evaluated results are collectively shown in Table 14. As the results shown in Table 14 illustrate, it is understood that any of the samples Ex. 7-1 to Ex. 7-5 is satisfactory in the thermal degradation ratio.

Further in addition, for the p-type semiconductor layer of each of the samples Ex. 7-3 to Ex. 7-5 and the sample Comp. Ex. 6-3, the concentrations of the silicon (Si), hydrogen (H), fluorine (F), and boron (B) contained therein were analyzed by means of SIMS. Based on the results obtained, there was found a tendency in that as the dimension of the silicon low density region is enlarged, an intensity detected of each of the H, B and F is increased while that of the Si is decreased to a certain extent. Based on this, it is considered that the density of each of the H and F in the silicon low density regions is higher than that in the remaining layer regions (excluding the silicon low density regions). And the ratio of each of them is estimated such that the H density in the former is about 5 times that in the latter, and the F density in the former is about 4 times that in the latter.

EXAMPLE 8

The procedures of preparing the photovoltaic element sample Ex. 7-3 in Example 7 were repeated, except that in the step (5) for the formation of the i-type semiconductor layer 105, a high frequency power with an oscillation frequency of 500 MHz was used instead of the microwave power with an oscillation of 2.45 GHz, and the conditions of forming the i-type semiconductor layer 105 were changed as shown in Table 15, to obtain a photovoltaic element sample having an i-type semiconductor layer composed of an amorphous material (as Comp. Ex. 7-1) and four photovoltaic element samples (Ex. 8-1, Ex. 8-2, Ex. 8-3, and Comp. Ex. 7-2) each having an i-type semiconductor layer composed of a microcrystalline material having a different average grain size.

In the above, the high frequency power with 500 MHz was applied by electrically grounding the RF electrode only in the case of the Comp.Ex. 7-1, and it was applied by electrically floating the RF electrode in each of the remaining cases. In each case other than the case of the Comp.Ex. 7-1, the RF electrode had a negative self-bias voltage.

The volume ratio of the microcrystalline material of the i-type semiconductor layer in each case was obtained by comparing the integrated intensity of a peak of 520 cm$^{-1}$ with that of a peak of 480 cm$^{-1}$ in the Raman spectrum. The results obtained are collectively shown in Table 15.

Further, for the microcrystalline material of the i-type semiconductor layer in each case, a cross section of the i-type semiconductor layer was examined by means of TEM (transmission electron microscope), and there was obtained a ration of H/W, with H being an average grain size of microcrystals in the direction perpendicular to the surface of the substrate and W being an average grain size of the microcrystals in the direction parallel to the surface of the substrate. The results obtained are collectively shown in Table 15.

Each of the resultant samples was maintained in an atmosphere of 50° C., followed by subjecting to irradiation of pseudo sunlight (AM 1.5) with an intensity of 100 mW/cm$^2$ for 1,000 hours. After this, its V-I characteristics were measured under environmental condition of 25° C., whereby its open-circuit voltage (Voc), short-circuit current (Jsc), fill factor (F.F.), and photoelectric conversion efficiency (η) (after the sample having suffered from the light-induced degradation) were obtained.

The measured results are collectively shown in Table 15. The values shown in Table 15 are values relative to those of the sample Comp. Ex. 7-1, which are respectively set at 1.

As the results shown in Table 15 illustrate, it is understood that by increasing the hydrogen dilution rate and the RF power applied, and floating the RF electrode so as to have a negative bias voltage, the volume ratio of the microcrystalline material as the i-type semiconductor layer is increased while the average crystal grain size is enlarged and the ratio of H/W is increased. Particularly, it is understood that any of the photovoltaic element samples belonging to the present invention whose i-type semiconductor layer being composed of a microcrystalline material of 50% or more in the average volume ratio, 3 nm or more in the average crystal grain size, and 2 or more in the ratio of H/W is slight in light-induced degradation, and has a markedly improved photoelectric conversion efficiency after having been degraded. Each of the samples Ex. 8-2 and Ex. 8-3 was found to have a light-induced degradation ratio of less than 5%.

EXAMPLE 9

The procedures of preparing the photovoltaic element sample Ex. 7-1 in Example 7 were repeated, except that the formation of the p-type semiconductor layer 106 was conducted in the deposition chamber 418 by means of the microwave plasma CVD process under the film-forming conditions shown in Table 16 to form a 15 nm thick p-type microcrystalline silicon oxide (μc-SiO) semiconductor film as the p-type semiconductor layer 106, to obtain three kinds of photovoltaic element samples (Ex. 9-1, Ex. 9-2, and Comp. Ex. 8-1). In the formation of the p-type μc-SiO semiconductor layer 106 in each case, as shown in Table 16, in addition to a predetermined RF power applied to the bias introduction electrode 428, a predetermined positive DC voltage from a DC power source (not shown) was overlapped to the bias power introduction electrode 428.

And in this example, as shown in Table 16, in the formation of the p-type μc-SiO semiconductor layer 106 in each case, gasified H$_2$O was used in addition to those raw material gases used in the formation of the p-type semiconductor layer 106 in Example 7, and the substrate temperature upon the formation of the p-type μc-SiO semiconductor layer was made to be 250° C. The flow rate of the BF$_3$ gas in Table 16 is based on a calculated value obtained by multiplying the flow rate of BF$_3$/H$_2$ gas by the concentration of the BF$_3$ gas.

The p-type μc-SiO semiconductor layer 106 thus formed in each case was found to contain a plurality of silicon low density regions which are different in each case in terms of the dimension as shown in Table 16.

Each of the samples was subjected to irradiation of pseudo sunlight (AM 1.5) with an intensity of 100 mW/cm$^2$ under environmental condition of 25° C. to measure its V-I characteristics, whereby its open-circuit voltage (Voc), short-circuit current (Jsc), fill factor (F.F.), and photoelectric conversion efficiency (η) were obtained.

The measured results are collectively shown in Table 16. The values shown in Table 16 are values relative to those of the sample Comp. Ex. 8-1, which are respectively set at 1.

In addition, for each of the samples, its yield was examined in the same manner as in Example 7. The results obtained are collectively shown in Table 16.

Further, for each of the samples, its thermal degradation ratio was examined in the same manner as in Example 7. The results obtained are collectively shown in Table 16.

As the results shown in Table 16 illustrate, it is understood that any of the photovoltaic element samples (Ex. 9-1 and Ex. 9-2) belonging to the present invention is superior to the comparative photovoltaic element sample Comp. Ex. 8-1 in terms of the open-circuit voltage (Voc), short-circuit current (Jsc), fill factor (F.F.) and photoelectric conversion efficiency and also in terms of the yield and thermal degradation ratio. The reasons for this, it is considered as follows. As a result of having increased the hydrogen dilution rate, increased the RF power applied, and increased the DC voltage as shown in Table 16, such silicon low density regions having a relatively large dimension as shown in Table 16 were provided in the p-type μc-SiO semiconductor layer 106 in each of the two photovoltaic element samples Ex. 9-1 and Ex. 9-2 in such a state that they are intermittently distributed therein, whereby the open-circuit voltage (Voc), short-circuit current (Jsc), fill factor (F.F.) and photoelectric conversion efficiency were improved, the yield was also improved, and the thermal degradation ratio was desirably diminished.

Separately, the chemical composition of the p-type semiconductor of each of the photovoltaic element samples was examined by means of AES (Auger electron spectroscopy).

Based on the results obtained, there was found a tendency in that as the dimension of the silicon low density region is enlarged, the oxygen concentration in the layer is increased. Based on this, it is considered that the oxygen content in the silicon low density regions is higher than that in the remaining layer regions (excluding the silicon low density regions). And the oxygen content in the silicon low density regions is estimated to be about 4 times that in the remaining layer regions (excluding the silicon low density regions).

EXAMPLE 10

The procedures of preparing the photovoltaic element sample Ex. 7-1 in Example 7 were repeated, except that each of the second n-type μc-Si layer, the i-type μc-Si layer, and the p-type μc-Si layer was formed of a microcrystalline silicon carbide ($\mu$c-SiC) semiconductor material, to obtain three kinds of photovoltaic element samples (Ex. 10-1, Ex. 10-2, and Coup. Ex. 9-1; see, Table 17).

The second n-type $\mu$c-SiC layer in each case was formed under the p-type layer-forming conditions shown in Table 17 except for changing $BF_3/H_2$ gas shown in said table to $PH_3/H_2$ gas. Herein, observation by means of TEM (transmission electron microscope) was conducted for a cross section of the second n-type $\mu$c-SiC layer formed in the same manner as in Example 7. As a result, the second n-type $\mu$c-SiC layer was found to contain a plurality of silicon raw density regions whose "d" being 12 nm and "L" being 15 nm such that they are intermittently distributed therein.

The formation of the i-type $\mu$c-SiC layer in each case was conducted under the i-type layer-forming conditions shown in the column Ex. 8-3 of Table 15 except for additionally using $CH_4$ gas at a flow rate of 5 sccm, to form an i-type $\mu$c-SiC film having a thickness of 500 nm as the i-type $\mu$c-SiC layer in each case.

The observed results by way of Raman spectrum for the i-type $\mu$c-SiC film in each case revealed that the i-type $\mu$c-SiC film is 80% in the volume ratio of the constituent microcrystalline material. The observed result by way of X-ray diffraction for the i-type $\mu$c-SiC film in each case revealed that the i-type $\mu$c-SiC film is 9 nm in the average microcrystal grain size. The observed results by way of TEM for the i-type $\mu$c-SiC film in each case revealed that the i-type $\mu$c-SiC film is 5 in the ratio of H/W.

The formation of the p-type $\mu$c-SiC layer in each case was conducted under different condition of using $CH_4/H_2$ gas in addition to those raw material gases used for the formation of the p-type layer in Example 7 and changing the film-forming conditions as shown in Table 17, where a $\mu$c-SiC film having a thickness of 15 nm as the p-type $\mu$c-SiC layer was formed in each case. The substrate temperature upon the formation of the p-type $\mu$c-SiC layer in each case was controlled to 200° C. And in each case, as the SiH4 gas, CH4 gas, and BF3 gas, there were used SiH4 gas diluted with H2 gas to a concentration of 10% CH4 gas diluted with H2 gas to a concentration of 10% and BF3 gas diluted with H2 gas to a concentration of 2%. The flow rates of these raw material gases shown in Table 7 are calculated values based on their concentrations.

The p-type $\mu$c-SiC layer 106 thus formed in each case was found to contain a plurality of silicon low density regions which are different in each case in terms of the dimension as shown in Table 17.

Each of the samples was subjected to irradiation of pseudo sunlight (AM 1.5) with an intensity of 100 mW/cm² under environmental condition of 25° C. to measure its V-I characteristics, whereby its open-circuit voltage (Voc), short-circuit current (Jsc), fill factor (F.F.), and photoelectric conversion efficiency ($\eta$) were obtained.

The measured results are collectively shown in Table 17. The values shown in Table 17 are values relative to those of the sample Comp. Ex. 9-1, which are respectively set at 1.

In addition, for each of the samples, its yield was examined in the same manner as in Example 7. The results obtained are collectively shown in Table 17.

Further, for each of the samples, its thermal degradation ratio was examined in the same manner as in Example 7. The results obtained are collectively shown in Table 17.

As the results shown in Table 17 illustrate, it is understood that any of the photovoltaic element samples (Ex. 10-1 and Ex. 10-2) belonging to the present invention is superior to the comparative photovoltaic element sample Comp. Ex. 9-1 in terms of the open-circuit voltage (Voc), short-circuit current (Jsc), fill factor (F.F.) and photoelectric conversion efficiency and also in terms of the yield and thermal degradation ratio. The reasons for this, it is considered as follows. As a result of having increased the hydrogen dilution rate, increased the RF power applied, and increased the self-bias voltage as shown in Table 17, such silicon low density regions having a relatively large dimension as shown in Table 17 were provided in the p-type $\mu$c-SiC semiconductor layer 106 in each of the two photovoltaic element samples Ex. 10-1 and Ex. 10-2 in such a state that they are intermittently distributed therein, whereby the open-circuit voltage (Voc), short-circuit current (Jsc), fill factor (F.F.) and photoelectric conversion efficiency were improved, the yield was also improved, and the thermal degradation ratio was desirably diminished.

EXAMPLE 11

In this example, there was prepared a triple cell type photovoltaic element of the configuration shown in FIG. 4 and having a stacked triple cell semiconductor structure (comprising a-Si/$\mu$c-Si/a-SiGe), wherein the constituents other than the triple cell semiconductor structure were formed in the same manner as in Example 1.

Particularly, the stacked triple cell semiconductor structure comprises a pin junction top cell 215, a pin junction middle cell 216, and a pin junction bottom cell 217 being stacked in the named order from the light incident side, wherein the pin junction bottom cell 217 comprises:

an n-type amorphous silicon (a-Si) semiconductor layer 204 (having a thickness 20 nm) (this layer will be hereinafter referred to as "n-type layer 204"), a three-layered i-type semiconductor layer comprising an i-type amorphous silicon (a-Si) layer 251 (having a thickness of 10 nm) formed by RF plasma CVD (this layer will be hereinafter referred to as "RF i-type layer 251"), an i-type amorphous silicon-germanium (a-SiGe) layer 205 (having a thickness of 100 nm) formed by microwave plasma CVD (this layer will be hereinafter referred to as "MW i-type layer 205"), and an i-type amorphous silicon (a-Si) layer 261 (having a thickness of 25 nm) formed by RF plasma CVD (this layer will be hereinafter referred to as "RF i-type layer 261"), and a p-type microcrystalline silicon ($\mu$c-Si) semiconductor layer 206 (having a thickness of 10 nm) (this layer will be hereinafter referred to as "p-type layer 206");

the pin junction middle cell 216 comprises:

a two-layered n-type semiconductor layer comprising an n-type amorphous silicon (a-Si) semiconductor layer 207 (having a thickness of 10 nm) (this layer will be hereinafter referred to as "n-type layer 207") and an n-type microcrystalline silicon ($\mu$c-Si) semiconductor layer 252 (having a thickness of 10 nm) (this layer will be hereinafter referred to as "n-type layer 252", an i-type microcrystalline silicon ($\mu$c-Si) semiconductor layer 208 (having a thickness of 1.2 $\mu$m) formed by microwave plasma CVD (this layer will be hereinafter referred to as "MW i-type layer 208"), and a p-type microcrystalline silicon ($\mu$c-Si) semiconductor layer 209 (having a thickness of 10 nm) (this layer will be hereinafter referred to as "p-type layer 209"); and the pin junction top cell 215 comprises:

an n-type amorphous silicon (a-Si) semiconductor layer 210 (having a thickness of 10 nm) (this layer will be hereinafter referred to as "n-type layer 210"), an i-type amorphous silicon (a-Si) semiconductor layer 211 (having a thickness of 90 nm) formed by RF plasma CVD (this layer will be hereinafter referred to as "RF i-type layer 211"), and a p-type microcrystalline silicon ($\mu$c-Si) semiconductor layer 212 (having a thickness of 8 nm) (this layer will be hereinafter referred to as "p-type layer 212"). [see, Table 18]

The triple cell type photovoltaic element having this stacked triple cell semiconductor structure was prepared in the following manner using the roll-to-roll type multi-chambered film-forming apparatus shown in FIGS. 9(*a*) and 9(*b*).

There was provided a long substrate web made of stainless steel (SUS430BA) of 100 m in length, 30 cm in width and 0.15 mm in thickness as the substrate 201. The substrate web was wound on a rotary pay-out bobbin (not shown) in a vacuum RF plasma etching vessel (not shown) containing also a rotary take-up bobbin (not shown) which is arranged to oppose the pay-out bobbin, and a part of the substrate web on the pay-out bobbin was released to fix to the take-up bobbin while extending the substrate web in the RF plasma etching vessel. And while moving the substrate web from the pay-out bobbin toward the take-up bobbin by rotating the take-up bobbin, the surface of the substrate web was subjected to RF plasma etching surface treatment with Ar plasma under the conditions shown in Table 18. Then, on the plasma-etched surface of the substrate web, there were sequentially formed a 100 nm thick back face electrode 202 comprising AlSi (the content of the Si: 10%) and a 1.0 $\mu$m thick ZnO transparent and electrically conductive layer 203 by means of a roll-to-roll DC magnetron sputtering method and under the conditions shown in Table 18.

The substrate web thus treated was introduced in the film-forming apparatus shown in FIGS. 9(*a*) and 9(B), where the foregoing stacked triple cell semiconductor structure on the transparent and electrically conductive layer 203 formed on the substrate web under the conditions shown in Tables 18 and 19.

The substrate web was wound on the pay-out reel 625 (having an average radius of curvature of 30 cm). The pay-out reel 625 having the substrate web wound thereon was set in the pay-out chamber 601, the substrate web was delivered to pass through the respective deposition cambers and its tip was fixed to the take-up reel 627 in the take-up chamber 615. The entire inside of the film-forming apparatus was vacuum-exhausted by means of the vacuuming pump, and the halogen lump heaters 618 were actuated so that the substrate web could be maintained a desired temperature in each of the deposition chambers 602–614.

When the entire inside of the film-forming apparatus became less than 1 mTorr, scavenging gas was flown into the film-forming apparatus through the respective scavenging gas inlet ports 624, where while moving the substrate web in a direction indicated by an arrow mark toward the take-up chamber 615, the substrate web was successively taken up by and wound on the take-up reel 627. In this case, desired raw material gas was introduced into each deposition chamber, where the raw material gas was prevented from diffusing into adjacent deposition chambers by properly adjusting the flow rate of the scavenging gas introduced into the respective isolation passages or the inner pressures of the respective deposition chambers. Then, by introducing a predetermined RF power into each of the deposition chambers 602, 603, 605–608, and 610–614, and a predetermined microwave power and a predetermined RF bias power into each of the 604 and 609, glow discharge was generated to produce plasma in each of these deposition chambers.

By this, on the transparent and electrically conductive layer 203 of the substrate web, under the conditions shown in Tables 19 and 20, the three pin junction cells were continuously formed.

Particularly, the pin junction bottom cell 217 was formed in a first zone comprising the deposition chambers 602–606, where the n-type layer 204 was formed in the deposition chamber 602; the RF i-type layer 251 was formed in the deposition chamber 603; the M i-type layer 205 was formed in the deposition chamber 604; the RF i-type layer 261 was formed in the deposition chamber 605; and the p-type layer 206 was formed in the deposition chamber 606 under the bottom cell-forming conditions shown in Table 19 and the p-type layer-forming conditions shown in Table 20.

The pin junction middle cell 216 was formed in a second zone comprising the deposition chambers 607–611 where the n-type layer 207 was formed in the deposition chamber 607; the n-type layer 252 was formed in the deposition chamber 608; the MW i-type layer 208 was formed in the deposition chamber 609, followed by subjecting to surface treatment with $H_2$-plasma in the deposition chamber 610; and the p-type layer 209 was formed in the deposition chamber 611 under the middle cell-forming conditions shown in Table 19 and the p-type layer forming conditions shown in Table 20.

The pin junction top cell 215 was formed in a third zone comprising the deposition chambers 612–614 where the n-type layer 210 was formed in the deposition chamber 612; the RF i-type layer 211 was formed in the deposition chamber 613; and the p-type layer 212 was formed in the deposition chamber 614 under the top cell-forming conditions shown in Table 19 and the p-type layer forming conditions shown in Table 20.

For the $GeH_4$ gas, it was introduced into the corresponding deposition chamber through a plurality of gas inlet ports 629 as shown in FIG. 9(*b*).

The cathode electrode in the formation of the p-type layer was made to have a large surface area so as to have a positive self-bias voltage.

After the entire of the substrate web product was wounded on the take-up reel 627, the introduction of the RF power, microwave power, and RF bias power were terminated. At the same time, the introduction of the raw material gases and scavenging gas were terminated. And the entire inside of the film-forming apparatus was returned to atmospheric pressure, and the take-up reel 627 was taken out from the film-forming apparatus.

By this, there was formed a triple cell (pin-pin-pin) semiconductor structure on the substrate web.

On the surface of the p-type layer 212 of the top cell of the triple cell semiconductor structure formed on the substrate web, there was formed a 70 nm thick ITO film as the transparent electrode layer 213 using a conventional reactive sputtering apparatus. Then, on the surface of the transparent electrode layer 213, there was formed a comb-shaped electrode as the collecting electrode 214 by screen-printing an Ag paste at a thickness of 10 $\mu$m.

By this, there was obtained a belt-like photovoltaic element (or a belt-like solar cell). The belt-like photovoltaic element was cut to obtain a plurality of photovoltaic elements (or solar cells) of 250 mm×100 mm in size as Sample Ex. 11-1.

The procedures for the preparation of Sample Ex. 11-1 were repeated, except that the p-type layer-forming conditions were changed as shown in the column Comp. Ex. 10-1 or Comp. Ex. 10-2 of Table 20, to obtain Sample Comp. Ex. 10-1 and Sample Comp. Ex. 10-2 each comprising a plurality of photovoltaic elements (or solar cells) of 250 mm×100 mm in size as well as in the case of Sample Ex. 11-1.

Each of the samples was maintained in an atmosphere of 50° C., followed by subjecting to irradiation of pseudo sunlight (AM 1.5) with an intensity of 100 mW/cm$^2$ for 1,000 hours. After this, its V-I characteristics were measured under environmental condition of 25° C., whereby its open-circuit voltage (Voc), short-circuit current (Jsc), fill factor (F.F.), and photoelectric conversion efficiency ($\eta$) after having suffered from light-induced gradation were obtained. Herein the light-induced degradation ratio was also evaluated.

The evaluated results obtained in terms of average value are collectively shown in Table 20. The values shown in Table 20 are values relative to those of the sample Comp. Ex. 10-1, which are respectively set at 1.

In addition, for each sample, evaluation was conducted with respect to production yield in the same manner described in Example 1. The results obtained are collectively shown in Table 20.

Based on the results shown in Table 20, the following facts are understood. As apparent from the comparison of Sample Comp. Ex. 10-1 with Sample Comp. Ex. 10-2, by using the i-type semiconductor layer composed of a microcrystalline silicon semiconductor material, the light-induced degradation ratio of the entire of the triple cell is diminished. And apparent from the comparison of Sample Ex. 11-1 with Sample Comp.Ex. 10-2, by increasing the hydrogen dilution rate, the RF power applied, and the bias voltage as shown in Table 20 in the formation of the p-type layer, such silicon low density regions having a relatively large dimension as shown in Table 20 are provided in each of the three p-type layers in such a state that they are intermittently distributed therein. The semiconductor junctions with these p-type layers in the triple cell significantly improves the open-circuit voltage (Voc), short-circuit current (Jsc), and fill factor (F.F.) after the light-induced degradation, resulting in a significant improvement in the photoelectric conversion efficiency after the light-induced degradation. This situation also improves the yield.

TABLE 1

| Sample No. | Ex. 1-1 | Ex. 1-2 | Ex. 1-3 | Ex. 1-4 | Ex. 1-5 |
|---|---|---|---|---|---|
| SiH$_4$ (sccm*) | 0.5 | 0.5 | 0.4 | 0.2 | 0.2 |
| H2 (sccm) | 50 | 70 | 100 | 100 | 120 |
| dilution rate (H$_2$/(SiH$_4$ + PH$_3$)) | 95 | 133 | 238 | 476 | 571 |
| RF power (mW/cm$^3$) | 40 | 50 | 60 | 80 | 100 |
| self-bias voltage of the RF electrode (v) | 105 | 130 | 155 | 180 | 200 |
| "d" in the n-type semiconductor layer (nm) | 3 | 5 | 12 | 20 | 40 |
| "L" in the n-type semiconductor layer (nm) | 3 | 5 | 20 | 40 | 80 |
| yield (%) | 85 | 90 | 92 | 90 | 88 |

*: calculated flow rate of SiH$_4$ gas diluted with H2 gas

TABLE 2

| Sample No. | Comp. Ex. 1-1 | Comp. Ex. 1-2 | Comp. Ex. 1-3 |
|---|---|---|---|
| SiH$_4$ (sccm*) | 1 | 0.8 | 0.2 |
| H$_2$ (sccm) | 50 | 50 | 150 |
| dilution rate (H$_2$/(SiH$_4$ + PH$_3$)) | 48 | 60 | 714 |
| RF power (mW/cm$^3$) | 5 | 20 | 150 |
| self-bias voltage of the RF electrode (V) | 13 | 55 | 230 |
| "d" in the n-type semiconductor layer (nm) | 0 | 1 | 50 |
| "L" in the n-type semiconductor layer (nm) | 0 | 1 | 100 |
| yield (%) | 80 | 78 | 86 |

*: calculated flow rate of SiH$_4$ gas diluted with H$_2$ gas

TABLE 3

| Sample No. | Ex. 1-3 | Ex. 2-1 | Ex. 2-2 |
|---|---|---|---|
| SiH$_4$ (sccm*) | 0.2 | 0.03 | 0.02 |
| H$_2$ (sccm) | 35 | 40 | 40 |
| dilution rate (H$_2$/(SiH$_4$ + BF$_3$)) | 167 | 800 | 1000 |
| BF$_3$ (sccm) | 0.01 | 0.02 | 0.02 |
| gas pressure (Torr) | 2.0 | 2.0 | 1.5 |
| RF power (mW/cm$^3$) | 65 | 150 | 190 |
| self-bias voltage of the RF electrode (V) | 72 | 140 | 195 |
| "d" in the p-type semiconductor layer (nm) | 2 | 6 | 10 |
| "L" in the p-type semiconductor layer (nm) | 2 | 8 | 15 |
| photoelectric conversion efficiency | 1.25 | 1.28 | 1.33 |
| open-circuit voltage (Voc) | 1.07 | 1.08 | 1.10 |
| short-circuit current (Jsc) | 1.09 | 1.10 | 1.11 |
| fill factor (F. F.) | 1.07 | 1.08 | 1.09 |
| yield (%) | 92 | 93 | 94 |

*: calculated flow rate of SiH$_4$ gas diluted with H$_2$ gas

TABLE 4

| Sample No. | Ex. 3-1 | Ex. 3-2 |
|---|---|---|
| SiH$_4$ (sccm*$^1$) | 0.4 | 0.4 |
| CH$_4$ (sccm*$^2$) | 0.4 | 0.4 |
| BF$_3$ (sccm*$^3$) | 0.05 | 0.05 |
| H$_2$ (sccm) | 100 | 100 |
| dilution rate (H$_2$/(SiH$_4$ + CH$_4$ + BF$_3$)) | 118 | 118 |
| gas pressure (Torr) | 1.0 | 1.0 |
| RF power (mW/cm$^3$) | 52 | 95 |
| self-bias voltage of the RF electrode (V) | 125 | 185 |
| d (nm) | 5 | 10 |
| L (nm) | 5 | 15 |
| photoelectric conversion efficiency | 1.17 | 1.22 |
| open-circuit voltage (Voc) | 1.06 | 1.08 |
| short-circuit current (Jsc) | 1.04 | 1.05 |
| fill factor (F. F.) | 1.07 | 1.08 |
| yield (%) | 85 | 89 |

*$^1$: calculated flow rate of SiH$_4$ gas diluted with H$_2$ gas
*$^2$: calculated flow rate of CH$_4$ gas diluted with H$_2$ gas
*$^3$: calculated flow rate of BF$_3$ gas diluted with H$_2$ gas

TABLE 5

| Sample No. | Comp. Ex. 2-1 |
|---|---|
| SiH$_4$ (sccm*$^1$) | 1 |
| CH$_4$ (sccm*$^2$) | 1 |
| BF$_3$ (sccm*$^3$) | 0.05 |
| H$_2$ (sccm) | 50 |
| dilution rate (H$_2$/(SiH$_4$ + CH$_4$ + BF$_3$)) | 24 |
| gas pressure (Torr) | 1.2 |
| RF power (mW/cm$^3$) | 6 |
| self-bias voltage of the RF electrode (V) | 10 |

TABLE 5-continued

| Sample No. | Comp. Ex. 2-1 |
|---|---|
| d (nm) | 0 |
| L (nm) | 0 |
| photoelectric conversion efficiency | 1 |
| open-circuit voltage (Voc) | 1 |
| short-circuit current (Jsc) | 1 |
| fill factor (F. F.) | 1 |
| yield (%) | 77 |

*1: calculated flow rate of $SiH_4$ gas diluted with $H_2$ gas
*2: calculated flow rate of $CH_4$ gas diluted with $H_2$ gas
*3: calculated flow rate of $BF_3$ gas diluted with $H_2$ gas

TABLE 6

| Sample No. | Ex. 4-1 | Ex. 4-2 |
|---|---|---|
| $SiH_4$ (sccm*1) | 0.4 | 0.4 |
| $NH_3$ (sccm*2) | 0.1 | 0.1 |
| $BF_3$ (sccm*3) | 0.05 | 0.05 |
| $H_2$ (sccm) | 120 | 120 |
| dilution rate ($H_2/(SiH_4 + NH_3 + BF_3)$) | 218 | 218 |
| gas pressure (Torr) | 1.0 | 1.0 |
| RF power (mW/cm³) | 58 | 105 |
| self-bias voltage of the RF electrode (V) | 145 | 195 |
| d (nm) | 5 | 9 |
| L (nm) | 5 | 12 |
| photoelectric conversion efficiency | 1.15 | 1.21 |
| open-circuit voltage (Voc) | 1.06 | 1.09 |
| short-circuit current (Jsc) | 1.03 | 1.04 |
| fill factor (F. F.) | 1.05 | 1.07 |
| yield (%) | 82 | 87 |

*1: calculated flow rate of $SiH_4$ gas diluted with $H_2$ gas
*2: calculated flow rate of $NH_3$ gas diluted with $H_2$ gas
*3: calculated flow rate of $BF_3$ gas diluted with $H_2$ gas

TABLE 7

| Sample No. | Comp. Ex. 3-1 |
|---|---|
| $SiH_4$ (sccm*1) | 1 |
| $NH_3$ (sccm*2) | 0.2 |
| $BF_3$ (sccm*3) | 0.05 |
| $H_2$ (sccm) | 60 |
| dilution rate ($H_2/(SiH_4 + NH_3 + BF_3)$) | 48 |
| gas pressure (Torr) | 1.2 |
| RF power (mW/cm³) | 8 |
| self-bias voltage of the RF electrode (V) | 15 |
| d (nm) | 0 |
| L (nm) | 0 |
| photoelectric conversion efficiency | 1 |
| open-circuit voltage (Voc) | 1 |
| short-circuit current (Jsc) | 1 |
| fill factor (F. F.) | 1 |
| yield (%) | 75 |

*1: calculated flow rate of $SiH_4$ gas diluted with $H_2$ gas
*2: calculated flow rate of $NF_3$ gas diluted with $H_2$ gas
*3: calculated flow rate of $BF_3$ gas diluted with $H_2$ gas

TABLE 8

| Sample No. | Ex. 5-1 | Ex. 5-2 |
|---|---|---|
| $SiH_4$ (sccmm*1) | 20 | 15 |
| $H_2O$ (sccm*2) | 3 | 2 |
| $BF_3$ (sccm*3) | 0.2 | 0.15 |
| $H_2$ (sccm) | 500 | 600 |
| dilution rate ($H_2/(SiH_4 + H_2O + BF_3)$) | 22 | 35 |
| gas pressure (mTorr) | 20 | 20 |
| microwave power (mW/cm³) | 93 | 93 |
| RF power (mW/cm³) | 140 | 140 |
| DC bias voltage (V) | 120 | 200 |
| d (nm) | 7 | 12 |
| L (nm) | 7 | 20 |
| photoelectric conversion efficiency | 1.16 | 1.24 |
| open-circuit voltage (Voc) | 1.08 | 1.11 |
| short-circuit current (Jsc) | 1.03 | 1.04 |
| fill factor (F. F.) | 1.04 | 1.07 |
| yield (%) | 87 | 90 |

*1: calculated flow rate of $SiH_4$ gas diluted with $H_2$ gas
*2: calculated flow rate of $H_2O$ gas diluted with $H_2$ gas
*3: calculated flow rate of $BF_3$ gas diluted with $H_2$ gas

TABLE 9

| Sample No. | Comp. Ex. 4-1 |
|---|---|
| $SiH_4$ (sccm*1) | 30 |
| $H_2O$ (sccm*2) | 5 |
| $BF_3$ (sccm*3) | 0.3 |
| $H_2$ (sccm) | 500 |
| dilution rate ($H_2/(SiH_4 + H_2O + BF_3)$) | 14 |
| gas pressure (mTorr) | 30 |
| microwave power (mW/cm³) | 190 |
| RF power (mW/cm³) | 23 |
| DC bias voltage (V) | 40 |
| d (nm) | 2 |
| L (nm) | 2 |
| photoelectric conversion efficiency | 1 |
| open-circuit voltage (Voc) | 1 |
| short-circuit current (Jsc) | 1 |
| fill factor (F. F.) | 1 |
| yield (%) | 82 |

*1: calculated flow rate of $SiH_4$ gas diluted with $H_2$ gas
*2: calculated flow rate of $H_2O$ gas diluted with $H_2$ gas
*3: calculated flow rate of $BF_3$ gas diluted with $H_2$ gas

TABLE 10

| | | |
|---|---|---|
| substrate | 201 | stainless SUS430-BA sheet (thickness): 0.15 mm |
| surface treatment | | RF sputtering; RF power (300W) for 10 minutes; substrate temperature: room temperature |
| back face electrode layer | 202 | AlSi (thickness): 100 nm; substrate temperature: room temperature |
| transparent and electrically conductive layer | 203 | ZnO (thickness): 1.0 μm; substrate temperature: 250° C. |
| n-type semiconductor layer | 204 | a-Si (thickness); 20 nm |
| RF i-type semiconductor layer | 251 | a-Si (thickness): 10 nm |
| MW i-type semiconductor layer | 205 | a-SiGe (thickness): 80 nm |
| RF i-type semiconductor layer | 261 | a-Si (thickness): 25 nm |
| p-type semiconductor layer | 206 | μc-Si (thickness): 10 nm |
| n-type semiconductor layer | 207 | a-Si (thickness): 10 nm |
| RF i-type semiconductor layer | 252 | a-Si (thickness): 10 nm |
| MW i-type semiconductor layer | 208 | a-SiGe (thickness): 60 nm |
| RF i-type semiconductor layer | 262 | a-Si (thickness): 25 nm |
| p-type semiconductor layer | 209 | μc-Si (thickness): 10 nm |
| n-type semiconductor layer | 210 | a-Si (thickness): 10 nm |
| RF i-type semiconductor layer | 211 | a-Si (thickness): 90 nm |
| p-type semiconductor layer | 212 | μc-Si (thickness): 8 nm |
| transparent electrode layer | 213 | ITO (thickness): 70 nm |
| collecting electrode | 214 | Ag-paste (thickness): 10 82 m |

TABLE 11

| | | n-type layer 204 | RF i-type layer 251 | MW i-type layer 205 | RF i-type layer 261 | p-type layer 206 |
|---|---|---|---|---|---|---|
| bottom cell | layer constitution | | | | | |
| | deposition chamber | 602 | 603 | 604 | 605 | 606 |
| | flow rate of gas used SiH$_4$ | 100 | 30 | 50 | 30 | * |
| | GeH$_4$ | | | 50 | | |
| | PH$_3$/H$_2$ (2%) | 150 | | | | |
| | BF$_3$/H$_2$ (2%) | | | | | * |
| | H$_2$ | 500 | 500 | 200 | 2000 | * |
| | RF power (W) | 100 | 100 | 650 | 200 | * |
| | MW power (W) | | | 200 | | |
| | gas pressure (Torr) | 1.00 | 1.10 | 0.01 | 1.10 | * |
| | substrate temperature (° C.) | 300 | 280 | 350 | 280 | 220 |
| | layer thickness (nm) | 20 | 10 | 80 | 25 | 10 |
| middle cell | layer constitution | n-type layer 207 | RF i-type layer 252 | MW i-type layer 208 | RF i-type layer 262 | p-type layer 209 |
| | deposition chamber | 607 | 608 | 609 | 610 | 611 |
| | flow rate of gas used SiH$_4$ | 40 | 30 | 70 | 40 | * |
| | GeH$_4$ | | | 40 | | |
| | PH$_3$/H$_2$ (2%) | 150 | | | | |
| | BF$_3$/H$_2$ (2%) | | | | | * |
| | H$_2$ | 1500 | 500 | 200 | 2000 | * |
| | RF power (W) | 50 | 100 | 600 | 200 | * |
| | MW power (W) | | | 200 | | |
| | gas pressure (Torr) | 1.00 | 1.10 | 0.01 | 1.10 | * |
| | substrate temperature (° C.) | 300 | 250 | 350 | 280 | 200 |
| | layer thickness (nm) | 10 | 10 | 60 | 25 | 10 |
| top cell | layer constitution | n-type layer 210 | | RF i-type layer 211 | | p-type layer 212 |
| | deposition chamber | 612 | | 613 | | 614 |
| | flow rate of gas used SiH$_4$ | 30 | | 150 | | * |
| | PH$_3$/H$_2$ (2%) | 80 | | | | |
| | BF$_3$/H$_2$ (2%) | | | | | * |
| | H$_2$ | 2000 | | 1000 | | * |
| | RF power (W) | 100 | | 300 | | * |
| | gas pressure (Torr) | 1.00 | | 1.10 | | * |
| | substrate temperature (° C.) | 250 | | 200 | | 180 |
| | layer thickness (nm) | 10 | | 90 | | 8 |

*: shown in Table 12 and also in Table 13

TABLE 12

| Sample No. | Ex. 6-1 |
|---|---|
| SiH$_4$ (sccm) | 10 |
| BF$_3$ (sccm) | 4 |
| H$_2$ (sccm) | 2000 |
| dilution rate (H$_2$/(SiH$_4$ + BF$_3$)) | 142 |
| gas pressure (Torr) | 1.0 |
| RF power (W) | 1200 |
| self-bias voltage of the RF electrode (V) | 150 |
| d (nm) | 8 |
| L (nm) | 12 |
| photoelectric conversion efficiency | 1.24 |
| open-circuit voltage (Voc) | 1.08 |
| short-circuit current (Jsc) | 1.05 |
| fill factor (F. F.) | 1.09 |
| yield (%) | 95 |
| light-introduced degradation ratio | 0.8 |

TABLE 13

| Sample No. | Comp. Ex. 5-1 |
|---|---|
| SiH$_4$ (sccm) | 10 |
| BF$_3$ (sccm) | 4 |
| H$_2$ (sccm) | 1000 |
| dilution rate (H$_2$/(SiH$_4$ + BF$_3$)) | 71 |
| gas pressure (Torr) | 1.0 |
| RF power (W) | 800 |
| self-bias voltage of the RF electrode (V) | 60 |
| d (nm) | 2 |
| L (nm) | 2 |
| photoelectric conversion efficiency | 1 |
| open-circuit voltage (Voc) | 1 |
| short-circuit current (Jsc) | 1 |
| fill factor (F. F.) | 1 |
| yield (%) | 90 |
| light-introduced degradation ratio | 1 |

TABLE 14

| Sample No. | Comp. Ex. 6-1 | Comp. Ex. 6-2 | Ex. 7-1 | Ex. 7-2 | Ex. 7-3 | Ex. 7-4 | Ex. 7-5 | Comp. Ex. 6-3 |
|---|---|---|---|---|---|---|---|---|
| $SiH_4$ (sccm*) | 1 | 0.8 | 0.5 | 0.5 | 0.4 | 0.2 | 0.2 | 0.2 |
| $H_2$ (sccm) | 50 | 50 | 50 | 70 | 100 | 100 | 120 | 150 |
| dilution rate ($H_2/(SiH_4 + PH_3)$) | 48 | 60 | 95 | 133 | 238 | 476 | 571 | 714 |
| RF power (mW/cm$^3$) | 5 | 20 | 40 | 50 | 60 | 80 | 100 | 150 |
| self-bias voltage of the RF electrode (V) | 13 | 55 | 105 | 130 | 155 | 180 | 200 | 230 |
| "d" in the n-type semiconductor layer (nm) | 0 | 1 | 3 | 5 | 12 | 20 | 40 | 50 |
| "L" in the n-type semiconductor layer (nm) | 0 | 1 | 3 | 5 | 20 | 40 | 80 | 100 |
| photoelectric conversion efficiency | 1 | 1.01 | 1.15 | 1.24 | 1.27 | 1.25 | 1.18 | 1.05 |
| yield (%) | 80 | 78 | 85 | 90 | 92 | 88 | 86 | 81 |
| thermal degradation ratio (%) | 10 | 10 | 5 | 3 | 3 | 4 | 5 | 7 |

*: calculated flow rate of $SiH_4$ gas diluted with $H_2$ gas

TABLE 15

| Sample No. | Comp. Ex. 7-1 | Comp. Ex. 7-2 | Ex. 8-1 | Ex. 8-2 | Ex. 8-3 |
|---|---|---|---|---|---|
| $SiH_4$ (sccm) | 40 | 40 | 35 | 30 | 25 |
| $H_2$ (sccm) | 300 | 700 | 1000 | 1000 | 1000 |
| gas pressure (mTorr) | 15 | 15 | 20 | 20 | 20 |
| RF power (mW/cm$^3$) | 40 | 50 | 60 | 65 | 65 |
| self-bias voltage of the RF electrode (V) | 0 | −300 | −400 | −420 | −420 |
| volume ratio of the microcrystalline material (%) | 0 | 40 | 50 | 70 | 85 |
| average grain size (nm) | (amorphous) | 2 | 3 | 8 | 12 |
| H/W | (amorphous) | 1 | 2 | 4 | 8 |
| photoelectric conversion efficiency after degradation | 1 | 1.01 | 1.10 | 1.24 | 1.36 |
| open-circuit voltage (Voc) | 1 | 0.67 | 0.62 | 0.58 | 0.56 |
| short-circuit current (Jsc) | 1 | 1.23 | 1.33 | 1.50 | 1.66 |
| fill factor (F.F.) | 1 | 1.22 | 1.33 | 1.42 | 1.47 |

TABLE 16

| Sample No. | Comp. Ex. 8-1 | Ex. 9-1 | Ex. 9-2 |
|---|---|---|---|
| $SiH_4$ (sccm) | 30 | 20 | 15 |
| $H_2O$ (sccm) | 5 | 3 | 2 |
| $BF_3$ (sccm) | 0.3 | 0.2 | 0.15 |
| $H_2$ (sccm) | 500 | 500 | 600 |
| dilution rate ($H_2/(SiH_4 + H_2O + BF_3)$) | 14 | 22 | 35 |
| gas pressure (mTorr) | 30 | 20 | 20 |
| microwave power (mW/cm$^3$) | 190 | 93 | 93 |
| RF power (mW/cm$^3$) | 23 | 140 | 140 |
| DC bias voltage (V) | 40 | 120 | 200 |
| d (nm) | 2 | 7 | 12 |
| L (nm) | 2 | 7 | 20 |
| photoelectric conversion efficiency | 1 | 1.14 | 1.20 |
| open-circuit voltage (Voc) | 1 | 1.05 | 1.08 |
| short-circuit current (Jsc) | 1 | 1.03 | 1.04 |
| fill factor (F. F.) | 1 | 1.05 | 1.07 |
| yield (%) | 79 | 86 | 90 |
| thermal degradation ratio (%) | 7 | 4 | 3 |

TABLE 17

| Sample No. | Comp. Ex. 9-1 | Ex. 10-1 | Ex. 10-2 |
|---|---|---|---|
| $SiH_4$ (sccm*$^1$) | 0.1 | 0.03 | 0.03 |
| $CH_4$ (sccm*$^2$) | 0.1 | 0.01 | 0.01 |
| $BF_3$ (sccm*$^3$) | 0.02 | 0.02 | 0.02 |
| $H_2$ (sccm) | 50 | 50 | 50 |
| dilution rate ($H_2/(SiH_4 + CH_4 + BF_3)$) | 227 | 833 | 833 |
| gas pressure (mTorr) | 2.0 | 2.0 | 2.0 |
| RF power (mW/cm$^3$) | 6 | 52 | 95 |
| self-bias voltage of the RF electrode (V) | 10 | 125 | 185 |
| d (nm) | 2 | 8 | 12 |
| L (nm) | 2 | 10 | 15 |
| photoelectric conversion efficiency | 1 | 1.15 | 1.19 |
| open-circuit voltage (Voc) | 1 | 1.05 | 1.07 |
| short-circuit current (Jsc) | 1 | 1.03 | 1.04 |
| fill factor (F. F.) | 1 | 1.06 | 1.07 |
| yield (%) | 78 | 83 | 86 |
| thermal degradation ratio (%) | 8 | 3 | 2 |

*$^1$: calculated flow rate of $SiH_4$ gas diluted with $H_2$ gas
*$^2$: calculated flow rate of $CH_4$ gas diluted with $H_2$ gas
*$^3$: calculated flow rate of $BF_3$ gas diluted with $H_2$ gas

TABLE 18

| substrate | 201 | stainless SUS430-BA sheet (thickness) : 0.15 mm |
|---|---|---|
| surface treatment | | RF sputtering; RF power (300W) for 10 minutes; substrate temperature: room temperature |
| back face electrode layer | 202 | AlSi (thickness): 100 nm; substrate temperature: room temperature |
| transparent and electrically conductive layer | 203 | ZnO (thickness): 1.0 μm; substrate temperature: 250° C. |
| n-type semiconductor layer | 204 | a-Si (thickness): 20 nm |
| RF i-type semiconductor layer | 251 | a-Si (thickness): 10 nm |

TABLE 18-continued

| | | | |
|---|---|---|---|
| MW i-type semiconductor layer | 205 | a-SiGe (thickness): 100 nm |
| RF i-type semiconductor layer | 261 | a-Si (thickness): 25 nm |
| p-type semiconductor layer | 206 | μc-Si (thickness): 10 nm |
| n-type semiconductor layer | 207 | a-Si (thickness): 10 nm |
| n-type semiconductor layer | 252 | μc-Si (thickness): 10 nm |
| MW i-type semiconductor layer | 208 | μc-Si (thickness): 1.2 μm |
| p-type semiconductor layer | 209 | μc-Si (thickness): 10 nm |
| n-type semiconductor layer | 210 | a-Si (thickness): 10 nm |
| RF i-type semiconductor layer | 211 | a-Si (thickness): 90 nm |
| p-type semiconductor layer | 212 | μc-Si (thickness): 8 nm |
| transparent electrode layer | 213 | ITO (thickness): 70 nm |
| collecting electrode | 214 | Ag-paste (thickness): 10 μm |

TABLE 20-continued

| Sample No. | Comp. Ex. 10-1 | Comp. Ex. 10-2 | Ex. 11-1 |
|---|---|---|---|
| MW i-type semiconductor layer | a-SiGe | μc-Si | μc-Si |
| photoelectric conversion efficiency after endurance | 1 | 1.01 | 1.17 |
| open-circuit voltage (Voc) | 1 | 0.96 | 1.04 |
| short-circuit current (Jsc) | 1 | 0.99 | 1.04 |
| fill factor (F. F.) | 1 | 1.06 | 1.08 |
| yield (%) | 90 | 88 | 95 |
| light-introduced degradation ratio | 1 | 0.4 | 0.3 |

TABLE 19

| | | | n-type layer 204 | RF i-type layer 251 | MW i-type layer 205 | RF i-type layer 261 | p-type layer 206 |
|---|---|---|---|---|---|---|---|
| bottom cell | layer constitution | | | | | | |
| | deposition chamber | | 602 | 603 | 604 | 605 | 606 |
| | flow rate of gas used | SiH$_4$ | 100 | 30 | 40 | 30 | * |
| | | GeH$_4$ | | | 40 | | |
| | | PH$_3$/H$_2$ (2%) | 150 | | | | |
| | | BF$_3$/H$_2$ (2%) | | | | | * |
| | | H$_2$ | 500 | 500 | 200 | 500 | * |
| | RF power (W) | | 100 | 100 | 650 | 250 | * |
| | MW power (W) | | | | 200 | | |
| | gas pressure (Torr) | | 1.00 | 1.10 | 0.015 | 1.10 | * |
| | substrate temperature (° C.) | | 300 | 280 | 350 | 280 | 220 |
| | layer thickness (nm) | | 20 | 10 | 100 | 25 | 10 |
| middle cell | layer constitution | | n-type layer 207 | RF i-type layer 252 | MW i-type layer 208 | treated with H$_2$ | p-type layer 209 |
| | deposition chamber | | 607 | 608 | 609 | 610 | 611 |
| | flow rate of gas used | SiH$_4$ | 40 | 5 | 100 | | * |
| | | GeH$_4$ | | | | | |
| | | PH$_3$/H$_2$ (2%) | 150 | 150 | | | |
| | | BF$_3$/H$_2$ (2%) | | | | | * |
| | | H$_2$ | 1000 | 1500 | 2500 | 2000 | * |
| | RF power (W) | | 50 | 600 | 700 | 200 | * |
| | MW power (W) | | | | 200 | | |
| | gas pressure (Torr) | | 1.00 | 1.10 | 0.02 | 1.10 | * |
| | substrate temperature (° C.) | | 300 | 250 | 350 | 200 | 200 |
| | layer thickness (nm) | | 10 | 10 | 1200 | 25 | 10 |
| top cell | layer constitution | | n-type layer 210 | | RF i-type layer 211 | | p-type layer 212 |
| | deposition chamber | | 612 | | 613 | | 614 |
| | flow rate of gas used | SiH$_4$ | 30 | | 150 | | * |
| | | PH$_3$/H$_2$ (2%) | 80 | | | | |
| | | BF$_3$/H$_2$ (2%) | | | | | * |
| | | H$_2$ | 2000 | | 1000 | | * |
| | RF power (W) | | 100 | | 300 | | * |
| | gas pressure (Torr) | | 1.00 | | 1.10 | | * |
| | substrate temperature (° C.) | | 250 | | 200 | | 180 |
| | layer thickness (nm) | | 10 | | 100 | | 8 |

*: shown in Table 20

TABLE 20

| Sample No. | Comp. Ex. 10-1 | Comp. Ex. 10-2 | Ex. 11-1 |
|---|---|---|---|
| SiH$_4$ (sccm) | 10 | 10 | 10 |
| BF$_3$ (sccm) | 4 | 4 | 4 |
| H$_2$ (sccm) | 1000 | 1000 | 2000 |
| dilution rate (H$_2$/(SiH$_4$ + BF$_3$)) | 71 | 71 | 142 |
| gas pressure (Torr) | 1.0 | 1.0 | 1.0 |
| RF power (mW/cm$^3$) | 800 | 800 | 1200 |
| self-bias voltage of the RF electrode (V) | 60 | 60 | 150 |
| d (nm) | 2 | 2 | 8 |
| L (nm) | 2 | 2 | 12 |

What is claimed is:

1. A photovoltaic element having a semiconductor junction structure, characterized in that said semiconductor junction structure has a doped layer composed of a non-single crystalline material containing one or more elements belonging to group IV of the periodic table as a principal constituent thereof, and said doped layer contains a plurality of regions each comprising a diminished deity region of said group IV element as the principal constituent of the doped layer such that said group IV element diminished density regions are intermittently distributed in the doped layer.

2. A photovoltaic element according to claim 1, wherein the doped layer is of p-type or n-type.

3. A photovoltaic element according to claim 1, wherein an average of the group IV element diminished density regions is of a dimension which satisfies the following equations (a) and (b):

$$3\ nm \leq d \leq 40\ nm \quad (a)$$

$$3\ nm \leq L \leq 80\ nm \quad (b)$$

with d being an average height of the group IV element diminished density regions in the layer thickness direction, and L being an average diameter of the IV element diminished density regions in the direction parallel to the surface of a substrate over which the doped layer is formed.

4. A photovoltaic element according to claim 1, wherein the doped layer contains an optical band gap-enlarging element, and each of the group IV element diminished density regions contains the optical band gap-enlarging element at a concentration which is greater than that of the optical band gap-enlarging element contained in the remaining layer region of the doped layer.

5. A photovoltaic element according to claim 1, wherein the doped layer contains a valence electron-controlling agent, and each of the group IV element density regions contains the valence electron-controlling agent at a concentration which is greater than that of the valence electron-controlling agent contained in the remaining layer region of the doped layer.

6. A photovoltaic element according to claim 1, wherein at least a part of the doped layer containing the group IV element diminished density regions comprises a microcrystalline semiconductor material.

7. A photovoltaic element according to claim 1, wherein the group IV element diminished density regions comprise an amorphous material.

8. A photovoltaic element according to claim 1, wherein the semiconductor junction structure has a substantially intrinsic semiconductor layer in addition to the doped layer.

9. A photovoltaic element according to claim 8, wherein at least a part of the substantially intrinsic semiconductor layer comprises a microcrystalline semiconductor material.

10. A photovoltaic element according to claim 1, wherein the semiconductor junction structure is a pin semiconductor junction structure has a substantially intrinsic semiconductor layer in addition to the doped layer.

11. A photovoltaic element according to claim 10, wherein at least apart of the substantially intrinsic semiconductor layer comprises a microcrystalline semiconductor material.

12. A photovoltaic element according to claim 9, wherein the microcrystalline semiconductor material of the substantially intrinsic semiconductor layer has a volume ratio of 50% or more, an average microcrystal grain size of 3 nm or more, and an average grain dimension in the direction perpendicular to a face on which the substantially intrinsic semiconductor layer is formed which is two times or more an average grain ion in the direction parallel to said face.

13. A photovoltaic element according to claim 11, wherein the microcrystalline semiconductor material of the substantially intrinsic semiconductor layer has a volume ratio of 50% or more, an average microcrystal grain size of 3 nm or more, and an average grain dimension in the direction perpendicular to a face on which the substantially intrinsic semiconductor layer is formed which is two times or more an average grain dimension in the direction parallel to said face.

14. A photovoltaic element according to claim 1, wherein the semiconductor junction structure comprises a two-layered doped layer comprising at least (a) a doped layer composed of an amorphous semiconductor material containing one or more elements belonging to IV of the periodic table as a principal constituent and (b) a layer at least a part of which being composed of a microcrystalline semiconductor material containing one or more elements belonging to group IV of the periodic table as a principal constituent and having the same conduction type as that of said doped layer (a), and a substantially intrinsic semiconductor layer, wherein one of said doped layers (a) and (b) contains a plurality of diminished density regions of said IV element such that they are intermittently distributed therein.

15. A photovoltaic element according to claim 1, wherein the semiconductor junction structure comprises a plurality of pn or pin semiconductor junction structures being stacked.

* * * * *

UNITED STATES PATENT AND TRADEMARK OFFICE
CERTIFICATE OF CORRECTION

PATENT NO.    : 5,913,986
DATED         : June 22, 1999
INVENTOR(S)   : JINSHO MATSUYAMA It is certified that error appears in the above-identified patent and that said Letters Patent is hereby corrected as shown below:

COLUMN 1

Line 33, "provides" should read --provide--.

COLUMN 3

Line 22, "a" should read --an--;
Line 23, "a" should read --as a--; and
Line 37, "in" (first occurrence) should be deleted.

COLUMN 6

Line 55, "als." should read --al.--.

COLUMN 8

Line 40, "a" should read --at--.

COLUMN 11

Line 49, "improve." should read --improved.--.

COLUMN 17

Line 43, "serves" should read --serve--; and
Line 66, "serves" should read --serve--.

UNITED STATES PATENT AND TRADEMARK OFFICE
CERTIFICATE OF CORRECTION

PATENT NO. : 5,913,986
DATED : June 22, 1999
INVENTOR(S) : JINSHO MATSUYAMA

It is certified that error appears in the above-identified patent and that said Letters Patent is hereby corrected as shown below:

COLUMN 18

Line 15, "serves" should read --serve--;
　　　Line 30, "contains" should read --contain--; and
　　　Line 61, "to" should read --to be--.

COLUMN 19

Line 49, "contains" should read --contain--.

COLUMN 27

Line 5, "As" should read --as--.

COLUMN 31

Line 58, "Each" should read --Each of--; and
　　　Line 59, "are" should read --is--.

COLUMN 38

Line 39, "these" should be deleted.

UNITED STATES PATENT AND TRADEMARK OFFICE
CERTIFICATE OF CORRECTION

PATENT NO.  : 5,913,986
DATED       : June 22, 1999
INVENTOR(S) : JINSHO MATSUYAMA It is certified that error appears in the above-identified patent and that said Letters Patent is hereby corrected as shown below:

COLUMN 39

Line 1, "these" should be deleted.

COLUMN 40

Line 9, "these" should be deleted.

COLUMN 41

Line 40, "these" should be deleted.

COLUMN 43

Line 9, "these" should be deleted.

COLUMN 45

Line 45, "a" should read --at a--.

COLUMN 55

Line 4, "ration" should read --ratio--.

UNITED STATES PATENT AND TRADEMARK OFFICE
CERTIFICATE OF CORRECTION

PATENT NO. : 5,913,986
DATED : June 22, 1999
INVENTOR(S) : JINSHO MATSUYAMA It is certified that error appears in the above-identified patent and that said Letters Patent is hereby corrected as shown below:

COLUMN 58

Line 56, "252"," should read --252"),--.

COLUMN 59

Line 47, "lump" should read --lamp--.

COLUMN 64

Line 65, "10 82 m" should read --10 $\mu$m--.

COLUMN 70

Line 60, "deity" should read --density--.

COLUMN 71

Line 10, "the IV" should read --the group IV--.

UNITED STATES PATENT AND TRADEMARK OFFICE
CERTIFICATE OF CORRECTION

PATENT NO.    : 5,913,986
DATED         : June 22, 1999
INVENTOR(S)   : JINSHO MATSUYAMA It is certified that error appears in the above-identified patent and that said Letters Patent is hereby corrected as shown below:

<u>COLUMN 72</u>

```
Line 13, "ion" should read --dimension--;
Line 28, "IV" should read --group IV--;
Line 29, "layer" should read --doped layer--; and
Line 36, "IV" should read --group IV--.
```

Signed and Sealed this

Seventh Day of March, 2000

Attest:

Q. TODD DICKINSON

*Attesting Officer*    *Commissioner of Patents and Trademarks*